US008909503B2

(12) United States Patent  (10) Patent No.: US 8,909,503 B2
Umeda et al.  (45) Date of Patent: Dec. 9, 2014

(54) MATRIX GENERATION TECHNIQUE AND PLANT CONTROL TECHNIQUE

(75) Inventors: Yuhei Umeda, Kawasaki (JP); Tsugito Maruyama, Kawasaki (JP); Hirokazu Anai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 435 days.

(21) Appl. No.: 13/348,009

(22) Filed: Jan. 11, 2012

(65) Prior Publication Data

US 2012/0221301 A1   Aug. 30, 2012

(30) Foreign Application Priority Data

Feb. 28, 2011  (JP) .................................. 2011-043163
Oct. 18, 2011  (JP) .................................. 2011-229141

(51) Int. Cl.
*G06F 7/60*   (2006.01)
*G06F 17/10*  (2006.01)
*G05B 13/04*  (2006.01)

(52) U.S. Cl.
CPC ............ *G05B 13/042* (2013.01); *G05B 13/048* (2013.01)
USPC ................................................ 703/2; 700/52

(58) Field of Classification Search
CPC ......... G06F 17/10; G06F 17/16; G06F 17/12; G06F 17/13
USPC .................... 703/2; 700/51, 52; 702/147, 196
See application file for complete search history.

(56) References Cited

U.S. PATENT DOCUMENTS

| 7,194,317 | B2 | 3/2007 | Kothare et al. |
| 7,433,743 | B2 * | 10/2008 | Pistikopoulos et al. .......... 703/2 |
| 2005/0107895 | A1 * | 5/2005 | Pistikopoulos et al. ........ 700/52 |
| 2010/0017094 | A1 * | 1/2010 | Stewart et al. ................ 701/102 |

FOREIGN PATENT DOCUMENTS

JP   2004-086903 A   3/2004
WO   WO 99/57616    11/1999

OTHER PUBLICATIONS

Ma et al. "Nonlinear Receding Horizon Control of Quadruple-Tank System and Real-Time Implementation". ICIC International 2012. p. 7083-7093.*

Shimizu et al. "Nonlinear Receding Horizon Control of an Underactuated Hovercraft with a Multiple-shooting-Based Algorithm". 2006 IEEE. Oct. 2006. p. 603-607.*

Ohtsuka, Toshiyuki "A continuation/GMRES method for fast computation of nonlinear receding horizon control", Automatica, 40(4), Apr. 2004, pp. 563-574.

* cited by examiner

*Primary Examiner* — Eunhee Kim
(74) *Attorney, Agent, or Firm* — Fujitsu Patent Center

(57) ABSTRACT

In this disclosure, equations to be solved in the model predictive control are transformed by using an off-line algebraic simplification method into a matrix operational expression representing a product of a coefficient matrix and a vector regarding solution inputs within a control horizon is equal to a function vector regarding target values of output states and the output states. The size of the coefficient matrix is reduced compared with the conventional matrix. Then, the matrix operational expression is solved in an online plant control apparatus with present output states and present target values of the output stats of a plant to be controlled, by the direct method, to output the solution to the plant.

5 Claims, 23 Drawing Sheets

FIG.11

$$M\begin{pmatrix}u^*(0)\\u^*(1)\\u^*(2)\\\vdots\\u^*(H_c-2)\\u^*(H_c-1)\end{pmatrix}=\begin{pmatrix}p_0(x(k),Xref)\\p_1(x(k),Xref)\\p_2(x(k),Xref)\\\vdots\\p_{H_c-2}(x(k),Xref)\\p_{H_c-1}(x(k),Xref)\end{pmatrix}$$

MATRIX GENERATION TECHNIQUE AND PLANT CONTROL TECHNIQUE

CROSS-REFERENCE TO RELATED APPLICATIONS

This application is based upon and claims the benefit of priority of the prior Japanese Patent Application No. 2011-043163, filed on Feb. 28, 2011, and the Japanese Patent Application No. 2011-229141, filed on Oct. 18, 2011, and the entire contents of which are incorporated herein by reference.

FIELD

This technique relates to a control technique of a plant.

BACKGROUND

The model predictive control is a control method for determining inputs to a control target at each step by optimizing responses up to a definite future time. This method is noteworthy as a control technique that enables the follow-up control to a non-stationary target value, and has a merit that constraint conditions such as saturation can be treated.

Conventionally, the study was mainly made for the linear system, however, recently, the study is actively made for the application to the non-linear system. At present, there are a lot of application examples that the non-linear problem is simplified to the linear problem. However, it is not easy to actually apply this technique to a case that high-speed changes occur even in the linear system, and it is desired that the calculation period is shortened.

Methods for processing a problem for the model predictive control in real time, which also includes a control target having a non-linear plant model are largely classified to two categories. One is a method that the state feedback control rule is represented by a function of a state x(k) of the plant off-line, and only substitution calculation is carried out online. On the other hand, the other method is a method that all calculation is carried out online.

As for the calculation carried out off-line, a method is considered that spaces of the present states x(k) of the plant are classified by a certain method such as return to Hamilton-Jacobi-Bellman method, and feedback control rules are given to the respective space regions. However, according to such a method, too many space regions may be generated. Moreover, if the number of dimensions of the states increases, the number of divisions rapidly increases.

On the other hand, as for the method for carrying out the calculation online, various numerical analysis method of optimization problems, such as gradient method, interior point method or the like, can be applied. In addition, a method for efficiently solving the problem by gasping the dual problem with respect to Lagrange multiplier and an algorithm that a structure such as Hessian matrix is used to improve the efficiency are advocated. However, when the normal iterative calculation is used as a method of the numerical calculation, the calculation is iterated until the solution is settled. Therefore, the calculation amount becomes huge.

Then, a method is considered to reduce the iteration calculations by the continuous deformation analysis using the time as a parameter. Even in such a case, when the change of the states x(k) of the plant is large, the number of iterations becomes large. Therefore, any step may not be completed within a desired period.

In addition, as for the numerical analysis method, a lot of approximations are used for the expression in the optimization problem in order to efficiently obtain the solution. Therefore, a large gap with the value to be intrinsically obtained may occur.

Namely, there is no technique for calculating the inputs for the plant at high speed in the model predictive control.

SUMMARY

A matrix generation method relating to a first aspect of this technique includes: converting, by using a computer, state equations, which represent a relationship between solution output states and solution inputs of a plant to be controlled, and initial condition expressions of output states into first linear expressions representing the solution output states at each step by the output states and the solution inputs; converting, by using the computer, first conditional expressions representing a relationship between a first Lagrange multiplier and a partial differentiation of a Hamiltonian with respect to the output states, and relational expressions representing a relationship between a value of the first Lagrange multiplier after the predictive horizon and a function regarding differences between target values of the output states and the solution output states after the predictive horizon into second linear expressions representing the first Lagrange multiplier at each step by the target values and the solution output states, wherein the Hamiltonian relates to a sum of a first function regarding a weighting addition of a square of an error between the target values of the output states and the output states and a square of inputs, a product of the first Lagrange multiplier and the state equations, and a second function regarding a second Lagrange multiplier and constraint conditions; converting, by using the computer, the first linear expressions and the second linear expressions into third linear expressions representing the first Lagrange multiplier at each step by the target values, the solution inputs and the output states, by substituting the first linear expressions into the second linear expressions; converting, by using the computer, the third linear expressions and second conditional expressions that are partial differentiations of the Hamiltonian with respect to the inputs and represents a relationship among the first Lagrange multiplier, the second Lagrange multiplier and the solution inputs, into fourth linear expressions representing a relationship at each step among the target values, the solution inputs and the output states; and transforming, by using the computer, the fourth linear expressions into a matrix operational expression representing a product of a coefficient matrix and a vector regarding the solution inputs within the control horizon is equal to a function vector regarding the target values and the output states to obtain the coefficient matrix and the function vector.

A matrix generation method relating to a second aspect of this technique includes: converting, by using a computer, state equations, which represent a relationship between solution output states and solution inputs of a plant to be controlled, and initial condition expressions of output states into first linear expressions representing the solution output states at each step by the output states and the solution inputs; converting, by using the computer, conditional expressions representing a relationship between a first Lagrange multiplier and a partial differentiation of a Hamiltonian with respect to the output states, and relational expressions representing a relationship between a value of the first Lagrange multiplier after a predictive horizon and a function regarding differences between target values of the output states and the solution output states after the predictive horizon into second linear expressions representing the first Lagrange multiplier at each step by the target values and the solution output states, wherein the Hamiltonian relates to a sum of a first function regarding a weighting addition of a square of an error between the target values of the output states and the output states and a square of inputs, a product of the first Lagrange multiplier and the state equations, and a second function regarding a second Lagrange multiplier and constraint conditions; converting, by using the computer, the first linear expressions and the second linear expressions into third linear expressions representing the first Lagrange multiplier at each step by the target values, the solution inputs and the output states, by substituting the first linear expressions into the second linear expressions; converting, by using the computer, the first linear expressions, the third linear expressions, fourth linear expressions and fifth linear expressions into sixth linear expressions representing a relationship at each step among the target values, the solution inputs and the output states, by substituting the third linear expressions, the fourth linear expressions and the fifth linear expressions into the first linear expressions, wherein the fourth linear expressions are obtained by approximating, by the solution inputs, the second Lagrange multipliers associated with lower limit values of the inputs included in the constraint conditions, and the fifth linear expressions are obtained by approximating, by the solution inputs, the second Lagrange multipliers associated with upper limit values of the inputs included in the constraint conditions; and transforming, by using the computer, the sixth linear expressions into a matrix operational expression representing a product of a coefficient matrix and a vector regarding the solution inputs within a control horizon is equal to a function vector regarding the target values and the output states to obtain the coefficient matrix and the function vector.

A plant control method relating to a third aspect of this technique includes: obtaining, by using a processor, present output states and present target values of output states of a plant to be controlled; calculating, by using the processor, solution inputs within a control horizon by substituting the present output states and the present target values into the linear equations and solving linear equations after the substituting, wherein the linear equations are represented in a form that a product of a coefficient matrix and a vector regarding solution inputs within the control horizon is equal to a function vector regarding target values of the output states and the output states, and the linear equations are equivalent to expressions including (a) state equations, which represent a relationship between solution output states and solution inputs of the plant to be controlled, (b) initial condition expressions of the output states, (c) first conditional expressions representing a relationship between a first Lagrange multiplier and a partial differentiation of a Hamiltonian with respect to the output state, (d) relational expressions representing a relationship between a value of the first Lagrange multiplier after a predictive horizon and a function regarding differences between the target values of the output states and the solution output states after the predictive horizon, and (e) second conditional expressions that are partial differentiations of the Hamiltonian with respect to the inputs and represents a relationship among the first Lagrange multiplier, the second Lagrange multiplier and the solution inputs, wherein the Hamiltonian relates to a sum of a first function regarding a weighting addition of a square of an error between the target values of the output states and the output states and a square of inputs, a product of the first Lagrange multiplier and the state equations, and a second function regarding a second Lagrange multiplier and constraint conditions; and extracting, by using the processor, solution inputs for a first time from among the solution inputs within the control horizon.

A matrix generation method relating to a fourth aspect of this technique includes: converting, by using a computer, state equations, which represent a relationship between solution output states and solution inputs of a plant to be controlled, and initial condition expressions of output states into first linear expressions representing the solution output states at each step by the output states and the solution inputs; generating, by using the computer, second linear expressions by substituting the first linear expressions and coefficient values of the solution inputs in the first linear expressions into third linear expressions regarding the solution output states, wherein the third linear expressions are obtained by partially differentiating a first term and a second term in a performance index, with respect to each of the solution inputs from a solution input at an initial time to a solution input at a time after (a control horizon—one sampling time) elapsed, and the first term in the performance index is a term for adding a square of an error between a target value of the output state and the solution output state, from a time after one sampling time elapsed since an initial time to a time after (a predictive horizon—one sampling time) elapsed, while weighting by a first weight matrix, and the second term in the performance index is a term for adding a square of an error between the target value of the output state and the solution output state after the predictive horizon while weighting by a second weight matrix, and the performance index includes the first term, the second term, a third term for adding a square of the solution inputs from the initial time to a time after (the predictive horizon—one sampling time) elapsed while weighting by a third weight matrix, and a fourth term for constraint conditions; generating, by using the computer, a first matrix by extracting coefficient values of terms of the solution inputs in the second linear expressions; generating, by using the computer, a vector by extracting terms other than the terms of the solution inputs in the second linear expressions; and generating, by using the computer, a third matrix by adding the first matrix and a second matrix having matrix elements that are obtained by partially differentiating the third term in the performance index with respect to each of the solution inputs from the solution input at the initial time to the solution input at the time after (the control horizon—one sampling time) elapsed, and are determined by element values of the third weight matrix, a value of the control horizon and a value of the predictive horizon.

A matrix generation method relating to a fifth aspect of this technique includes: converting, by using a computer, state equations, which represent a relationship between solution output states and solution inputs of a plant to be controlled, and initial condition expressions of output states into first linear expressions representing the solution output states at each step by the output states and the solution inputs; generating, by using the computer, for each of a plurality of expressions, second linear expressions by substituting the first linear expressions and coefficient values of the solution inputs in the first linear expressions into third linear expressions regarding the solution output states, wherein the plurality of expressions are obtained by classifying a first term and a second term in a performance index for each element of a first weight matrix and a second weight matrix, which is multiplied as a coefficient, and by removing each the element from a corresponding classification result, and the third linear expressions are obtained by partially differentiating each of the plurality of expressions, with respect to each of the solution inputs from a solution input at an initial time to a solution input at a time after (a control horizon—one sampling time) elapsed, and the first term in the performance index is a term for adding a square of an error between a target value of the output state and the solution output state from a time after one sampling time elapsed since an initial time to a time after (a predictive horizon—one sampling time) elapsed, while weighting by the first weight matrix, and the second term in the performance index is a term for adding a square of an error between the target value of the output state and the solution output state after the predictive horizon while weighting by the second weight matrix, and the performance index includes the first term, the second term, a third term for adding a square of the solution inputs from the initial time to a time after (the predictive horizon—one sampling time) elapsed while weighting by a third weight matrix, and a fourth term for constraint conditions; generating, by using the computer, for each of the plurality of expressions, a matrix by extracting, for each of the plurality of expressions, coefficients of the terms of the solution inputs in the second linear expressions; and generating, by using the computer, for each of the plurality of expressions, a vector by extracting, for each of the plurality of expressions, terms other than the terms of the solution inputs in the second linear expressions.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

BRIEF DESCRIPTION OF DRAWINGS

FIG. 11 is a diagram depicting a state of the simultaneous equations before the off-line matrix generation processing;

DESCRIPTION OF EMBODIMENTS

[Embodiment 1]

Figure 1:
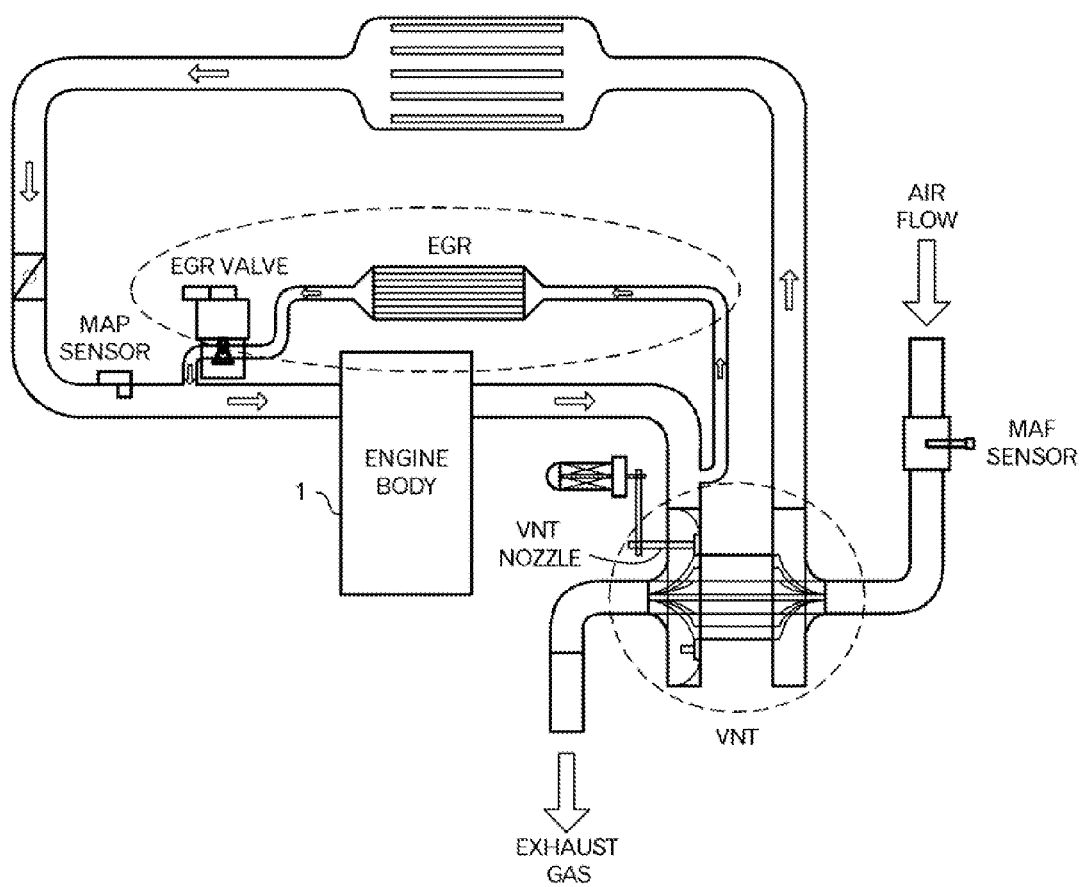
FIG. 1 is a schematic diagram of an engine that is an example of a plant.

In this embodiment, a model predictive control for a linear system (hereinafter, called a linear model predictive control) is treated.

First, the formulation of this linear model predictive control will be explained. However, as for the details, please refer to Toshiyuki Ohtsuka, "A continuation/GMRES method for fast computation of nonlinear receding horizon control", Automatica, 40(4), 563-574, April 2004.

The control target having m inputs and n outputs is represented by a following state equation:

$$\dot{x}(t) = f(x(t), u(t)) = Ax(t) + Bu(t) \quad (1)$$

Here, t represents the time, $u(k) \in R^m$ represents a control input vector to the plant, and $x(k) \in R^n$ represents a state vector of the plant. In addition, A represents an n*n matrix, and B represents an n*m matrix. The control input function is piecewise continuous for the time t.

In addition, a following constraint is given to the inputs.

$$u^{min} \leq u \leq u^{max} \quad (2)$$

In order to represent the inequational constraints as the equational constraints, dummy variables are introduced to obtain the following equational constraints. However, these are represented by C(u)=0.

$$\begin{Bmatrix} u - u^{max} + u_\alpha^2 = 0 \\ u^{min} - u + u_\beta^2 = 0 \end{Bmatrix} \quad (3)$$

Under such a prerequisite, it is assumed that the present time is t=k, the evaluation section is a section up to the time t=k+T, and the target value of the state x is Xref. Then, a following performance index V is considered.

$$V = \phi(T) + \int_0^T L(t)dt$$

$$\phi(T) = \frac{1}{2}((Xref - x(k+T))^T S(Xref - x(k+T)))$$

$$L(t) = \frac{1}{2}((Xref - x(k+t))^T Q(Xref - x(k+t)) + u(k+t)^T Ru(k+t)) - \bar{p}^T u_\alpha - \underline{p}^T u_\beta$$

$\bar{p}=(\bar{p}_1,\bar{p}_2,\ldots,\bar{p}_m)$ $\underline{p}=(\underline{p}_1,\underline{p}_2,\ldots,\underline{p}_m)$ Here, S, Q and R are respectively n*n, n*n and m*m weight matrices. Moreover, because the dummy variables $u_\alpha$ and $u_\beta$ appear in the second-order terms as expressed in the expression (3), the optimal solution can be adopted even if the sign is negative or positive. Therefore, in order to reflect which of positive or negative solution is preferable, it is assumed that $p_{topbar}$ (p with a bar placed on p) and $p_{underbar}$ (p with a bar placed under p) are minute positive value, and a term "$-p^T_{topbar}u_\alpha - p^T_{underbar}u_\beta$" is added to the integrand of the performance index. Solving the input u* that minimizes the performance index V is a core problem of the linear model predictive control. Incidentally, $p_{topbar}$ corresponds to the maximum value of $u_i$, and $p_{underbar}$ corresponds to the minimal value of $u_i$.

Lagrange multipliers are represented by $\lambda$ and $\mu$, and Hamiltonian H is defined as follows:

$$H = L + \lambda^T f + \mu^T C \quad (4)$$

The requirement that the optimal control minimizing the performance index V and the path at that time should satisfy is as follows:

$$\frac{\partial H}{\partial u} = \frac{\partial H}{\partial u_\alpha} = \frac{\partial H}{\partial u_\beta} = 0 \quad (5)$$

$$\dot{\lambda} = -\frac{\partial H}{\partial x} \quad (6)$$

$$\lambda(k+T) = \phi(T) \quad (7)$$

Therefore, solving u* minimizing V returns to solving u* satisfying the expressions (5) to (7).

Although the formulation was carried out in the continuous system up to here, a problem obtained by dividing the evaluation section and carrying out the discrete approximation is solved at each step. Typically, the evaluation section of the optimal control problem is divided by using the input cycle of the plant as the step size to carry out the discrete approximation. In the following, the problem to be solved at each step will be explained.

The cycle $\Delta\tau$ of the input is the width of the division, and T=Hp$\Delta\tau$, which is obtained by multiplying the input cycle $\Delta\tau$ by Hp, is used as the predictive horizon. This Hp$\in$R is called the predictive horizon. In the following, in order to simplify the expression, the function f(k+i*$\Delta\tau$) in the continuous system is represented by f(i) in the discrete system. In addition, Hc$\in$R, which is the number of times that the control input can be changed, is called the control horizon. Then, the following expression can be obtained.

$$u(H_c-1) = u(H_c) = \ldots = u(H_p-1)$$

The requirement of the optimization for the discretely approximate problem is represented by the following two-point boundary value problem.

$$x^*(i+1) = x^*(i) + f(x^*(i), u^*(i))\Delta\tau \quad (8)$$

$$x^*(0) = x(k) \quad (9)$$

$$H_u(\lambda^*(i+1), \mu^*(i)) = 0 \quad (10)$$

$$C(x^*(i), u^*(i)) = 0 \quad (11)$$

$$\lambda^*(i) = \lambda^*(i+1) + H_x(x^*(i), \lambda^*(i+1))\Delta\tau \quad (12)$$

$$\lambda^*(H_p) = \phi_x^T(x^*(H_p)) \quad (13)$$

Here, x*(i), u*(i), $\lambda$*(i) and $\mu$*(i) respectively represent the optimal output, input and Lagrange multipliers at the i-th step. $\Phi x^T$ represents a partial differentiation of $\Phi x^T$ with respect to x. In addition, $H_u$ and $H_x$ respectively represent the partial differentiations of Hamiltonian with respect to u and x. Namely, the following expressions can be obtained.

$$H_u = \frac{\partial H}{\partial u} = \left[\frac{\partial H}{\partial u_1}, \ldots, \frac{\partial H}{\partial u_m}\right]^T$$

$$H_x = \frac{\partial H}{\partial x} = \left[\frac{\partial H}{\partial x_1}, \ldots, \frac{\partial H}{\partial x_n}\right]^T$$

Then, when the expressions (8) to (13) are summarized, the problem to be solved is considered as the following non-linear equation system.

$$\begin{bmatrix} x^*(i+1) - x^*(i) - f(x^*(i), u^*(i))\Delta\tau \\ x^*(0) - x(k) \\ H_u(\lambda^*(i+1), u^*(i), \mu^*(i)) \\ C(x^*(i), u^*(i)) \\ \lambda^*(i) - \lambda^*(i+1) - H_x(x^*(i), \lambda^*(i+1))\Delta\tau \\ \lambda^*(H_p) - \phi_x^T(x^*(H_p)) \end{bmatrix} = 0 \quad (14)$$

Therefore, in the linear model predictive control, the linear simultaneous equations (14) are solved at each step. The calculation efficiency of the equations (14) and accuracy of the solutions of the equations (14) determine the speed and accuracy of the solving method of the model predictive control.

Incidentally, in the recent diesel engine, in order to reduce the emission and improve the fuel cost, the Mass Air Flow (MAF) and Manifold Air Pressure (MAP) are optimally controlled by an induction system controller.

Typically, as illustrated in FIG. 1, the intake gas control system of the diesel engine includes a MAP control system and MAF control system, and MAP and MAF are independently controlled each other. In order to reduce Particulate Matters (PM) in the exhaust gas, the MAP control system controls a nozzle diameter of a Variable Nozzle Turbo (VNT) to control the MAP. On the other hand, in order to reduce nitrogen oxides (NOx) in the exhaust gas, the MAF control system controls a valve opening degree of an Exhaust Gas Recirculator (EGR) that recirculates the exhaust gas into a cylinder to control MAF.

Such a diesel engine is a 2-input and 2-output control system, and also in this embodiment, the 2-input and 2-output system is considered.

In case of the 2-input and 2-output system, the control output x(k), control input u(k), dummy variables $u_\alpha$, and $u_\beta$, Lagrange multipliers $\lambda$(k) and target value Xref of the control output are represented as follows:

$x(k) = (x_1(k), x_2(k))^T$ $u(k) = (u_1(k), u_2(k))^T$ $u_\alpha = \bar{d} = (\bar{d}_1, \bar{d}_2)^T$ $u_\beta = \underline{d} = (\underline{d}_1, \underline{d}_2)^T$ $\lambda(k) = (\lambda_1(k), \lambda_2(k))^T$ $\mu(k) = (\bar{\mu}_1(k), \underline{\mu}_1(k), \bar{\mu}_2(k), \underline{\mu}_2(k))^T$ $Xref = (xr_1, xr_2)^T$ Incidentally, $d_{topbar}$ (d with a bar placed on d) and $d_{underbar}$ (d with a bar placed under d) are variables.

Furthermore, coefficient matrices in the state equations of the control target are represented as follows:

$$A = \begin{pmatrix} a_{11} & a_{12} \\ a_{21} & a_{22} \end{pmatrix}, B = \begin{pmatrix} b_{11} & b_{12} \\ b_{21} & b_{22} \end{pmatrix}$$

Moreover, weight matrices of the performance index V are represented as follows:

$$S = \begin{pmatrix} s_1 & 0 \\ 0 & s_2 \end{pmatrix},$$

$$Q = \begin{pmatrix} q_1 & 0 \\ 0 & q_2 \end{pmatrix}$$

$$R = \begin{pmatrix} r_1 & 0 \\ 0 & r_2 \end{pmatrix}$$

$$r_\alpha = (r_3, r_4),$$

$$r_\beta = (r_5, r_6)$$

Although the weight matrices S, Q and R are not always diagonal matrices, the explanation is made assuming they are diagonal matrices that are frequently used as a matter of fact. Incidentally, even when they are not diagonal matrices, it is possible to carry out a following processing without any problem.

Under these prerequisites, the expressions (14) are expanded as follows:

$$x_1^*(i+1) = x_1^*(i) + (a_{11}x_1^*(i) + a_{12}x_2^*(i) + b_{11}u_1^*(i) + b_{12}u_2^*(i))\Delta\tau \quad (15)$$

$$x_2^*(i+1) = x_2^*(i) + (a_{21}x_1^*(i) + a_{22}x_2^*(i) + b_{21}u_1^*(i) + b_{22}u_2^*(i))\Delta\tau \quad (16)$$

$$x_1^*(0) = x_1(k) \quad (17)$$

$$x_2^*(0) = x_2(k) \quad (18)$$

$$u_1^*(i)r_1 + \lambda_1^*(i+1)b_{11} + \lambda_2^*(i+1)b_{21} - \underline{\mu}_1^*(i) + \overline{\mu}_1^*(i) = 0 \quad (19)$$

$$u_2^*(i)r_2 + \lambda_1^*(i+1)b_{12} + \lambda_2^*(i+1)b_{22} - \underline{\mu}_2^*(i) + \overline{\mu}_2^*(i) = 0 \quad (20)$$

$$-\underline{p}_1 + 2\underline{\mu}_1^*(i)\underline{d}_1^*(i) = 0 \quad (21)$$

$$-\overline{p}_1 + 2\overline{\mu}_1^*(i)\overline{d}_1^*(i) = 0 \quad (22)$$

$$-\underline{p}_2 + 2\underline{\mu}_2^*(i)\underline{d}_2^*(i) = 0 \quad (23)$$

$$-\overline{p}_2 + 2\overline{\mu}_2^*(i)\overline{d}_2^*(i) = 0 \quad (24)$$

$$-u_1^*(i) + u_1^{min} + (\underline{d}_1^*(i))^2 = 0 \quad (25)$$

$$u_1^*(i) - u_1^{max} + (\overline{d}_1^*(i))^2 = 0 \quad (26)$$

$$-u_2^*(i) + u_2^{min} + (\underline{d}_2^*(i))^2 = 0 \quad (27)$$

$$u_2^*(i) - u_2^{max} + (\overline{d}_2^*(i))^2 = 0 \quad (28)$$

$$\lambda_1^*(i) = \lambda_1^*(i+1) + \{-(xr_1 - x_1^*(i))q_1 + \lambda_1^*(i+1)a_{11} + \lambda_2^*(i+1)a_{21}\}\Delta\tau \quad (29)$$

$$\lambda_2^*(i) = \lambda_2^*(i+1) + \{-(xr_2 - x_2^*(i))q_1 + \lambda_1^*(i+1)a_{12} + \lambda_2^*(i+1)a_{22}\}\Delta\tau \quad (30)$$

$$\lambda_1^*(H_p) = -(xr_1 - x_1^*(H_p))s_1 \quad (31)$$

$$\lambda_2^*(H_p) = -(xr_2 - x_2^*(H_p))s_2 \quad (32)$$

Incidentally, $xr_1$ and $xr_2$ represent component values of Xref.

It is desired that the simultaneous equations are solved at high speed for a control target whose response speed is high such as the intake system control in the aforementioned diesel engine. Furthermore, the direct method is preferable in order to stably obtain the correct solution without any error as much as possible. However, the direct method normally has a problem that the calculation time largely increases when the number of variables increases, compared with the iterative method. Therefore, in order to make it possible to calculate the problem within a permissible time, it is preferable that the size of the linear simultaneous equations is reduced as much as possible. According to such background, in this embodiment, by reducing the number of variables in the simultaneous equations in the off-line stage by an algebraic simplification method, the calculation amount is reduced in the online stage and the application of the direct method is enabled in a practical range.

As described above, the optimal control problem in the linear model predicative control is represented by the {(m+2n)*Hp}-element simultaneous equations (34) for the following variables in case of no constraints.

$$\tilde{M}\begin{bmatrix} x^* \\ u^* \\ \lambda^* \end{bmatrix} = \tilde{b} \quad (33)$$

$$x^* = [x^*(1), \ldots, x^*(H_p)]^T \quad (34)$$
$$u^* = [u^*(0), \ldots, u^*(H_p - 1)]^T$$
$$\lambda^* = [\lambda^*(1), \ldots, \lambda^*(H_p)]^T$$

[Case where No Constraint Condition is Considered]

In case of the linear model predicative control without considering the constraint condition, it is possible to obtain the optimal inputs by solving these simultaneous equations.

Incidentally, finally, (m*Hp)-element simultaneous equations (35) using the equations (36) as variables are solved.

$$M[u^*] = b \quad (35)$$

$$u^* = [u^*(0), \ldots, u^*(H_p - 1)]^T \quad (36)$$

In this embodiment, an off-line matrix generation apparatus that carries out a processing to simplify the expressions (33) and (34) as described below is introduced.

Figure 2:
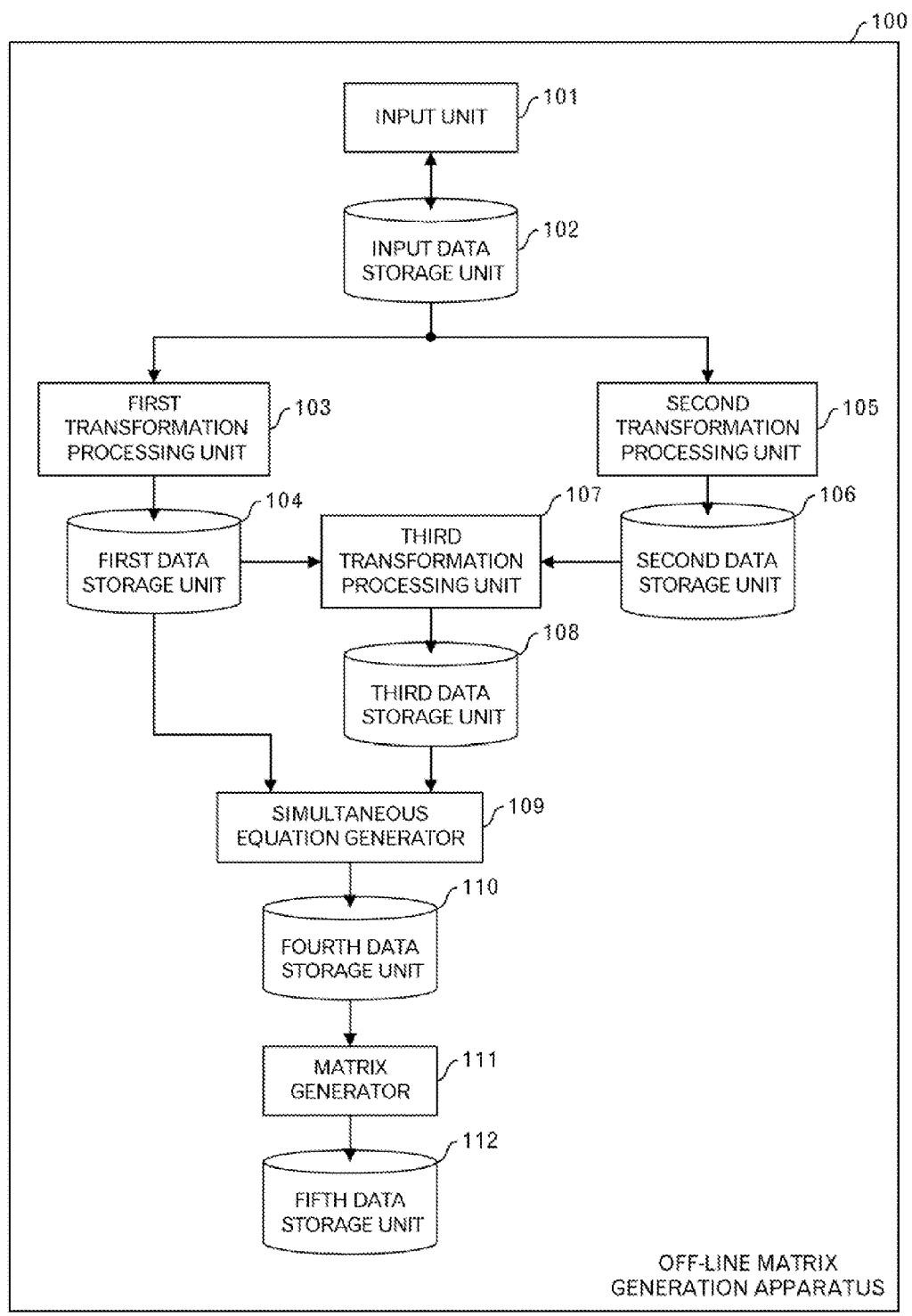
FIG. 2 is a functional block diagram of a first off-line matrix generation apparatus.

FIG. 2 illustrates a functional block diagram of the off-line matrix generation apparatus 100 relating to this embodiment. Incidentally, FIG. 2 depicts a configuration without the constraints. The off-line matrix generation apparatus 100 has an input unit 101, input data storage unit 102, first transformation processing unit 103, first data storage unit 104, second transformation processing unit 105, second data storage unit 106, third transformation processing unit 107, third data storage unit 108, simultaneous equation generator 109, fourth data storage unit 110, matrix generator 111 and fifth data storage unit 112.

The input unit 101 accepts inputs of the matrices A, B, S, Q and R, and Hp, Hc and $\Delta\tau$, as input data, and stores them into the input data storage unit 102. The input data storage unit 102 also stores data representing the simultaneous equations to be solved in addition to those data. The data of the simultaneous equations to be resolved may be inputted through the input unit 101. Furthermore, the input unit 101 also carries out a processing to set data of A, B, S, Q, R, Hp, Hc and Δτ into the simultaneous equations to be solved. The first transformation processing unit 103 carries out a first transformation processing by using data stored in the input data storage unit 102, and stores processing results into the first data storage unit 104. The second transformation processing unit 105 carries out a second transformation processing by using data stored in the input data storage unit 102, and stores processing results into the second data storage unit 106. The third transformation processing unit 107 carries out a third transformation processing by using data stored in the first data storage unit 104 and second data storage unit 106, and stores processing results into the third data storage unit 108.

The simultaneous equation generator 109 carries out a processing by using data stored in the first data storage unit 104 and third data storage unit 108, and stores processing results into the fourth data storage unit 110. The matrix generator 111 carries out a processing by using data stored in the fourth data storage unit 110, and stores processing results into the fifth data storage unit 112.

Figure 3:
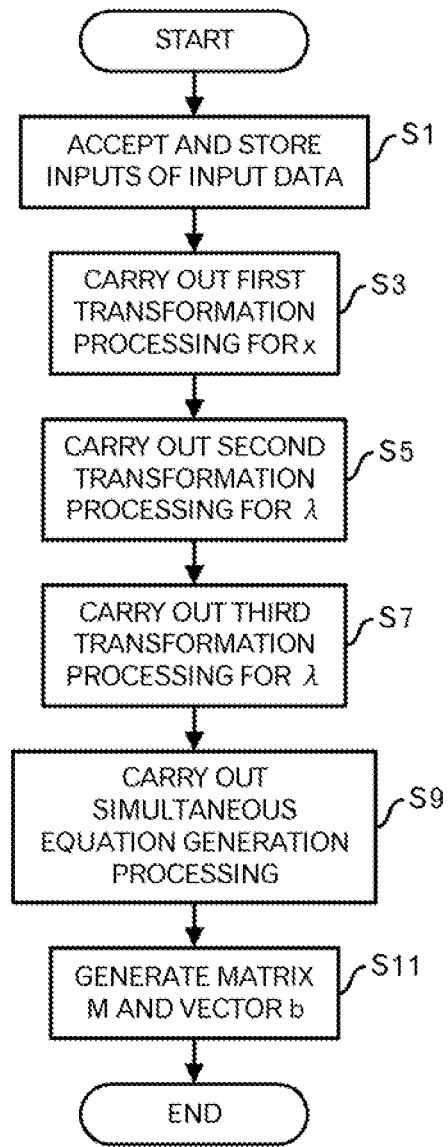
FIG. 3 is a diagram depicting a processing flow of a first off-line matrix generation processing.

Next, processing contents of the off-line matrix generation apparatus 100 is explained by using FIG. 3. First, the input unit 101 accepts inputs of the matrices A, B, S, Q and R, and Hp, Hc and Δτ, and stores the input data into the input data storage unit 102 (FIG. 3: step S1). Data of the simultaneous equations to be solved may be inputted through the input unit 101, and may be stored into the input data storage unit 102. Furthermore, the input unit 101 also carries out a processing to set data of A, B, S, Q and R, Hp, Hc and Δτ into the simultaneous equations to be solved, and stores the processing results into the input data storage unit 102.

Then, the first transformation processing unit 103 carries out the first transformation processing for the optimal output state $x^*(i)$ by using data stored in the input data storage unit 102, and stores the processing results into the first data storage unit 104 (step S3).

Specifically, the following processing is carried out. Assuming i=0, the expression (9) is substituted into the expression (8). In case of the 2-input and 2-output system, the expression (17) is substituted into the expression (15), and the expression (18) is substituted into the expression (15). However, in order to simplify the explanation, the expressions (8) and (9) are used for the following explanation.

By carrying out such a processing, a following expression using, as variables, $x(k)$ and $u^*(0)$ is obtained.

$$x^*(1)=F_1(x(k),u^*(0))$$

Similarly, setting i=1, $x^*(2)$ is represented from the expression (8) by a linear expression using $x^*(1)$ and $u^*(1)$. Therefore, when the obtained expression of $x^*(1)$ is substituted, a following expression using, as variables, $x(k)$, $u^*(0)$ and $u^*(1)$ is obtained.

$$x^*(2)=F_2(x(k),u^*(0),u^*(1))$$

By repeating the similar processing for x (3) and subsequent states, a following expression using $x(k)$, $u^*(0)$, ... and $u^*(i-1)$ can be obtained.

$$x^*(i)=F_i(x(k),u^*(0),\ldots,u^*(i-1)) \quad (37)$$

Incidentally, i=0, 1, ..., Hp−1.

Thus, the expressions of $x^*(i)$ are generated. Such processing results are stored into the first data storage unit 104.

In addition, the second transformation processing unit 105 carries out a second transformation processing for the optimal Lagrange multiplier $\lambda^*(i)$ by using data stored in the input data storage unit 102, and stores the processing results into the second data storage unit 106 (step S5).

Specifically, the following processing is carried out. Namely, setting i=Hp, the expression (13) (in case of 2-input and 2-output system, the expressions (31) and (32)) is adopted as it is. However, in $\Phi_x^T(x^*(Hp))$, the target value Xref and $x^*(Hp)$ are used as variables. Therefore, the Lagrange multiplier $\lambda^*(Hp)$ is represented as follows:

$$\lambda^*(H_p)=G_{H_p}(Xref,x^*(H_p)) \quad (38)$$

Then, setting i=Hp−1, the expression (13) is substituted into the expression (12). In case of the 2-input and 2-output system, the expression (31) is substituted into the expression (29), and the expression (32) is substituted into the expression (30). However, in order to simplify the explanation, the expressions (12) and (13) are used in the following explanation.

$$\lambda^*(H_p-1)=\phi_x^T(x^*(H_p))+H_x(x^*(H_p-1),\Phi_x^T(x^*(H_p)))\Delta\tau$$

Here, $\Phi_x^T(x^*(Hp))$ is a function of the target value Xref and $x^*(Hp)$, and the second term is a function of $x^*(Hp-1)$ and $\Phi_x^T(x^*(Hp))$. Therefore, finally, $\lambda^*(Hp-1)$ is a function of Xref, $x^*(Hp)$ and $x^*(Hp-1)$, and is represented as follows:

$$\lambda^*(H_p-1)=G_{H_p-1}(Xref,x^*(H_p),x^*(H_p-1)) \quad (39)$$

After that, setting i=Hp−2, the expression (39) is substituted into the expression (12). By repeating such a processing, $\lambda^*(Hp-j)$ becomes a linear expression of Xref, $x^*(Hp)$, $x^*(Hp-1)$, ..., $x^*(Hp-j)$.

$$\lambda^*(H_p-j)=G_{H_p-j}(Xref,x^*(H_p),\ldots,x^*(H_p-j)) \quad (40)$$

Incidentally, j=0, 1, ..., Hp−1.

Thus, the expressions of $\lambda^*(Hp-j)$ are generated. Such processing results are stored into the second data storage unit 106.

Furthermore, the third transformation processing unit 107 carries out the third transformation processing for the optimal Lagrange multiplier $\lambda^*(i)$ by using data stored in the first data storage unit 104 and second data storage unit 106, and stores the processing results into the third data storage unit 108 (step S7).

Specifically, the following processing is carried out. The expression (37) is substituted into each $\lambda^*(Hp-j)$ in the expression (40). Thus, as represented below, each $\lambda^*(Hp-1)$ becomes a linear expression of Xref, $u^*(0)$, ..., $u^*(Hp-1)$ and $x(k)$.

$$\lambda^*(H_p-j)=\tilde{G}_{H_p-j}(Xref,u^*(0),\ldots,u^*(H_p-1),x(k)) \quad (41)$$

Data of each $\lambda^*(Hp-j)$ obtained by the aforementioned processing is stored into the third data storage unit 108.

After that, the simultaneous equation generator 109 carries out the simultaneous equation generation processing by using data stored in the first data storage unit 104 and third data storage unit 108, and stores the processing results into the fourth data storage unit 110 (step S9).

In case of no constraints, it is possible to consider $\mu^*=0$, and the expression (41) is substituted into the expression (10) (in case of the 2-input and 2-output system, the expressions (19) and (20)). Then, the expression (10) is represented as a combination of linear expressions whose variables are Xref, $u^*(0)$, ..., $u^*(Hp-1)$ and $x(k)$ as follows:

$$\zeta_i(Xref,u^*(0),\ldots,u^*(H_p-1),x(k))=0 \quad (42)$$

As described above, in case of no constraint conditions, the simultaneous equations from which the optimal control solutions of the digitized linear model predictive control should be obtained become linear expressions of $u^*(0)$, ..., $u^*(Hp-1)$.

Data of these simultaneous equations is stored into the fourth data storage unit 110.

Then, the matrix generator 111 generates a matrix M and a vector b by using data stored in the fourth data storage unit 110, and stores the generated data into the fifth data storage unit 112 (step S11).

Specifically, the following processing is carried out. Namely, in case of Hc<Hp, the following expression is held.

$$u^*(H_c-1)=u^*(H_c)=\ldots=u^*(H_p-1)$$

Therefore, this relational expression is substituted into the expression (42). Then, the following expression is held.

$$\zeta_i(Xref, u^*(0), \ldots, u^*(H_c-1), x(k))=0 \quad (43)$$

Furthermore, because $\zeta_{Hc-1}=0, \ldots, \zeta_{Hp-1}=0$ are equivalent expressions, they are excluded. Then, the simultaneous equations from which the optimal control solutions should be obtained become equivalent to Hc simultaneous equations using, as variables, $u^*(0), \ldots, u^*(H_c-1)$.

$$\begin{cases} \zeta_0(Xref, u^*(0), \ldots, u^*(H_c-1), x(k)) = 0 \\ \vdots \\ \zeta_{H_c-1}(Xref, u^*(0), \ldots, u^*(H_c-1), x(k)) = 0 \end{cases} \quad (44)$$

These equations are the simultaneous linear equations using m*Hc variables. "m" represents the number of inputs. The expressions (44) are collectively converted into a following format.

$$MU=b(Xref, x(k)), U=[u_0^*, \ldots, u_{H_c-1}^*]^T \quad (45)$$

Here, M is an M*Hc square matrix, and b is an m*Hc-dimensional vector having linear expressions of Xref and x(k) as components.

This matrix M and vector function b (Xref, x(k)) is output data of the off-line matrix generation apparatus 100.

By using such a method, because the calculation of the simultaneous linear equations, which is the main calculation portion, depends only on the dimension of the control inputs and the control horizon, the entire calculation amount is almost unchanged if the number of the control inputs does not vary even when the dimension of the output states increases.

Here, a specific example (called example 1) in the 2-input and 2-output system will be explained. The coefficient matrices in the state equations of the control target are set as follows:

$$A = \begin{pmatrix} 2 & 1 \\ -1 & 3 \end{pmatrix}, B = \begin{pmatrix} -1 & 1 \\ -10 & 5 \end{pmatrix}$$

In addition, the weight matrices of the performance index V are set as follows:

$$S = \begin{pmatrix} 100 & 0 \\ 0 & 1 \end{pmatrix},$$

$$Q = \begin{pmatrix} 100 & 0 \\ 0 & 1 \end{pmatrix},$$

$$R = \begin{pmatrix} 1 & 0 \\ 0 & 1 \end{pmatrix},$$

Furthermore, when the target value is $Xref=(1, 10)^T$ and Hp=4 and Hc=2 are held, the following matrix and vectors are obtained in case of no constraint conditions.

$$M = \begin{pmatrix} 15104407 & -7896441 & 36811445 & -2080975 \\ -7896441 & 4129752 & -1920890 & 1086695 \\ 3119909 & -1628889 & 765368 & -431542 \\ -1721304 & 899259 & -420937 & 237638 \end{pmatrix}$$

$$U = (u_1^*(0), u_2^*(0), u_1^*(1), u_2^*(1))^T$$

$$b = \begin{pmatrix} 53760 - 623835x_1(k) - 6454848x_2(k) \\ -28110 + 335845x_1(k) + 3376413x_2(k) \\ 11120 - 115403x_1(k) - 1330685x_2(k) \\ -6120 + 67233x_1(k) + 734850x_2(k) \end{pmatrix}$$

The size of the matrix in the simultaneous linear equations before the aforementioned processing is carried out is 24*24, and the size of the matrix is reduced to ⅙. When the simultaneous linear equations are solved by the direct method, the calculation time is proportional to the cube of the matrix size. Therefore, the calculation time for the portion to solve the simultaneous equations becomes 1/216. Depending on the settings of the dimension of the inputs and control horizon, it is possible to reduce the matrix size of the simultaneous equations to be solved at one step by the aforementioned processing. Therefore, instead of the iterative method, the direct method can be adopted, and it becomes possible to obtain the solutions stably and at high speed. Moreover, because the simultaneous equations obtained by the aforementioned processing depend only on the dimension of the control inputs and control horizon Hc, the calculation amount does not largely increase even when the dimension of the output states x(k) becomes large. For example, when the dead time of the plant is considered by the Pade approximation or the like, the number of states increases for that purpose. For example, when 2-dimensional Pade approximation is applied, 2-input and 6-output system is required. However, even when the number of elements of the states x(i) becomes 6, there is no influence because the calculation amount depends only on the dimension of u*(i), and the simultaneous equations are obtained by replacing the terms of the optimal output states x*(i) with the terms u*(i) as aforementioned above.

Figure 4:
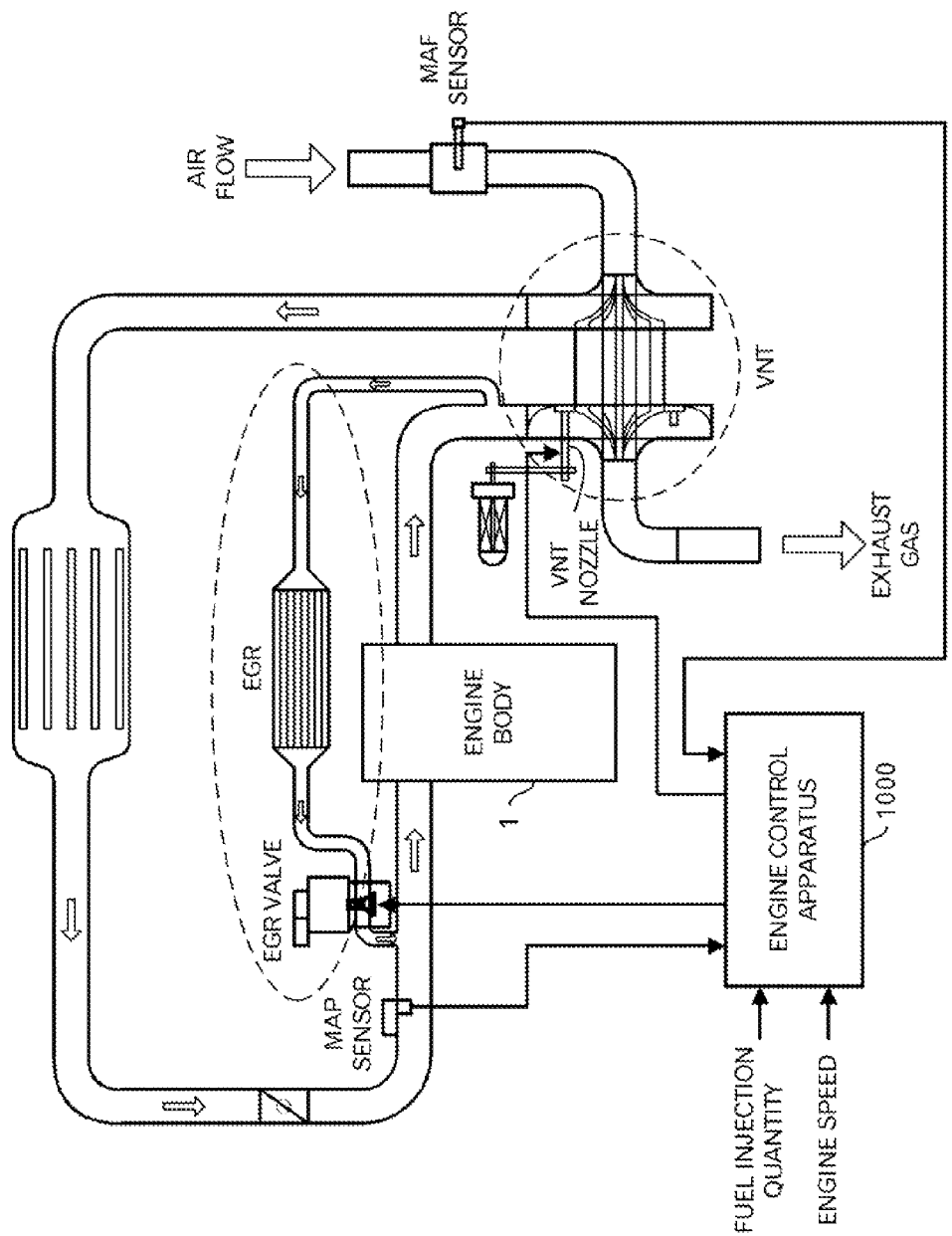
FIG. 4 is a diagram to explain an engine control apparatus of the engine that is an example of the plant.

FIG. 4 illustrates a diesel engine as an example of the engine relating to this embodiment of this technique. An Exhaust Gas Recirculator EGR to provide exhaust gas from an engine body 1 and a Variable Nozzle Turbo VNT to compress and provide fresh air to the engine body 1 by rotating a turbine by the pressure of the exhaust gas are coupled to the engine body 1. By adjusting a nozzle opening degree of the VNT, the rotation of the turbine of the VNT are adjusted, and a Manifold Air Pressure (MAP) measured by a MAP sensor is adjusted. On the other hand, by adjusting a valve opening degree of an EGR valve provided in the EGR, a Mass Air Flow (MAF) measured by a MAF sensor is adjusted.

The measurement value of MAP from the MAP sensor, measurement value of MAF from the MAF sensor, setting value of the fuel injection quantity given from the outside and setting value of the engine speed also given from the outside are inputted to the engine control apparatus 1000 relating to this embodiment. In addition, the manipulation amount (also called control input or simply input) of the valve opening degree of the EGR valve is outputted to the EGR valve from the engine control apparatus 1000, and the manipulation amount (also called control input or simply input) of the nozzle opening degree of the VNT nozzle is outputted to the VNT nozzle from the engine control apparatus 1000.

Figure 5:
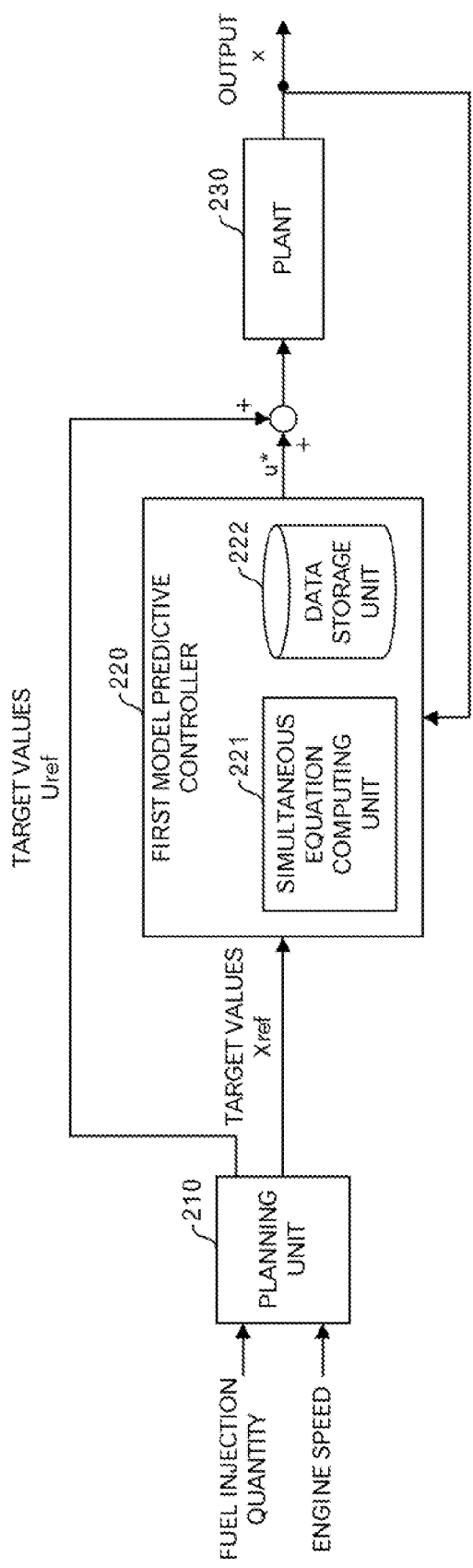
FIG. 5 is a simplified block diagram of a first engine control apparatus.

FIG. 5 illustrates a block diagram of an engine control apparatus 1000 relating to this embodiment. The engine control apparatus 1000 has a planning unit 210 and a first model predictive controller 220. The plant 230 corresponds to engine characteristics, for example. The first model predictive controller 220 includes a simultaneous equation computing unit 221 that is a computing unit to solve the simultaneous linear equations by the direct method and data storage unit 222. The data storage unit 222 stores data regarding M and b.

Namely, a setting value of the fuel injection quantity and a setting value of the engine speed are inputted to the planning unit 210. Furthermore, in the planning unit 210, the target values Uref of the EGR valve opening degree and VNT nozzle opening degree are associated with each combination of the fuel injection quantity and the engine speed, and the target values Xref of the MAP and MAF are associated with each combination of the fuel injection quantity and the engine speed. In this embodiment, the planning unit 210 outputs the target values Uref of the EGR valve opening degree and VNT nozzle opening degree, and the target values Xref of the MAP and MAF.

The target values Xref and output x(k) from the plant 230 (e.g. MAF sensor output and MAP sensor output) are inputted to the first model predictive controller 220. The first model predictive controller 220 carries out a model predictive control described below, and outputs inputs u*(i) to the plant 230. Such a processing is repeated.

Figure 6:
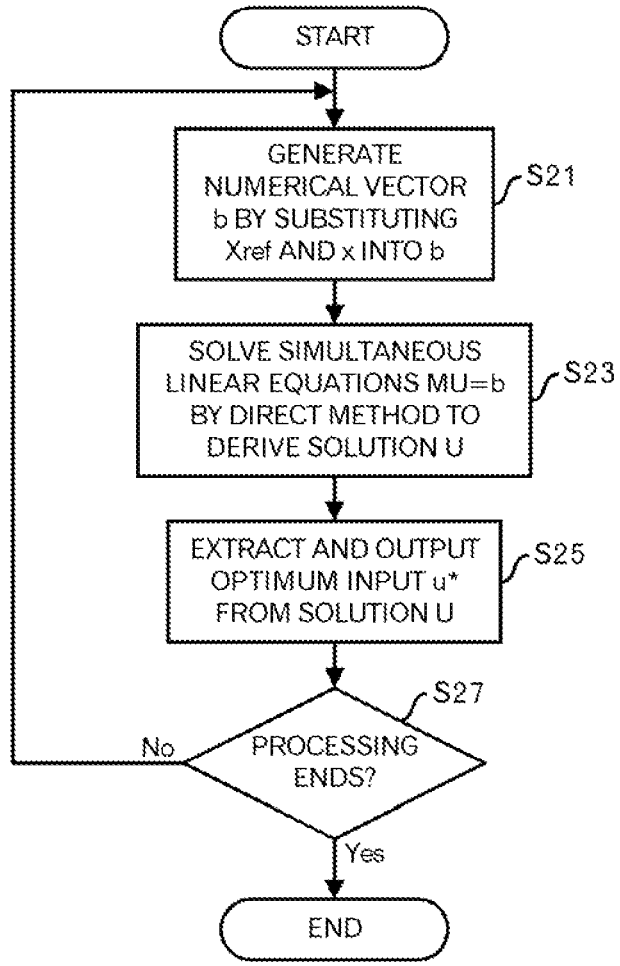
FIG. 6 is a diagram depicting a processing flow of a first model predictive controller.

Next, a processing carried out by the first model predictive controller 220 is explained by using FIG. 6. The first predictive controller 220 obtains the target values Xref and output x(k), and generates a numerical vector by substituting the target values Xref and output x(k) into b (FIG. 6: step S21). Then, the simultaneous equation computing unit 221 of the first model predictive controller 220 solves the simultaneous linear equations MU=b by the well-known direct method to derive a solution U (step S23). The method itself is the same as the conventional one. However, the matrix and vectors are completely different. As described above, not only the size of M and b is largely reduced, but also the respective components (also called elements) are different.

Namely, in case where the off-line matrix generation processing relating to this embodiment is not carried out, the left side of the summarized expressions (8) to (13) includes a product of a coefficient matrix including the coefficient matrices $A_{bar}$ and $B_{bar}$ ($A_{bar}$=I+ΔτA, $B_{bar}$=I+ΔτB) and components of the weight matrices S, Q and R of the performance index V, and a vector including the (the predictive horizon Hp*the number of inputs m) optimal inputs u*(i), the (the predictive horizon Hp*the number of outputs n) optimal outputs x*(i) and the (the predictive horizon Hp*the number of outputs n) optimal Lagrange multiplier λ*(i). On the other hand, the right side is a vector including components of x(k), which is unresolved when the off-line matrix generation processing is carried out, and target values Xref.

On the other hand, by carrying out the off-line matrix generation processing, elements to be considered are limited to the inputs u*(i) by transforming expressions representing the optimal output states x*(i) and the optimal Lagrange multiplier λ*(i) into the expressions of the optimal inputs u*(i) and carrying out the substitution. Then, as for the optimal inputs u*, the optimal inputs u*(Hc) to u*(Hp−1) are excluded to reduce the number of elements to be resolved. After the aforementioned off-line matrix generation processing is carried out, the vector U in MU=b includes, as components, only inputs u*(i) whose number of components is the control horizon Hc. In addition, the function vector b is a function of the target values Xref and x(k), and includes Hc elements. The coefficient matrix M is a coefficient matrix to secure the equivalence with the equations before the off-line matrix generation processing, in a form of MU=b.

Therefore, even when the same method to solve the simultaneous linear equations is used, the simultaneous linear equations in a completely different form are solved in this embodiment, and the processing load is largely reduced.

After that, the first model predictive controller 220 extracts the optimal input values u* from the solution U, and outputs the extracted values to the plant 230 (step S25). The optimal input values u* is a component u*(0) in the solution U. Then, the aforementioned processing is carried out until the processing is completed (step S27).

By carrying out the aforementioned processing, it becomes possible to obtain the optimal input values u* at high speed in this online processing. Incidentally, the target values Uref of the EGR valve opening degree and VNT nozzle opening degree, which are outputted from the planning unit 210, are added to u*, and the addition result is outputted to the plant 230.

[Case where the Constraint Condition is Considered]

Next, the case where the constraint conditions are considered will be explained. In case where no constraint conditions are considered, the algebraic simplification method is used to reduce the size of the matrix. However, because the constraint conditions C(u)=0 in the expressions (11) (in case of the 2-input and 2-output system, the expressions (25) to (28)) are nonlinear, it is impossible to treat the constraint conditions as they are. Then, by skillfully carrying out the algebraic processing and the first order approximation, the constraint conditions are built into the simultaneous linear equations in case where no constraint conditions are considered.

Figure 7:
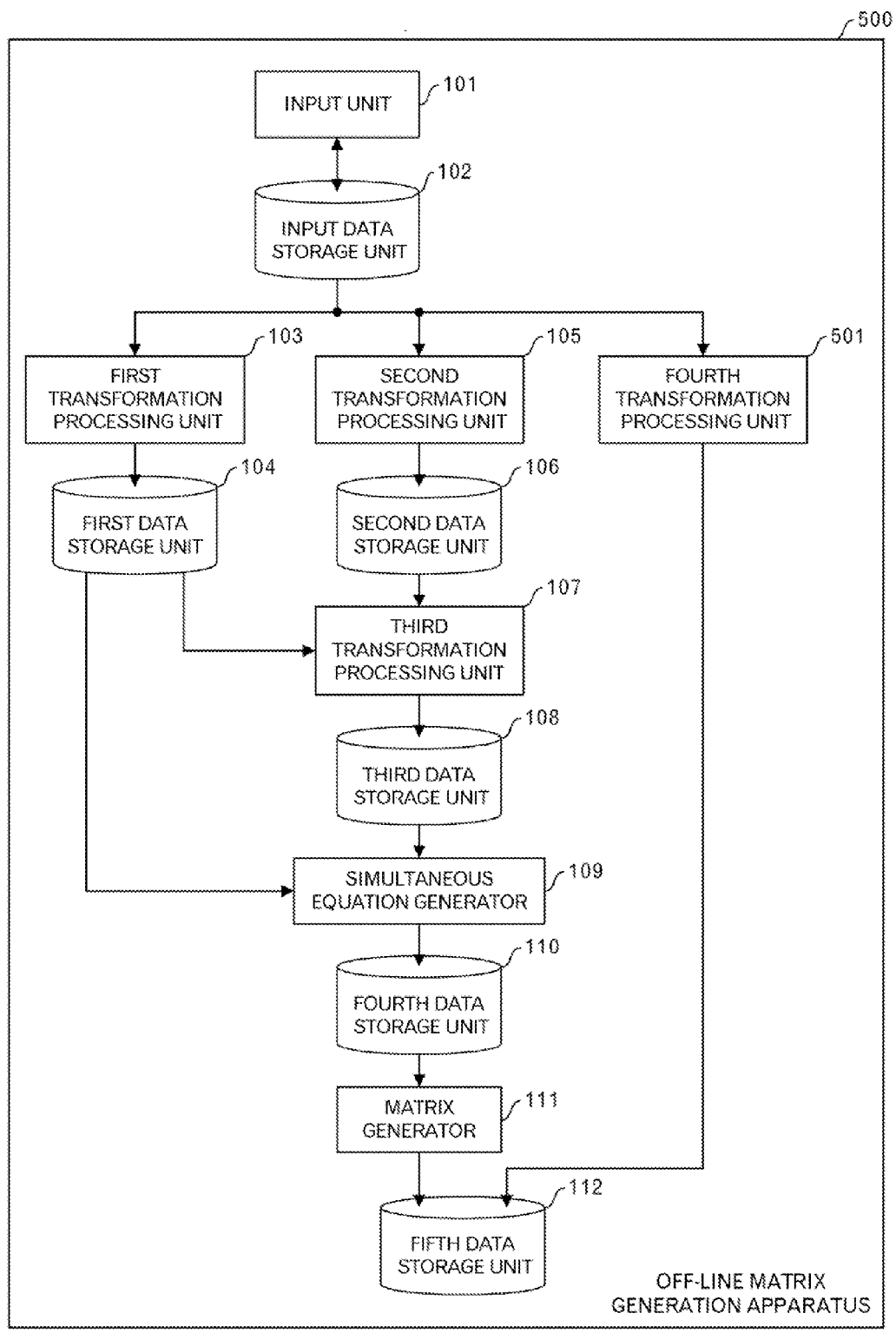
FIG. 7 is a functional block diagram of a second off-line matrix generation apparatus.

FIG. 7 illustrates a configuration of an off-line matrix generation apparatus 500 in case where the constraint conditions are considered. The same reference numbers are allocated to elements having the same function in case where no constraint conditions are considered.

The off-line matrix generation apparatus 500 has an input unit 101, input data storage unit 102, first transformation processing unit 103, first data storage unit 104, second transformation processing unit 105, second data storage unit 106, third transformation processing unit 107, third data storage unit 108, simultaneous equation generator 109, fourth data storage unit 110, matrix generator 111, fifth data storage unit 112 and fourth transformation processing unit 501. Thus, the fourth transformation processing unit 501 is newly introduced.

The input unit 101 accepts inputs of the matrices A, B, S, Q and R, Hp, Hc, Δτ, $p_{topbar}$ and $p_{underbar}$ and stores them into the input data storage unit 102. The input data storage unit 102 also stores data representing the simultaneous equations to be solved in addition to those data. The data of the simultaneous equations to be solved may be inputted through the input unit 101. Furthermore, the input unit 101 also carries out a processing to set data of A, B, S, Q and R, Hp, Hc, Δτ, $p_{topbar}$ and $p_{underbar}$ into the simultaneous equations to be solved. The constraint conditions may be inputted and stored into the input data storage unit 102. The first transformation processing unit 103 carries out a first transformation processing by using data stored in the input data storage unit 102, and stores processing results into the first data storage unit 104. The second transformation processing unit 105 carries out a second transformation processing by using data stored in the input data storage unit 102, and stores processing results into the second data storage unit 106. The third transformation processing unit 107 carries out a third transformation processing by using data stored in the first data storage unit 104 and second data storage unit 106, and stores processing results into the third data storage unit 108.

The simultaneous equation generator 109 carries out a processing by using data stored in the first data storage unit 104 and third data storage unit 108, and stores processing results into the fourth data storage unit 110. The matrix generator 111 carries out a processing by using data stored in the fourth data storage unit 110, and stores processing results into the fifth data storage unit 112.

The fourth transformation processing unit 501 carries out a processing by using data stored in the input data storage unit 102, and stores processing results into the fifth data storage unit 112.

Figure 8:
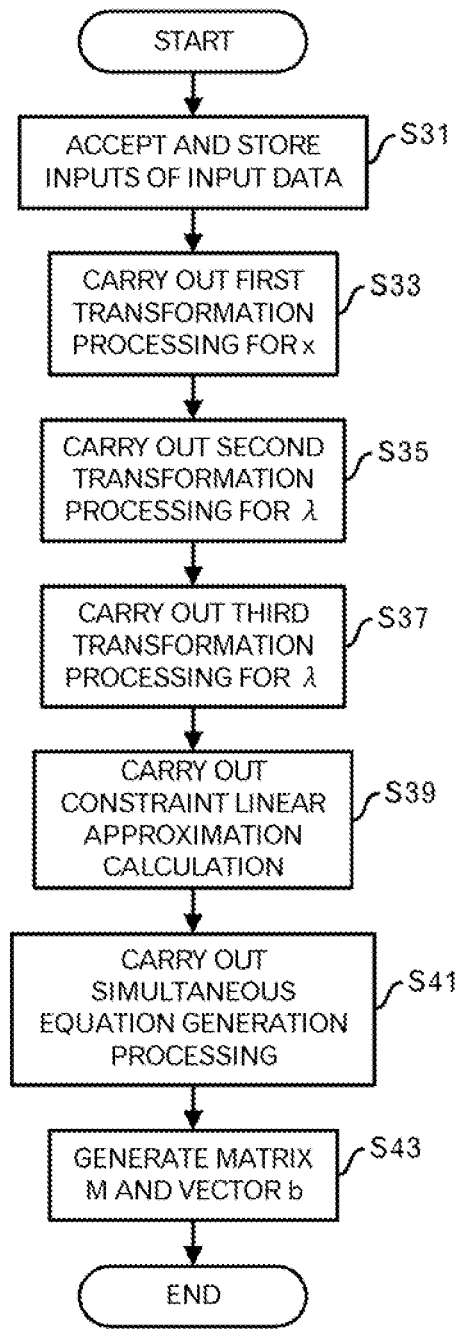
FIG. 8 is a diagram depicting a processing of a second off-line matrix generation processing.

Next, processing contents of the off-line matrix generation apparatus 500 is explained by using FIG. 8. First, the input unit 101 accepts inputs of the matrices A, B, 5, Q and R, and Hp, Hc, $\Delta\tau$, $p_{topbar}$ and $p_{underbar}$, and stores the input data into the input data storage unit 102 (FIG. 8: step S31). The constraint conditions $u^{min}j$ and $u^{max}j$ may also be inputted. Data of the simultaneous equations to be solved may be inputted through the input unit 101, and may be stored into the input data storage unit 102. Furthermore, the input unit 101 carries out a processing to set data of A, B, S, Q and R, Hp, Hc, $\Delta\tau$, $p_{topbar}$ and $p_{underbar}$ into the simultaneous equations to be solved, and stores the processing results into the input data storage unit 102.

Then, the first transformation processing unit 103 carries out the first transformation processing for the optimal output state x*(i) by using data stored in the input data storage unit 102, and stores the processing results into the first data storage unit 104 (step S33). This step is the same as the step S3. Therefore, the detailed explanation is omitted.

In addition, the second transformation processing unit 105 carries out a second transformation processing for the optimal Lagrange multiplier $\lambda$*(i) by using data stored in the input data storage unit 102, and stores the processing results into the second data storage unit 106 (step S35). This step is the same as the step S5. Therefore, the detailed explanation is omitted.

Furthermore, the third transformation processing unit 107 carries out the third transformation processing for the optimal Lagrange multiplier $\lambda$*(i) by using data stored in the first data storage unit 104 and second data storage unit 106, and stores the processing results into the third data storage unit 108 (step S37). This step is the same as the step S7. Therefore, the detailed explanation is omitted.

Then, the fourth transformation processing unit 501 carries out a constraint linear approximation calculation by using data stored in the input data storage unit 102 and third data storage unit 108, and stores processing results into the fifth data storage unit 112 (step S39). This step is different from a case where no constraint conditions are considered. However, because there is no influence to other processing, the detailed explanation will be made after the explanation of the processing of FIG. 8.

After that, the simultaneous equation generator 109 carries out the simultaneous equation generation processing by using data stored in the input data storage unit 102, and stores the processing results into the fourth data storage unit 110 (step S41). This step is the same as the step S9. Therefore, the detailed explanation is omitted.

Then, the matrix generator 111 generates a matrix M and a vector b by using data stored in the fourth data storage unit 110, and stores the generated data into the fifth data storage unit 112 (step S43). This step is the same as the step S11. Therefore, the detailed explanation is omitted. Thus, data to be used in the online processing is stored into the fifth data storage unit 112.

Next, the detailed constraint linear approximation calculation will be explained. Here, $\lambda$* and $\mu$* are eliminated in the expression (10) (in case of the 2-input and 2-output system, the expressions (19) to (24)). Namely, linear expressions represented by u*(i) and $u_{bar}$*(i) ($u_{bar}$ represents u with a bar placed on u), which is a value of u*(i) calculated one sampling time before are generated.

A case of the 2-input and 2-output system will be explained in detail. It is assumed that x*(i) is represented at the step S23 with u*(i) by the expressions (15) to (18), and $\lambda$*(i) is represented with u* by the expressions (29) to (32) and x*(i). Then, from i=0, the following transformation is carried out.

Namely, the expression (21) for the lower limit of the constraint conditions is transformed as follows:

$$\underline{\mu}_1^*(0) = \frac{p_1}{2d_1^*(0)} \tag{46}$$

Moreover, the expression (25) is transformed as follows:

$$\bar{d}_1^*(0) = \sqrt{u_1^*(0) - u_1^{min}} \tag{47}$$

Here, when the expression (47) is substituted into the expression (46), the following expression is obtained.

$$\underline{\mu}_1^*(0) = \frac{p_1}{2\sqrt{u_1^*(0) - u_1^{min}}} \tag{48}$$

Thus, $\mu_{underbar1}$*(0) ($\mu_1$*(0) with a bar placed under $\mu_1$* (0)) is transformed to a function of $u_1$*(0). However, because this is not a linear function, it is impossible to treat it as the simultaneous linear equations. Therefore, the linear approximation is used.

When the linear approximation is carried out, the selection method of the reference point of the approximation is important. In this embodiment, the input value $u_{1bar}$*(1) u, which was obtained at t=k−1 by the optimization calculation but was a value for the same time, is selected as the reference point. Namely, an output value after one sampling time, which was calculated, but was not outputted to the plant 230, is selected. Then, the expression (48) is transformed as follows:

$$\underline{\mu}_1^*(0) = \frac{p_1}{2\sqrt{u_1^*(1) - u_1^{min}}} + \frac{p_1 \tilde{u}_1^*(1)}{4(\tilde{u}_1^*(1) - u_1^{min})^{\frac{3}{2}}} - \frac{p_1}{4(\tilde{u}_1^*(1) - u_1^{min})^{\frac{3}{2}}} u_1^*(0) \tag{49}$$

By doing so, it becomes possible to build the constraints into the simultaneous linear equations. Incidentally, in order to make it easy to understand, $w_{underbar}$ and $v_{underbar}$ (underbar represents underline.) are introduced.

$$\underline{w}_1(0) = \frac{p_1}{2\sqrt{\tilde{u}_1^*(1) - u_1^{min}}} + \frac{p_1 \tilde{u}_1^*(1)}{4(\tilde{u}_1^*(1) - u_1^{min})^{\frac{3}{2}}} \tag{50}$$

-continued $$\underline{v}_1(0) = \frac{p_1}{4(\tilde{u}_1^*(1) - u_1^{min})^{\frac{3}{2}}} \quad (51)$$

Therefore, the expression (49) is represented as follows:

$$\underline{\mu}_1^*(0) = \underline{w}_1(0) + \underline{v}_1(0)u_1^*(0) \quad (52)$$

After similarly transforming $\mu_{underbar2}(0)$, the linear approximation is carried out. Furthermore, after i is incremented by 1, the similar transformation is carried out. Then, the calculation results $u_{1bar}^*(2)$ and $u_{2bar}^*(2)$ after (i+1) unit times, which were calculated at t=k−1 by the optimization calculation, are feedback, and the linear approximation is carried out based on the feedback calculation results. Such a processing is repeated until i=Hc−1. Then, the following general expressions can be obtained.

$$\underline{\mu}_1^*(i) = \underline{w}_1(i) + \underline{v}_1(i)u_1^*(i) \quad (53\text{-}1)$$

$$\underline{w}_1(i) = \frac{p_1}{2\sqrt{\tilde{u}_1^*(i+1) - u_1^{min}}} + \frac{p_1 \tilde{u}_1^*(i+1)}{4(\tilde{u}_1^*(i+1) - u_1^{min})^{\frac{3}{2}}}$$

$$\underline{v}_1(i) = -\frac{p_1}{4(\tilde{u}_1^*(i+1) - u_1^{min})^{\frac{3}{2}}}$$

$$\underline{\mu}_2^*(i) = \underline{w}_2(i) + \underline{v}_2(i)u_2^*(i) \quad (53\text{-}2)$$

$$\underline{w}_2(i) = \frac{p_2}{2\sqrt{\tilde{u}_2^*(i+1) - u_2^{min}}} + \frac{p_2 \tilde{u}_2^*(i+1)}{4(\tilde{u}_2^*(i+1) - u_2^{min})^{\frac{3}{2}}}$$

$$\underline{v}_2(i) = -\frac{p_2}{4(\tilde{u}_2^*(i+1) - u_2^{min})^{\frac{3}{2}}}$$

Next, the expression (22) for the upper limit of the constraint conditions is transformed at i=0 as follows:

$$\overline{\mu}_1^*(0) = \frac{p_1}{2\overline{d}_1^*(0)} \quad (54)$$

Moreover, the expression (26) is transformed as follows:

$$\overline{d}_1^*(0) = \sqrt{u_1^{max} - u_1^*(0)} \quad (55)$$

Here, when the expression (55) is substituted into the expression (54), the following expression is obtained.

$$\overline{\mu}_1^*(0) = \frac{p_1}{2\sqrt{u_1^{max} - u_1^*(0)}} \quad (56)$$

When viewing the expression (56), $\mu_{topbar1*}(0)$ ($\mu_1^*(0)$ with a bar placed on $\mu_1^*(0)$) for the upper limit is also represented as a function of $u_1^*(0)$. Therefore, the similar linear approximation is carried out. Namely, in this embodiment, the input value $u_{1bar}^*(1)$, which was obtained at t=k−1 by the optimization calculation but was a value for the same time, is selected as the reference point. Namely, an output value after one sampling time, which was calculated, but was not outputted to the plant 230, is selected. Then, the expression (56) is transformed as follows:

$$\overline{\mu}_1^*(0) = \quad (57)$$

$$\frac{\overline{p}_1}{2\sqrt{u_1^{max} - \tilde{u}_1^*(1)}} - \frac{\overline{p}_1 \tilde{u}_1^*(1)}{4(u_1^{max} - \tilde{u}_1^*(1))^{\frac{3}{2}}} + \frac{\overline{p}_1}{4(u_1^{max} - \tilde{u}_1^*(1))^{\frac{3}{2}}} u_1^*(0)$$

By doing so, it becomes possible to build the constraints into the simultaneous linear equations. Incidentally, in order to make it easy to understand, $w_{topbar}$ and $v_{topbar}$ (topbar represents a bar placed on the symbol.) are introduced.

$$\overline{w}_1(0) = -\frac{\overline{p}_1}{2\sqrt{u_1^{max} - \tilde{u}_1^*(1)}} - \frac{\overline{p}_1 \tilde{u}_1^*(1)}{4(u_1^{max} - \tilde{u}_1^*(1))^{\frac{3}{2}}} \quad (58)$$

$$\overline{v}_1(0) = \frac{\overline{p}_1}{4(u_1^{max} - \tilde{u}_1^*(1))^{\frac{3}{2}}} \quad (59)$$

Such a processing is repeated until i=Hc−1. Then, the following general expressions can be obtained.

$$\overline{\mu}_1^*(i) = \overline{w}_1(i) + \overline{v}_1(i)u_1^*(i) \quad (60)$$

$$\overline{w}_1(i) = -\frac{\overline{p}_1}{2\sqrt{u_1^{max} - \tilde{u}_1^*(i+1)}} - \frac{\overline{p}_1 \tilde{u}_1^*(i+1)}{4(u_1^{max} - \tilde{u}_1^*(i+1))^{\frac{3}{2}}}$$

$$\overline{v}_1(i) = \frac{\overline{p}_1}{4(u_1^{max} - \tilde{u}_1^*(i+1))^{\frac{3}{2}}}$$

After similarly transforming $\mu_{topbar2}(0)$, the linear approximation is carried out. Furthermore, after i is incremented by 1, the similar transformation is carried out. Then, the calculation results $u_{1bar}^*(2)$ and $u_{2bar}^*(2)$ after (i+1) unit times, which were calculated at t=k−1 by the optimization calculation, are feedback, and the linear approximation is carried out based on the feedback calculation results. Such a processing is repeated until i=Hc−1. Then, the following general expressions can be obtained.

$$\overline{\mu}_2^*(i) = \overline{w}_2(i) + \overline{v}_2(i)u_2^*(i) \quad (61)$$

$$\overline{w}_2(i) = -\frac{\overline{p}_2}{2\sqrt{u_2^{max} - \tilde{u}_2^*(i+1)}} - \frac{\overline{p}_2 \tilde{u}_2^*(i+1)}{4(u_2^{max} - \tilde{u}_2^*(i+1))^{\frac{3}{2}}}$$

$$\overline{v}_2(i) = \frac{\overline{p}_2}{4(u_2^{max} - \tilde{u}_2^*(i+1))^{\frac{3}{2}}}$$

Generally, after carrying out the aforementioned transformation, the simultaneous linear equations are solved by these results and the processing results of the third transformation processing unit 107. However, actually, it has been understood that the entire simultaneous equations are represented as follows:

$$(M - \text{diag}(\underline{V}) + \text{diag}(\overline{V}))U = b + \underline{W} - \overline{W} \quad (62)$$

$$\underline{V} = \begin{bmatrix} \underline{v}_1(0) \\ \underline{v}_2(0) \\ \vdots \\ \underline{v}_m(0) \\ \underline{v}_1(1) \\ \vdots \\ \underline{v}_m(1) \\ \vdots \\ \underline{v}_1(H_c - 1) \\ \vdots \\ \underline{v}_m(H_c - 1) \end{bmatrix}, \quad (63)$$

$$\overline{V} = \begin{bmatrix} \overline{v}_1(0) \\ \overline{v}_2(0) \\ \vdots \\ \overline{v}_m(0) \\ \overline{v}_1(1) \\ \vdots \\ \overline{v}_m(1) \\ \vdots \\ \overline{v}_1(H_c - 1) \\ \vdots \\ \overline{v}_m(H_c - 1) \end{bmatrix}, \quad (65)$$

$$\underline{W} = \begin{bmatrix} \underline{w}_1(0) \\ \underline{w}_2(0) \\ \vdots \\ \underline{w}_m(0) \\ \underline{w}_1(1) \\ \vdots \\ \underline{w}_m(1) \\ \vdots \\ \underline{w}_1(H_c - 1) \\ \vdots \\ \underline{w}_m(H_c - 1) \end{bmatrix}, \quad (64)$$

$$\overline{W} = \begin{bmatrix} \overline{w}_1(0) \\ \overline{w}_2(0) \\ \vdots \\ \overline{w}_m(0) \\ \overline{w}_1(1) \\ \vdots \\ \overline{w}_m(1) \\ \vdots \\ \overline{w}_1(H_c - 1) \\ \vdots \\ \overline{w}_m(H_c - 1) \end{bmatrix} \quad (66)$$

Incidentally, diag(V) is a diagonal matrix whose diagonal components correspond to the respective components of the vector V.

Namely, the fourth transformation processing unit 501 generates vectors represented by the expressions (63) to (66) in fact.

$$\underline{w}_j(i) = \frac{p_j}{2\sqrt{\tilde{u}_j^*(i+1) - u_j^{min}}} + \frac{p_j \tilde{u}_j^*(i+1)}{4(\tilde{u}_j^*(i+1) - u_j^{min})^{\frac{3}{2}}}$$

$$\underline{v}_j(i) = -\frac{p_j}{4(\tilde{u}_j^*(i+1) - u_j^{min})^{\frac{3}{2}}}$$

$$\overline{w}_j(i) = \frac{\overline{p}_j}{2\sqrt{u_j^{max} - \tilde{u}_j^*(i+1)}} + \frac{\overline{p}_j \tilde{u}_j^*(i+1)}{4(u_j^{max} - \tilde{u}_j^*(i+1))^{\frac{3}{2}}}$$

$$\overline{v}_j(i) = -\frac{\overline{p}_j}{4(u_j^{max} - \tilde{u}_j^*(i+1))^{\frac{3}{2}}}$$

$$i = 0, \ldots H_c - 1, \; j = 1, \ldots, m$$

As for M, a result obtained by transforming a first constraint vector to a diagonal matrix is added to M, and a result obtained by transforming a second constraint vector to a diagonal matrix is further subtracted. The first constraint vector includes ((the number of inputs)*(control horizon Hc)) components represented by the upper limit value and the optimal input values at the corresponding time in the previous calculation result, and the second constraint vector includes ((the number of inputs)*(control horizon Hc)) components represented by the lower limit value and the optimal input values at the corresponding time in the previous calculation result. As for b, a third constraint vector is subtracted from b and a fourth vector is further added. The third vector includes ((the number of inputs)*(control horizon Hc)) components represented by the upper limit value and the optimal input values at the corresponding time in the previous calculation result, and the fourth constraint vector includes ((the number of inputs)*(control horizon Hc)) components represented by the lower limit value and the optimal input values at the corresponding time in the previous calculation result.

Figure 9:
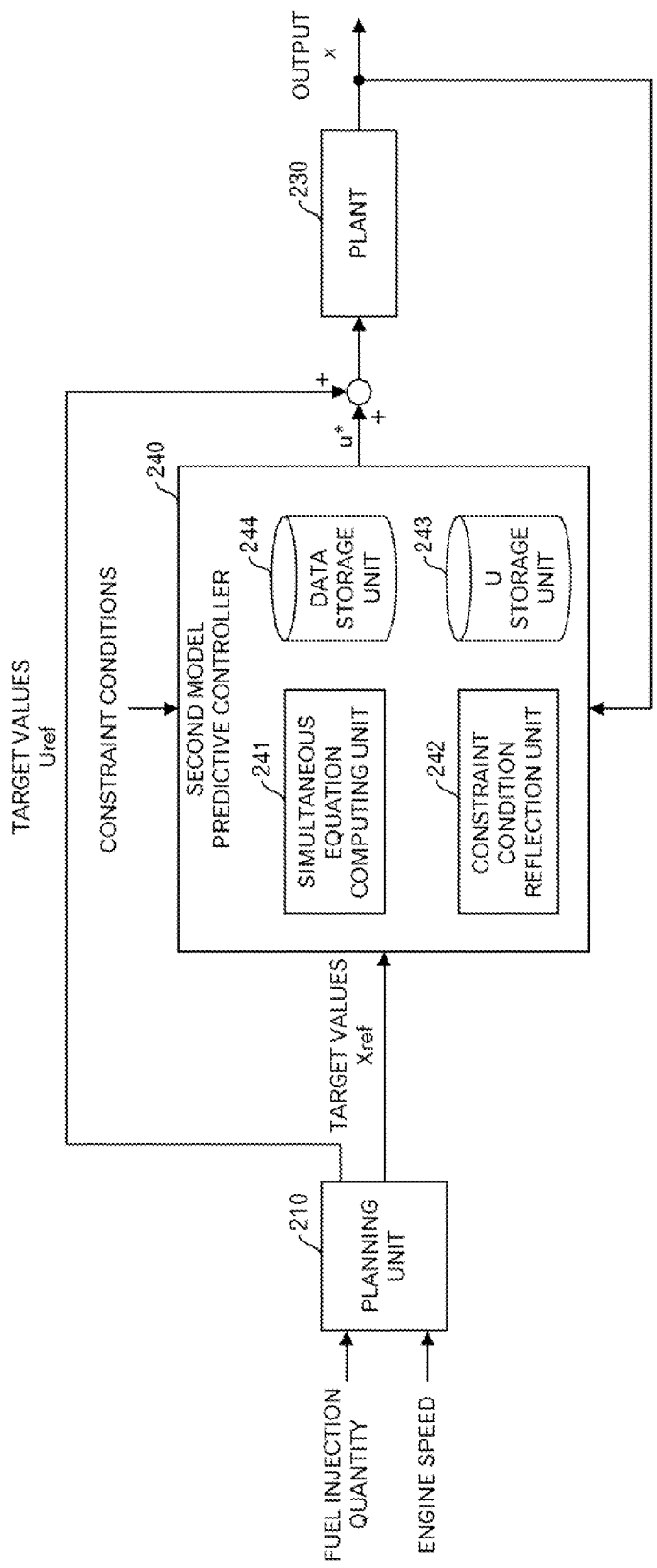
FIG. 9 is a simplified block diagram of a second engine control apparatus.

Next, FIG. 9 illustrates a block diagram of the engine control apparatus 1000 in case where the constraint condition is considered.

The engine control apparatus 1000 has a planning unit 210 and second model predictive controller 240. The plant 230 corresponds to the engine characteristics. The second model predictive controller 240 has a simultaneous equation computing unit 241, constraint condition reflection unit 242, U storage unit 243 and data storage unit 244. The data storage unit 244 stores data of b, $V_{underbar}$, $V_{topbar}$, $W_{underbar}$ and $W_{topbar}$.

Namely, the setting values of the fuel injection quantity and engine speed are inputted to the planning unit 210, and in the planning unit 210, the target values Uref of the EGR valve opening degree and VNT nozzle opening degree are associated with each combination of the fuel injection quantity and the engine speed, and target values Xref of the MAP and MAF are associated with each combination of the fuel injection quantity and the engine speed. In this embodiment, the target values Uref of the EGR valve opening degree and the VNT nozzle opening degree and the target values Xref of the MAF and MAP are outputted from this planning unit 210.

The target values Xref, outputs x(k) from the plant 230 (MAF sensor output and MAP sensor output), optimal input value U*(i-1) calculated one sampling time before and constraint conditions are inputted to the second model predictive controller 240. When the constraint conditions do not vary, the constraints conditions are embedded into $W_{underbar}$, $V_{underbar}$, $W_{topbar}$ and $V_{topbar}$ in the off-line matrix generation processing. The second model predictive controller 240 carries out a processing for the model predictive control described below, and the input u*(i) is outputted to the plant 230.

Figure 10:
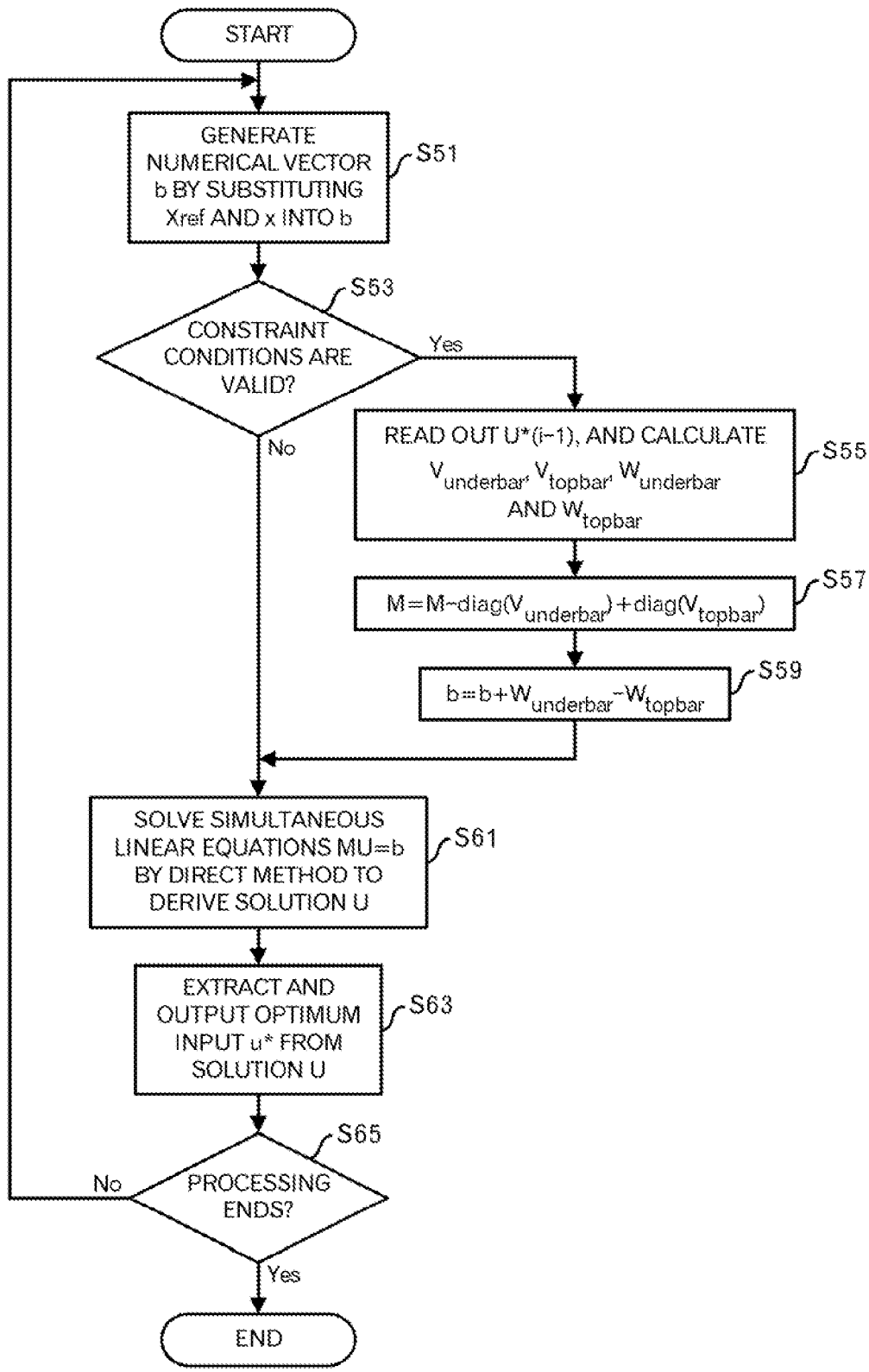
FIG. 10 is a diagram depicting a processing flow of a second model predictive controller.

Next, the processing of the second model predictive controller 240 will be explained by using FIG. 10. The second model predictive controller 240 obtains the target values Xref and x(k) and generates a numeral vector b by substituting the target values Xref and outputs x(k) into b (FIG. 10: step S51). Then, the second model predictive controller 240 determines whether or not the constraint conditions are valid (step S53). There is a case where the setting is fixed, and a setting of valid or invalid may be inputted from the outside.

When the constraint conditions are valid, the constraint condition reflection unit 242 reads out the solution U*(i−1) obtained one sampling time before from the U storage unit 243, and calculates $V_{underbar}$, $V_{topbar}$, $W_{underbar}$ and $W_{topbar}$ as described above (step S55). Incidentally, when the constraint conditions are set each time, data of the constraint conditions is obtained each time to use the data at the step S55. Then, the constraint condition reflection unit 242 calculates M=M−diag ($V_{underbar}$)+diag ($V_{topbar}$) (step S57), and calculates b=b+$W_{underbar}$−$W_{topbar}$ (step S59). Thus, the constraint conditions are reflected to M and b. After that, the processing shifts to the step S61.

When the constraint conditions are invalid or after the step S59, the simultaneous equation computing unit 241 solves the simultaneous linear equations MU=b by the well-known direct method to derive the solution U, and stores the solution U into the U storage unit 243 (step S61). The method itself is the same as the conventional one, but the used matrix and vector are completely different.

Figure 11:
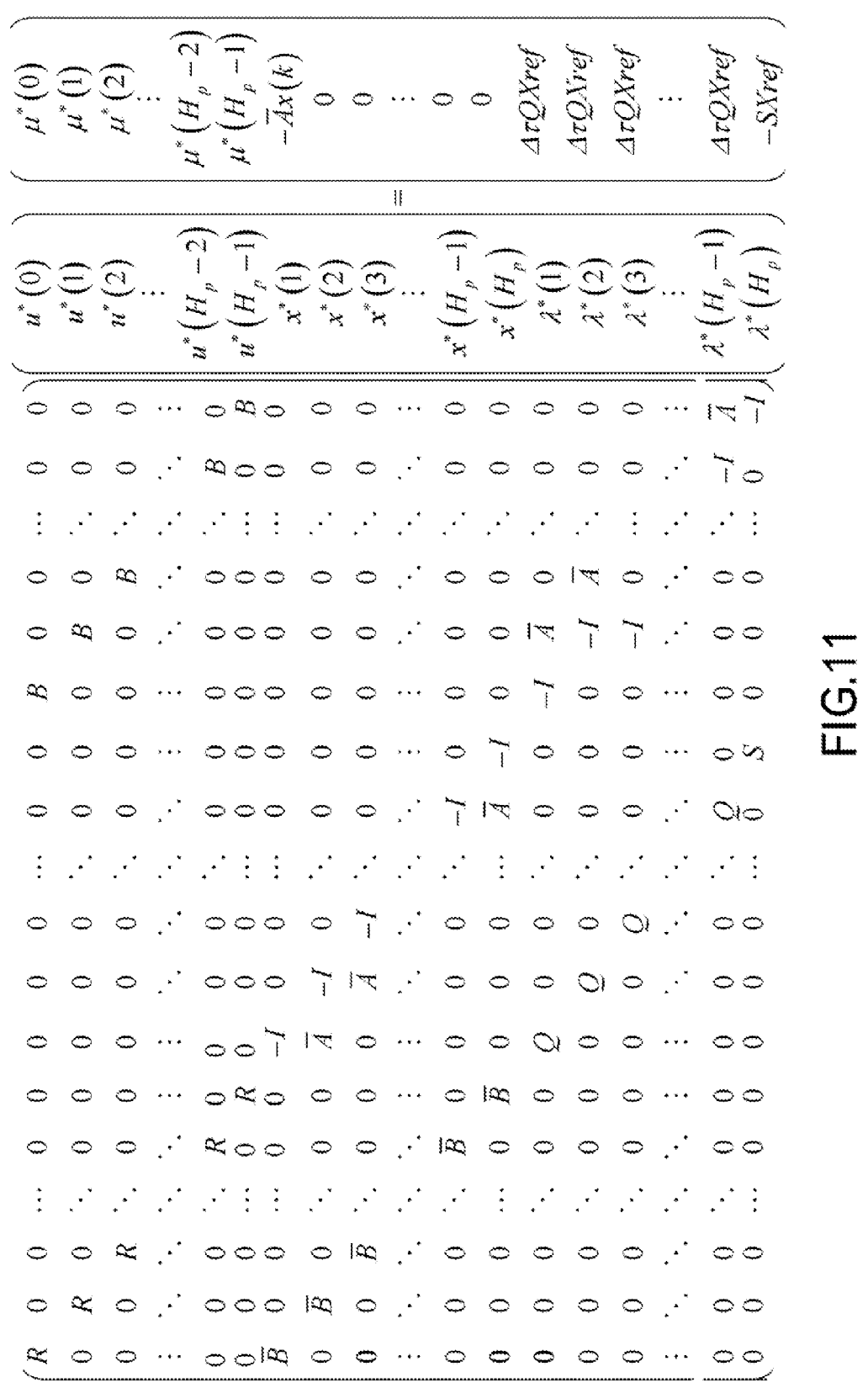

Namely, when the off-line matrix generation processing in this embodiment is not carried out, the matrix as illustrated in FIG. 11 is used. Specifically, the left side includes a product of a coefficient matrix including the coefficient matrices $A_{bar}$ and $B_{bar}$ ($A_{bar}$=I+ΔτA, $B_{bar}$=I+ΔτB) and components of the weight matrices S, Q and R of the performance index V, and a vector including the (the predictive horizon Hp*the number of inputs m) optimal inputs u*(i), the (the predictive horizon Hp*the number of outputs n) optimal outputs x*(i) and the (the predictive horizon Hp*the number of outputs n) optimal Lagrange multipliers λ*(i). On the other hand, the right side is a vector including ((the predictive horizon Hp*(the number of inputs m)*(the number of outputs n)) optimal Lagrange multipliers μ*(i), components of x(k), which is unresolved when the off-line matrix generation processing is carried out, and target values Xref.

Figures 12, 14:
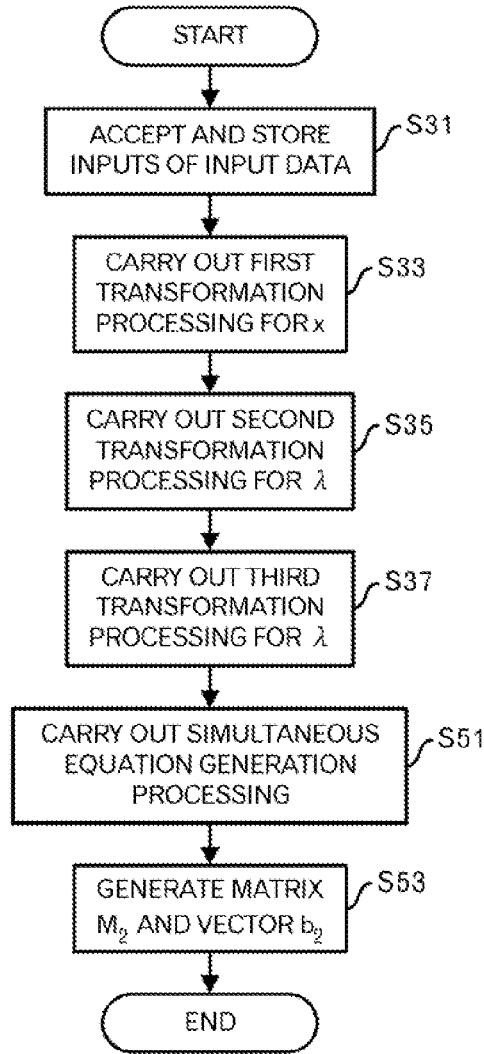
FIG. 12 is a diagram depicting a state of the simultaneous equations after the off-line matrix generation processing.
FIG. 14 is a diagram depicting a processing flow of a third off-line matrix generation processing.

Then, by carrying out the off-line matrix generation processing, elements to be considered are limited to the inputs u*(i) by transforming the optimal output states x*(i) and the optimal Lagrange multipliers λ*(i) into the expressions of the optimal inputs u*(i) and carrying out the substitution. Then, as for the optimal inputs u*, the optimal inputs u*(Hc) to u*(Hp−1) are excluded to reduce the number of elements to be resolved. After the aforementioned off-line matrix generation processing is carried out, the vector b as illustrated in FIG. 12 is obtained. Namely, the vector U in MU=b includes only (control horizon Hc) optimal inputs u*(i) as components. In addition, the function vector b is a function of the target values Xref and x(k), and includes Hc elements. The coefficient matrix M is a coefficient matrix to secure the equivalence with the equations before the off-line matrix generation processing, in a form of MU=b.

Even if there are constraint conditions, when the values of the constraint conditions and the values of the calculation results U*(i−1) obtained one sampling time before are set, the constraint conditions can be treated as constant values. Therefore, the shapes of the matrix and vector are the same.

Therefore, even when the same method to solve the simultaneous linear equations is used, the simultaneous linear equations in a completely different form are solved in this embodiment. Therefore, it is possible to largely reduce the processing load.

After that, the second model predictive controller 240 extracts the optimal input values u* from the solution U, and outputs the extracted values to the plant 230 (step S63). The optimal input values u* is a component u*(0) in the solution U. Then, the aforementioned processing is carried out until the processing is completed (step S65).

By carrying out the aforementioned processing, it becomes possible to obtain the optimal input values u* at high speed in this online processing. Incidentally, the target values Uref of the EGR valve opening degree and VNT nozzle opening degree, which are outputted from the planning unit 210, are added to u*, and the addition results are outputted to the plant 230.

Here, in addition to the settings of the aforementioned example 1, a case is considered that the following constraint conditions are additionally set.

$$\begin{cases} -5 < u_1 < 5 \\ -1 < u_2 < 2 \end{cases} \quad (67)$$

Then, the following simultaneous linear equations are obtained.

$$\left( \begin{pmatrix} 15104407 & -7896441 & 36811445 & -2080975 \\ -7896441 & 4129752 & -1920890 & 1086695 \\ 3119909 & -1628889 & 765368 & -4315542 \\ -1721304 & 899259 & -420937 & 237638 \end{pmatrix} - \right.$$

$$\left. \begin{pmatrix} \underline{v}_1(0) & 0 & 0 & 0 \\ 0 & \underline{v}_2(0) & 0 & 0 \\ 0 & 0 & \underline{v}_1(1) & 0 \\ 0 & 0 & 0 & \underline{v}_2(1) \end{pmatrix} + \begin{pmatrix} \overline{v}_1(0) & 0 & 0 & 0 \\ 0 & \overline{v}_2(0) & 0 & 0 \\ 0 & 0 & \overline{v}_1(1) & 0 \\ 0 & 0 & 0 & \overline{v}_2(1) \end{pmatrix} \right) =$$

$$\left( \begin{pmatrix} 53760 - 623835 x_1(k) - 6454848 x_2(k) \\ -28110 + 335845 x_1(k) + 3376413 x_2(k) \\ 11120 - 115403 x_1(k) - 1330685 x_2(k) \\ -6120 + 67233 x_1(k) + 734850 x_2(k) \end{pmatrix} + \right.$$

$$\left. \begin{pmatrix} \underline{w}_1(0) \\ \underline{w}_2(0) \\ \underline{w}_1(1) \\ \underline{w}_2(1) \end{pmatrix} - \begin{pmatrix} \overline{w}_1(0) \\ \overline{w}_2(0) \\ \overline{w}_1(1) \\ \overline{w}_2(1) \end{pmatrix} \right)$$

$$\underline{v}_1(0) = -\frac{1}{4(\tilde{u}_1^*(1) + 5)^{3/2}}$$

$$\underline{v}_2(0) = -\frac{1}{4(\tilde{u}_2^*(1) + 1)^{3/2}}$$

$$\underline{v}_1(1) = -\frac{1}{4(\tilde{u}_1^*(2) + 5)^{3/2}}$$

$$\underline{v}_2(1) = -\frac{1}{4(\tilde{u}_2^*(2) + 1)^{3/2}}$$

-continued $$w_1(0) = \frac{1}{2\sqrt{\tilde{u}_1^*(1)+5}} + \frac{\tilde{u}_1^*(1)}{4(\tilde{u}_1^*(1)+5)^{3/2}}$$

$$w_2(0) = \frac{1}{2\sqrt{\tilde{u}_2^*(1)+1}} + \frac{\tilde{u}_1^*(1)}{4(\tilde{u}_2^*(1)+1)^{3/2}}$$

$$w_1(1) = \frac{1}{2\sqrt{\tilde{u}_1^*(2)+5}} + \frac{\tilde{u}_1^*(2)}{4(\tilde{u}_1^*(2)+5)^{3/2}}$$

$$w_2(1) = \frac{1}{2\sqrt{\tilde{u}_2^*(2)+1}} + \frac{\tilde{u}_1^*(2)}{4(\tilde{u}_2^*(2)+1)^{3/2}}$$

$$\bar{v}_1(0) = \frac{1}{4(5-\tilde{u}_1^*(1))^{3/2}}$$

$$\bar{v}_2(0) = \frac{1}{4(2-\tilde{u}_2^*(1))^{3/2}}$$

$$\bar{v}_1(1) = \frac{1}{4(5-\tilde{u}_1^*(2))^{2/3}}$$

$$\bar{v}_2(1) = \frac{1}{4(2-\tilde{u}_2^*(2))^{3/2}}$$

$$\bar{w}_1(0) = -\frac{1}{2\sqrt{5-\tilde{u}_1^*(1)}} - \frac{\tilde{u}_1^*(1)}{4(5-\tilde{u}_1^*(1))^{3/2}}$$

$$\bar{w}_2(0) = -\frac{1}{2\sqrt{2-\tilde{u}_2^*(1)}} - \frac{\tilde{u}_1^*(1)}{4(2-\tilde{u}_2^*(1))^{3/2}}$$

$$\bar{w}_1(1) = -\frac{1}{2\sqrt{5-\tilde{u}_1^*(2)}} - \frac{\tilde{u}_1^*(2)}{4(5-\tilde{u}_1^*(2))^{3/2}}$$

$$\bar{w}_2(1) = -\frac{1}{2\sqrt{2-\tilde{u}_2^*(2)}} - \frac{\tilde{u}_1^*(2)}{4(2-\tilde{u}_2^*(2))^{3/2}}$$

As described above, by simplifying the problem to be solved using the algebraic method in the off-line processing to reduce the calculation amount in the online processing, the direct method for the simultaneous equations is adopted for the linear model predictive control. Then, it is possible to calculate the solution at high speed so that this embodiment is effective to the mechanical system having high-speed dynamics, and to stably obtain the solution. Furthermore, even if the dimension of the states x(k) of the plant increases, it becomes possible to suppress the increase of the calculation amount. Therefore, it becomes possible to carry out the real-time control for the plant.

In addition, the linear approximation is limited only to the portion that the constraint conditions are considered, and the deterioration of the accuracy is also suppressed as much as possible.

Incidentally, in case where the expressions (53-1) and (53-2) and expressions (60) and (61) are obtained, when these expressions are substituted into the expression (10) (in case of the 2-input and 2-output system, the expressions (19) and (20)), the terms μ*(i) are eliminated. Then, it is possible to further substitute the expression (41) into the expressions obtained after the aforementioned transformation.

Figure 13:
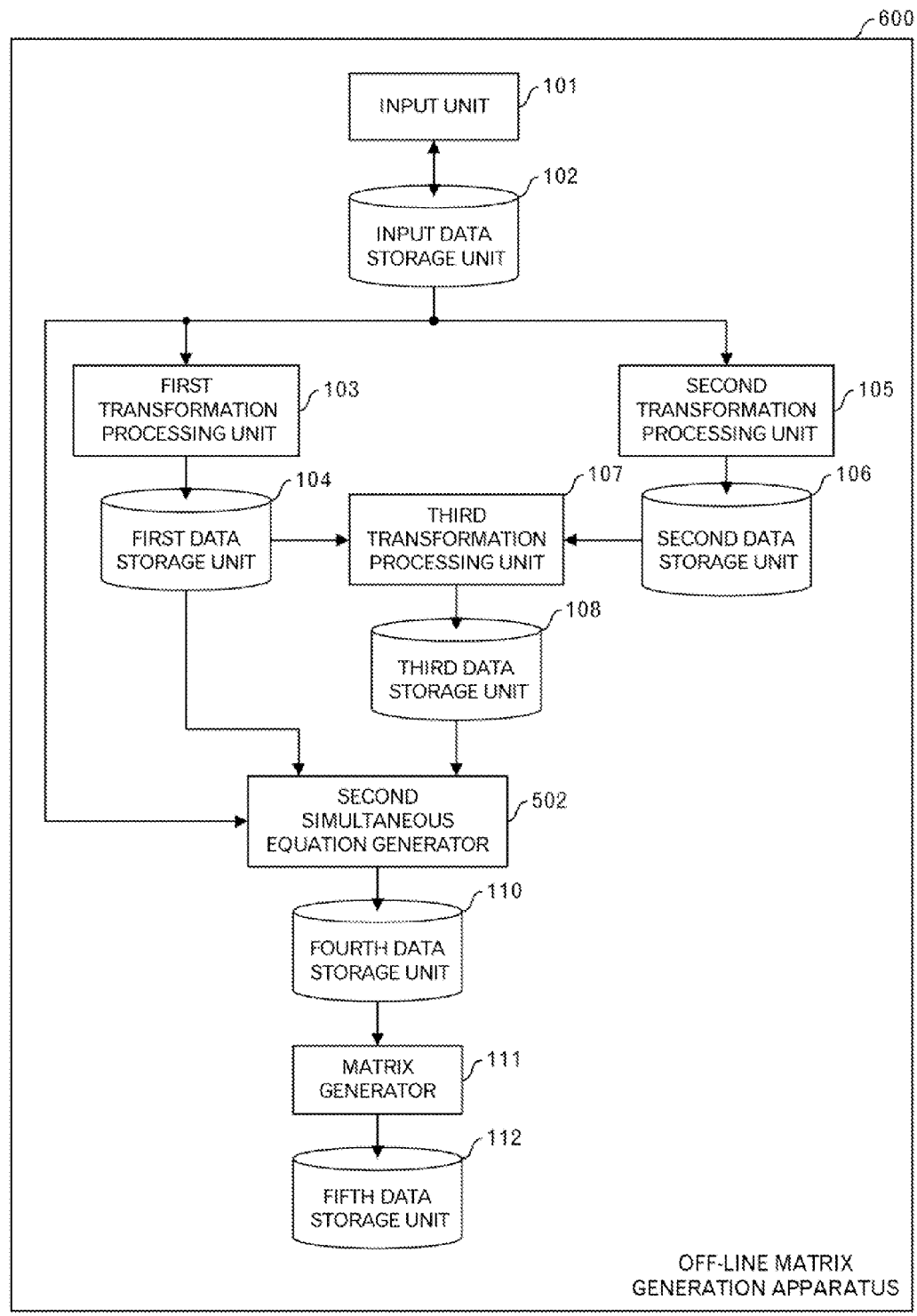
FIG. 13 is a functional block diagram of a third off-line matrix generation apparatus.

Specifically, an off-line matrix generation apparatus 600 as illustrated in FIG. 13 is introduced. The difference with FIG. 7 is as follows: a point that the fourth transformation processing unit 501 is removed, a point that a second simultaneous equation generator 502 is introduced instead of the simultaneous equation generator 109, and a point that the second simultaneous equation generator 502 uses data stored in the input data storage unit 102. Moreover, the expressions (53-1) and (53-2) and expressions (60) and (61) are stored in the input data storage unit 102.

Then, as illustrated in FIG. 14, the steps S31 to S37 in the processing flow are the same. After the step S37, the second simultaneous equation generator 502 generates the simultaneous equations by carrying out the aforementioned substitution processing, and stores data of the generated simultaneous equations into the fourth data storage unit 110 (step S51).

After that, the matrix generator 111 generates the matrix $M_2$ and vector $b_2$ in $M_2 U=b$ by using data stored in the fourth data storage unit 110, and stores the generated matrix and vector into the fifth data storage unit 112 (step S53). This step is basically the same as the step S11. Therefore, the detailed explanation is omitted. However, because the terms that are not constants are included in the expressions (53-1) and (53-2) and expressions (60) and (61), the contents of the matrix $M_2$ and $b_2$ are different from those of the matrix M and vector b.

[Embodiment 2]

In this embodiment, the explanation is made for the 2-input and 2-output system. However, this embodiment can be applied to the m-input and n-output system by the similar method.

When the performance index V described in the first embodiment is digitized from the prediction section $H_p$ and control section $H_c$, the performance index is represented as follows:

$$J = \sum_{i=1}^{H_p-1} \{(Xref - x^*(i))^T Q(Xref - x^*(i))\} +$$

$$(Xref - x^*(H_p))^T S(Xref - x^*(H_p)) +$$

$$\sum_{i=0}^{H_p-1} \{u^*(i)^T R u^*(i)\} - \sum_{i=0}^{H_p-1} (\bar{p}^T u_\alpha + \underline{p}^T u_\beta)$$

However, $u^*(H_c) = u^*(H_c+1) = \ldots = u^*(H_p-1)$.

Moreover, the weight matrix is defined as follows:

$$Q = \begin{pmatrix} q_1 & 0 \\ 0 & q_2 \end{pmatrix},$$

$$R = \begin{pmatrix} r_1 & 0 \\ 0 & r_2 \end{pmatrix},$$

$$S = \begin{pmatrix} s_1 & 0 \\ 0 & s_2 \end{pmatrix},$$

$$x^*(i) = \begin{pmatrix} x_1^*(i) \\ x_2^*(i) \end{pmatrix},$$

$$u^*(i) = \begin{pmatrix} u_1^*(i) \\ u_2^*(i) \end{pmatrix},$$

$$Xref = \begin{pmatrix} Xref_1 \\ Xref_2 \end{pmatrix}$$

The optimization problem that minimizes the digitized performance index J returns to the problem to solve the following simultaneous equations.

$$\begin{cases} \dfrac{\partial J}{\partial u_1^*(0)} = 0 & (68) \\ \dfrac{\partial J}{\partial u_2^*(0)} = 0 & (69) \\ \dfrac{\partial J}{\partial u_1^*(1)} = 0 & (70) \\ \quad \vdots \\ \dfrac{\partial J}{\partial u_2^*(H_c-1)} = 0 & (71) \end{cases}$$

On the other hand, the digitized performance index J is written down as follows:

$$J = \begin{aligned} &q_1(Xref_1 - x_1^*(1))^2 + q_1(Xref_1 - x_1^*(2))^2 + \ldots + \\ &q_1(Xref_1 - x_1^*(Hp-1))^2 + \\ &q_2(Xref_2 - x_2^*(1))^2 + q_2(Xref_2 - x_2^*(2))^2 + \ldots + \\ &q_2(Xref_2 - x_2^*(Hp-1))^2 + \\ &s_1(Xref_1 - x_1^*(Hp))^2 + s_2(Xref_2 - x_2^*(Hp))^2 + \\ &r_1 u_1^*(0)^2 + r_1 u_1^*(1)^2 + \ldots + r_1 u_1^*(Hc-2)^2 + \\ &(Hp - Hc + 1) r_1 u_1^*(Hc-1)^2 + \\ &r_2 u_2^*(0)^2 + r_2 u_2^*(1)^2 + \ldots + r_2 u_2^*(Hc-2)^2 + \\ &(Hp - Hc + 1) r_2 u_2^*(Hc-1)^2 - \\ &\sum_{i=0}^{Hp-1} (\bar{p}^T u_\alpha + \underline{p}^T u_\beta) \end{aligned}$$

Here, the performance index J is considered, separately in a form as follows:

$$J = \begin{aligned} &\overbrace{\begin{aligned} &q_1(Xref_1 - x_1^*(1))^2 + q_1(Xref_1 - x_1^*(2))^2 + \ldots + \\ &q_1(Xref_1 - x_1^*(Hp-1))^2 + \\ &q_2(Xref_2 - x_2^*(1))^2 + q_2(Xref_2 - x_2^*(2))^2 + \ldots + \\ &q_2(Xref_2 - x_2^*(Hp-1))^2 + \\ &s_1(Xref_1 - x_1^*(Hp))^2 + s_2(Xref_2 - x_2^*(Hp))^2 + \end{aligned}}^{J1} \\ &\overbrace{\begin{aligned} &r_1 u_1^*(0)^2 + r_1 u_1^*(1)^2 + \ldots + r_1 u_1^*(Hc-2)^2 + \\ &(Hp - Hc + 1) r_1 u_1^*(Hc-1)^2 + \\ &r_2 u_2^*(0)^2 + r_2 u_2^*(1)^2 + \ldots + r_2 u_2^*(Hc-2)^2 + \\ &(Hp - Hc + 1) r_2 u_2^*(Hc-1)^2 \end{aligned}}^{J2} - \\ &\overbrace{\sum_{i=0}^{Hp-1} (\bar{p}^T u_\alpha + \underline{p}^T u_\beta)}^{CONS} \end{aligned}$$

Namely, J=J1+J2+CONS is held, and CONS is a term for the constraint conditions. When there are no constraint conditions, CONS is treated as being 0, and when CONS is not 0, CONS can be processed similarly to the first embodiment. Therefore, a method for processing J'=J1+J2 is considered. Then, the expressions (68) to (71) can be obtained by carrying out the following calculation.

$$\dfrac{\partial J1}{\partial u_1^*(0)}, \ldots, \dfrac{\partial J1}{\partial u_1^*(Hc-1)}$$

$$\dfrac{\partial J1}{\partial u_2^*(0)}, \ldots, \dfrac{\partial J1}{\partial u_2^*(Hc-1)}$$

$$\dfrac{\partial J2}{\partial u_1^*(0)}, \ldots, \dfrac{\partial J2}{\partial u_1^*(Hc-1)}$$

$$\dfrac{\partial J2}{\partial u_2^*(0)}, \ldots, \dfrac{\partial J2}{\partial u_2^*(Hc-1)}$$

Here, as depicted in the expression (37), $x_1^*(i)$ and $x_2^*(i)$ are represented as a linear expression of $u_1^*(0)$, $u_2^*(0)$, ..., $u_1^*(H_c-1)$ and $u_2^*(H_c-1)$. Therefore, $\partial J1/\partial u_1^*(0)$ is represented as follows:

$$\begin{aligned} \dfrac{\partial J1}{\partial u_1^*(0)} = &-2q_1(Xref_1 - x_1^*(0))(\text{coefficient of } u_1^*(0) \text{ in } x_1^*(0)) - \\ &2q_1(Xref_1 - x_1^*(1))(\text{coefficient of } u_1^*(0) \text{ in } x_1^*(1)) - \ldots - \\ &2q_1(Xref_1 - x_1^*(Hp-1))(\text{coefficient of } u_1^*(0) \text{ in } x_1^*(Hp-1)) - \\ &2q_2(Xref_2 - x_2^*(0))(\text{coefficient of } u_1^*(0) \text{ in } x_2^*(0)) - \\ &2q_2(Xref_2 - x_2^*(1))(\text{coefficient of } u_1^*(0) \text{ in } x_2^*(1)) - \ldots - \\ &2q_2(Xref_2 - x_2^*(Hp-1))(\text{coefficient of } u_1^*(0) \text{ in } x_2^*(Hp-1)) - \\ &2s_1(Xref_1 - x_1^*(Hp))(\text{coefficient of } u_1^*(0) \text{ in } x_1^*(Hp)) - \\ &2s_2(Xref_2 - x_2^*(Hp))(\text{coefficient of } u_1^*(0) \text{ in } x_2^*(Hp)) \end{aligned} \quad (72)$$

When writing down as described above, it is possible to obtain a specific expression of the expression (68) by substituting $x_1^*(i)$ and $x_2^*(i)$ and a coefficient of $u_1^*(0)$ in $x_1^*(0)$ and the like into the expression (72). It is possible to transform expressions other than the expression (68) among the expressions (68) to (71) into a similar form, and by similarly substituting the expressions and coefficients, the specific expressions can be obtained. Namely, the expression like the expression (72) is prepared in advance for each of the expressions (68) to (71).

Then, the expressions after the substitution are arranged into the linear expressions of $u_1^*(0)$, $u_2^*(0)$, ..., $u_{1*}(H_c-1)$ and $u_2^*(H_c-1)$. Then, the following expressions are obtained.

$$\dfrac{\partial J1}{\partial u_1^*(0)} = m_{1,1} u_1^*(0) + m_{1,2} u_2^*(0) + m_{1,2} u_1^*(1) + \ldots + \\ m_{1,2Hc} u_2^*(Hc-1) + b_1(Xref, x(k)) \quad (73)$$

$$\dfrac{\partial J1}{\partial u_2^*(0)} = m_{2,1} u_1^*(0) + m_{2,2} u_2^*(0) + m_{2,2} u_1^*(1) + \ldots + \\ m_{2,2Hc} u_2^*(Hc-1) + b_2(Xref, x(k)) \quad (74)$$

$$\vdots$$

$$\dfrac{\partial J1}{\partial u_2^*(Hc-1)} = m_{2Hc,1} u_1^*(0) + m_{2Hc,2} u_2^*(0) + m_{2Hc,2} u_1^*(1) + \ldots + \\ m_{2Hc,2Hc} u_2^*(Hc-1) + b_{2Hc}(Xref, x(k)) \quad (75)$$

Incidentally, $b_1$ (Xref, x(k)) or the like is a constant term in a form of the linear expression of the target value Xref, initial state $x_1(k)$ and $x_2(k)$ (i.e. the constant term in case of viewing, as variables, $u_1^*(0)$, $u_2^*(0)$, ..., $u_1^*(H_c-1)$ and $u_2^*(H_c-1)$).

Figure 15:
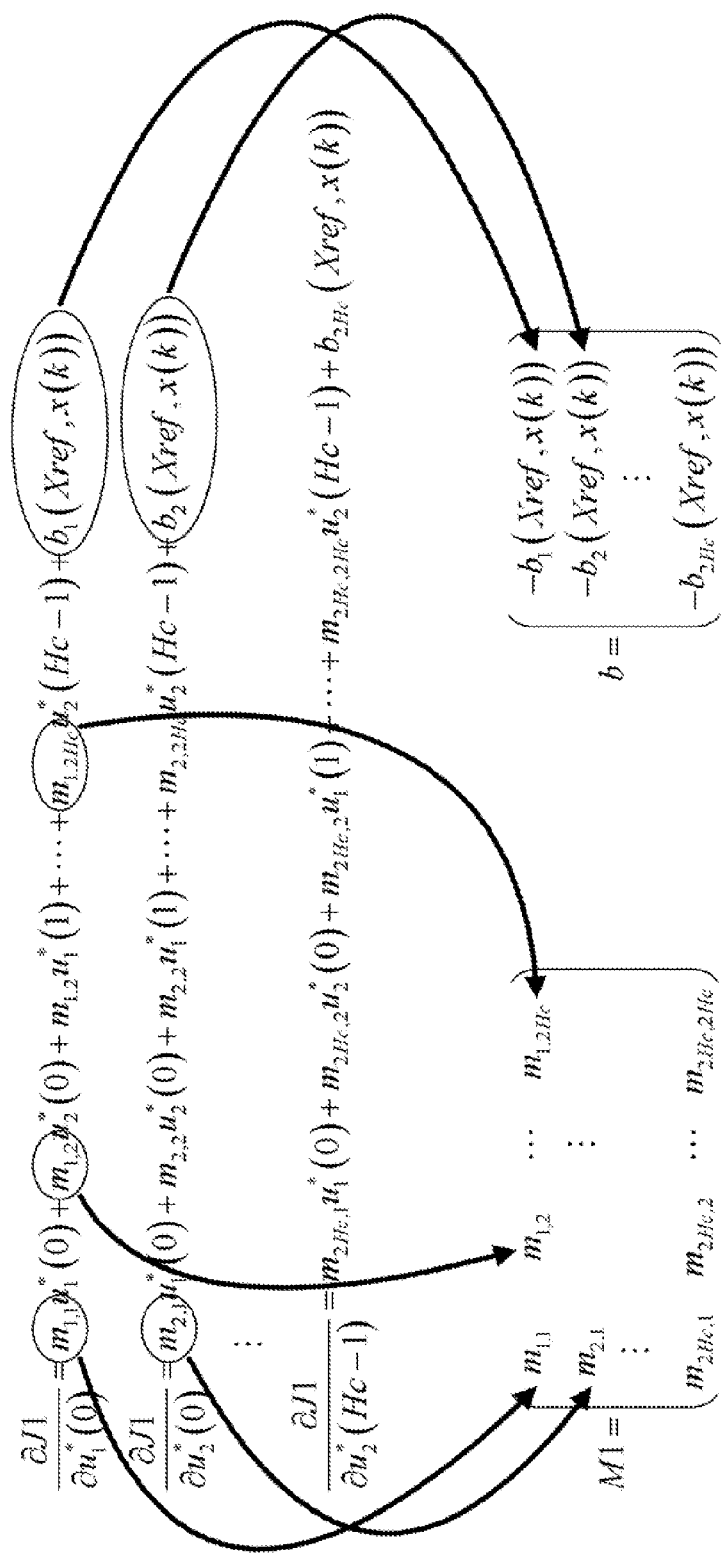
FIG. 15 is a schematically diagram to explain the generation of a matrix M1 and vector b.

Then, as illustrated in FIG. 15, a matrix M1 is generated by extracting and arranging coefficients of $u_1^*(0)$, $u_2^*(0)$, ..., $u_1^*(H_c-1)$ and $u_2^*(H_c-1)$. Furthermore, the b vector is generated by extracting terms other than terms of $u_1^*(0)$, $u_2^*(0)$, ..., $u_1^*(H_c-1)$ and $u_2^*(H_c-1)$, and arranging them after reversing the signs of them.

In addition, when the partial differentiation of J2 is calculated with respect to each of $u_1^*(0), u_2^*(0), \ldots, u_1^*(H_c-1)$ and $u_2^*(H_c-1)$, the results are obtained as follows:

$$\frac{\partial J2}{\partial u_1^*(0)} = 2r_1 \tag{76}$$

$$\frac{\partial J2}{\partial u_2^*(0)} = 2r_2 \tag{77}$$

$$\vdots$$

$$\frac{\partial J2}{\partial u_1^*(Hc-2)} = 2r_1 \tag{78}$$

$$\frac{\partial J2}{\partial u_2^*(Hc-2)} = 2r_2 \tag{79}$$

$$\frac{\partial J2}{\partial u_1^*(Hc-1)} = 2(Hp-Hc+1)r_1 \tag{80}$$

$$\frac{\partial J2}{\partial u_2^*(Hc-1)} = 2(Hp-Hc+1)r_2 \tag{81}$$

Thus, when the weight matrix R, the predictive section $H_p$ and control section $H_c$ are prepared, the values can be obtained. Therefore, the following matrix M2 are prepared in advance, and by setting the weight matrix R, predictive section $H_p$ and control section $H_c$, the matrix M2 can be obtained. However, in this embodiment, because the expressions (72) and the like are prepared after the $H_p$ and $H_c$ were determined in advance, it is assumed that $H_c$ and $H_p$ have been set into the matrix M2.

$$M2 = \begin{pmatrix} 2r_1 & & & & & \\ & 2r_2 & & & 0 & \\ & & \ddots & & & \\ & & & 2r_1 & & \\ & & & & 2r_2 & \\ & 0 & & & & 2(Hp-Hc+1)r_1 \\ & & & & & & 2(Hp-Hc+1)r_2 \end{pmatrix} \tag{82}$$

Then, M=M1+M2 is executed by using M1 obtained as described above and M2. As a result, M and b to calculate the same solution as the processing result in the first embodiment can be obtained. The constraint conditions can be treated similarly to the first embodiment.

For example, it is assumed that the following matrices and the like are set.

$$A = \begin{pmatrix} 2 & 1 \\ -1 & 3 \end{pmatrix},$$

$$B = \begin{pmatrix} -1 & 1 \\ -10 & 5 \end{pmatrix},$$

$$S = Q = \begin{pmatrix} 100 & 0 \\ 0 & 1 \end{pmatrix},$$

$$R = \begin{pmatrix} 1 & 0 \\ 0 & 1 \end{pmatrix},$$

$$Hp = 4, Hc = 2$$

Then, it is assumed that the following linear expressions are obtained as the expressions (37).

$$x_1^*(1) = -u_1^*(0) + u_2^*(0) + 2x_1(k) + x_2(k) \tag{83}$$

$$x_2^*(1) = -10u_1^*(0) + 5u_2^*(0) - x_1(k) + 3x_2(k) \tag{84}$$

$$x_1^*(2) = -12u_1^*(0) + 7u_2^*(0) - u_1^*(1) + u_2^*(2) + 3x_1(k) + 5x_2(k) \tag{85}$$

$$x_2^*(2) = -29u_1^*(0) + 17u_2^*(0) - 10u_1^*(1) + 5u_2^*(2) - 5x_1(k) + 8x_2(k) \tag{86}$$

$$x_1^*(3) = -53u_1^*(0) + 28u_2^*(0) - 13u_1^*(1) + 8u_2^*(2) - x_1(k) + 18x_2(k) \tag{87}$$

$$x_2^*(3) = -75u_1^*(0) + 35u_2^*(0) - 39u_1^*(1) + 19u_2^*(2) - 18x_1(k) + 19x_2(k) \tag{88}$$

$$x_1^*(4) = -181u_1^*(0) + 91u_2^*(0) - 66u_1^*(1) + 36u_2^*(2) - 16x_1(k) + 55x_2(k) \tag{89}$$

$$x_2^*(4) = -172u_1^*(0) + 77u_2^*(0) - 114u_1^*(1) + 54u_2^*(2) - 55x_1(k) + 39x_2(k) \tag{90}$$

Then, when the expressions (83) to (90) and coefficients of $u_j^*(i)$ are substituted into the expressions (72) and the like, the following expressions can be obtained.

$$\frac{\partial J1}{\partial u_1^*(0)} = 7215300u_1^*(0) - 3640650u_2^*(0) + 2575046u_1^*(1) - 1412116u_2^*(1) + 582930x_1(k) - 2210790x_2(k) + 55120 \tag{91}$$

$$\frac{\partial J1}{\partial u_2^*(0)} = -3640650u_1^*(0) + 1837750u_2^*(0) - 1295966u_1^*(1) + 711186u_2^*(1) - 290880x_1(k) + 1116590x_2(k) - 28020 \tag{92}$$

$$\frac{\partial J1}{\partial u_1^*(1)} = 2575046u_1^*(0) - 1295966u_2^*(0) + 934434u_1^*(1) - 510094u_2^*(1) + 222044x_1(k) - 784334x_2(k) + 19260 \tag{93}$$

$$\frac{\partial J1}{\partial u_2^*(1)} = -1412116u_1^*(0) + 711186u_2^*(0) - 510094u_1^*(1) + 278804u_2^*(1) - 119674x_1(k) + 430814x_2(k) - 10560 \tag{94}$$

When the coefficients of $u_1^*(0), u_2^*(0), u_1^*(1)$ and $u_2^*(1)$ are extracted from the expressions (91) to (94), the following matrix M1 can be obtained.

$$M1 = \begin{pmatrix} 7215300 & -3640650 & 2575046 & -1412116 \\ -3640650 & 1837750 & -1295966 & 711186 \\ 2575046 & -1295966 & 934434 & -510094 \\ -1412116 & 711186 & -510094 & 278804 \end{pmatrix}$$

Furthermore, when the terms other than the terms of $u_1^*(0), u_2^*(0), u_1^*(1)$ and $u_2^*(1)$ are extracted and their signs are reversed, the following vector b can be obtained.

$$b = \begin{pmatrix} -582930x_1(k) + 2210790x_2(k) - 55120 \\ 290880x_1(k) - 1116590x_2(k) + 28020 \\ -222044x_1(k) + 784334x_2(k) - 19260 \\ 119674x_1(k) - 430814x_2(k) + 10560 \end{pmatrix}$$

In addition, when the element values of the matrix R and $H_c$ and $H_p$ are substituted into the matrix M2, the following matrix can be obtained.

$$M2 = \begin{pmatrix} 2 & 0 & 0 & 0 \\ 0 & 2 & 0 & 0 \\ 0 & 0 & 6 & 0 \\ 0 & 0 & 0 & 6 \end{pmatrix}$$

Then, the following matrix M can be obtained.

$$M = M1 + M2 = \begin{pmatrix} 7215302 & -3640650 & 2575046 & -1412116 \\ -3640650 & 1837752 & -1295966 & 711186 \\ 2575046 & -1295966 & 934440 & -510094 \\ -1412116 & 711186 & -510094 & 278810 \end{pmatrix}$$

Thus, the calculation amount is reduced compared with the first embodiment, and the matrix M and vector b can be generated at high speed.

[Case where No Constraint Condition is Considered]

Figure 16:
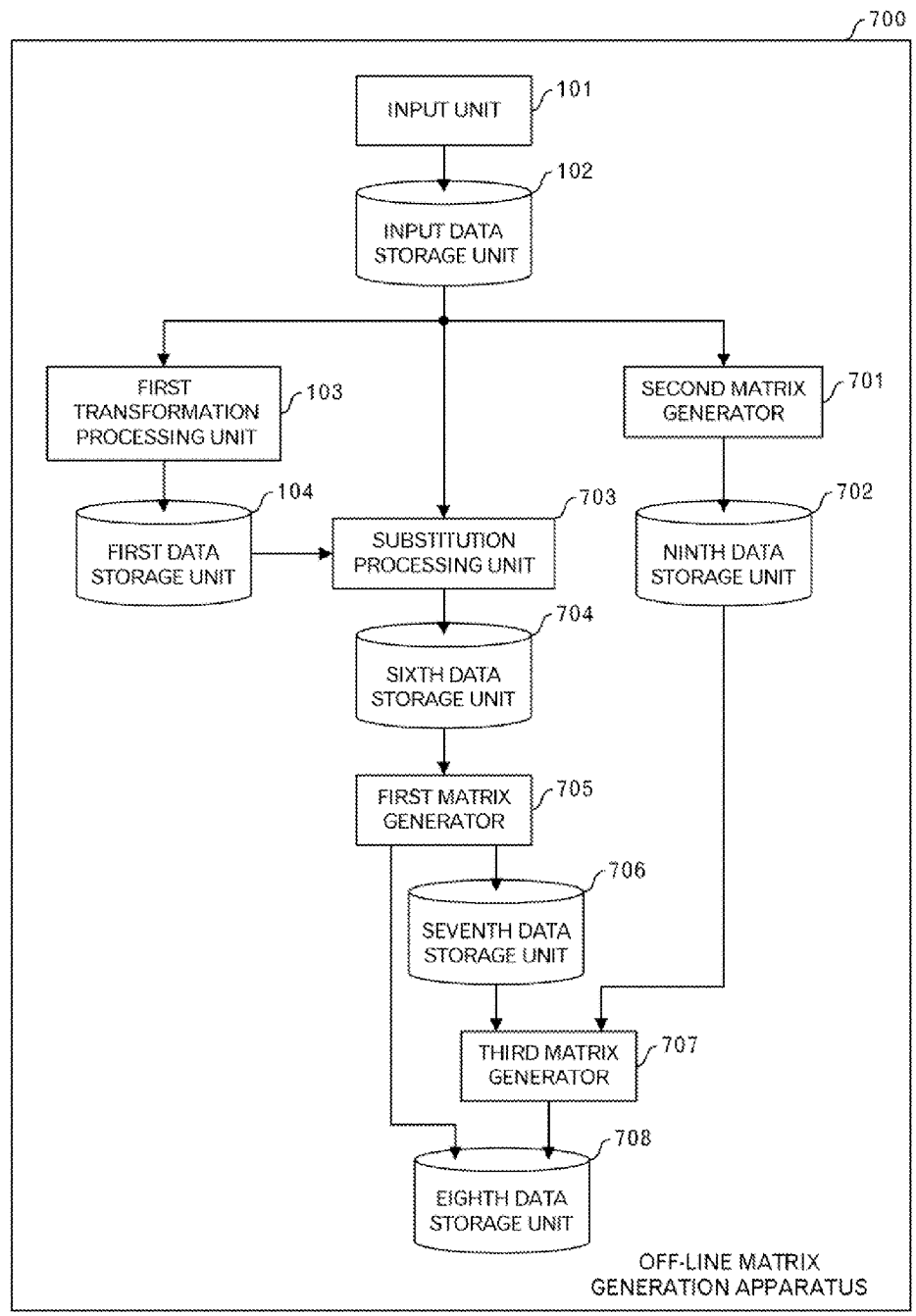
FIG. 16 is a functional block diagram of a first off-line matrix generation apparatus relating to a second embodiment.

Next, FIG. 16 illustrates a configuration example (without the constraint conditions) of an off-line matrix generation apparatus 700 to generate the aforementioned matrix M and vector b. The off-line matrix generation apparatus 700 has an input unit 101, input data storage unit 102, first transformation processing unit 103, first data storage unit 104, second matrix generator 701, ninth data storage unit 702, substitution processing unit 703, sixth data storage unit 704, first matrix generator 705, seventh data storage unit 706, third matrix generator 707, and eighth data storage unit 708. The input unit 101, input data storage unit 102, first transformation processing unit 103 and first data storage unit 104 are almost the same as the elements illustrated in the first embodiment.

The input unit 101 accepts inputs of the matrices A, B, S, Q and R, and Δτ, and stores them into the input data storage unit 102. The input data storage unit 102 also stores data representing the simultaneous equations to be solved in addition to those data and the expressions of the partial differentiations of the portion J1 in the performance index, such as the expression (72) and the like and data of the matrix M2. Data of the simultaneous equations to be solved (the expressions (8) and (9) and in case of the 2-input and 2-output system, the expressions (15) to (18)) may be inputted from the input unit 101. Moreover, the first transformation processing unit 103 carries out a first transformation processing by using data stored in the input data storage unit 102, and stores processing results into the first data storage unit 104. Incidentally, the input unit 101 or first transformation processing unit 103 may carry out a processing to substitute the element values of the matrices A and B and the like into the relating simultaneous equations.

The second matrix generator 701 generates the matrix M2 from data (i.e. data of the matrix M2 and weight matrix R) stored in the input data storage unit 102, and stores the generated matrix M2 into the ninth data storage unit 702. The substitution processing unit 703 carries out a processing to substitute the aforementioned expression (37) and its coefficients into the expressions (72) and the like by using data stored in the input data storage unit 102 and first data storage unit 104, and stores the processing results into the sixth data storage unit 704. In addition, the substitution processing unit 703 also carries out a processing to substitute the elements values of the matrices S and Q and the like into the expressions (72) and the like.

The first matrix generator 705 carries out a processing to generate the matrix M1 and vector b by using data stored in the sixth data storage unit 704, and stores the matrix M1 into the seventh data storage unit 706, and stores the vector b into the eighth data storage unit 708. The third matrix generator 707 adds the matrices M1 and M2 stored in the ninth data storage unit 702 and the seventh data storage unit 706, and stores the matrix M as the addition result into the eighth data storage unit 708. Thus, the matrix M and vector b are stored in the eighth data storage unit 708.

Figure 17:
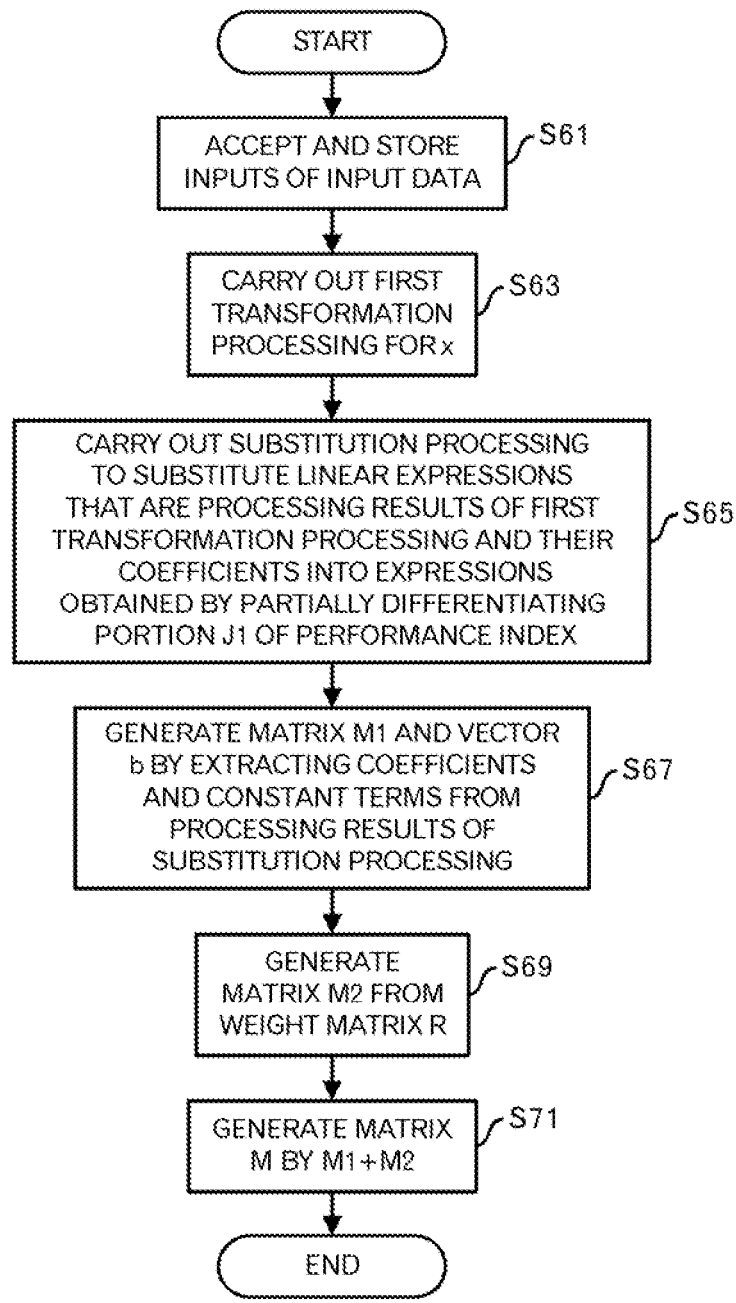
FIG. 17 is a diagram to depict a processing flow of a first off-line generation processing relating to the second embodiment.

Next, a processing flow of the off-line matrix generation apparatus 700 depicted in FIG. 16 is explained by using FIG. 17. First, the input unit 101 accepts inputs of the matrices A, B, S, Q and R, and Δτ, and stores the input data into the input data storage unit 102 (FIG. 17: step S61). Data of the simultaneous equations to be solved may be inputted from the input unit 101, and may be stored into the input data storage unit 102.

Then, the first transformation processing unit 103 carries out the first transformation processing for the optimal output state x*(i) by using data stored in the input data storage unit 102, and stores the linear expressions (i.e. the expressions (37)) as the processing results into the first data storage unit 104 (step S63). This step is the same as the step S3. Therefore, the detailed explanation is omitted. However, after data of the matrices A and B may be substituted at this step, the aforementioned processing is carried out.

Then, the substitution processing unit 703 reads out data of the matrices Q and S and data of the expressions (72) and the like (i.e. the partial differentiation expressions of the portion J1 in the performance index J) from the input data storage unit 102, reads out data of the linear expressions as the processing results of the first transformation processing from the first data storage unit 104, and carries out a processing to substitute element values of the matrices Q and S, the linear expressions as the processing results of the first transformation processing and its coefficients into the expressions (72) and the like to arrange the substitution results, and stores the processing results (the expressions (73) to (75)) into the sixth data storage unit 704 (step S65).

Furthermore, the first matrix generator 705 generates the matrix M1 by extracting coefficient values of $u_1^*(0)$, $u_2^*(0)$, ..., $u_1^*(H_c-1)$ and $U_2^*(H_c-1)$ from the processing results of the substitution processing, which is stored in the sixth data storage unit 704, and stores the matrix M1 into the seventh data storage unit 706, and further generates the vector b by extracting constant terms and reversing the signs of them, and stores the vector b into the eighth data storage unit 708 (step S67).

On the other hand, the second matrix generator 701 reads out the element values of the weight matrix R and the expressions of the matrix M2 (the expressions (82)) from the input data storage unit 102, and generates the matrix M2 by substituting the element values of the weight matrix R into the expressions of the matrix M2, and stores the generated matrix M2 into the ninth data storage unit 702 (step S69).

After that, the third matrix generator 707 generates the matrix M by adding the matrix M1 stored in the seventh data storage unit 706 and the matrix M2 stored in the ninth data storage unit 702, and stores the generated matrix M into the eighth data storage unit 708 (step S71).

By carrying out such a processing, the matrix M and vector b are generated, and will be processed in the engine control apparatus in FIG. 5.

[Case where the Constraint Condition is Considered]

Figure 18:
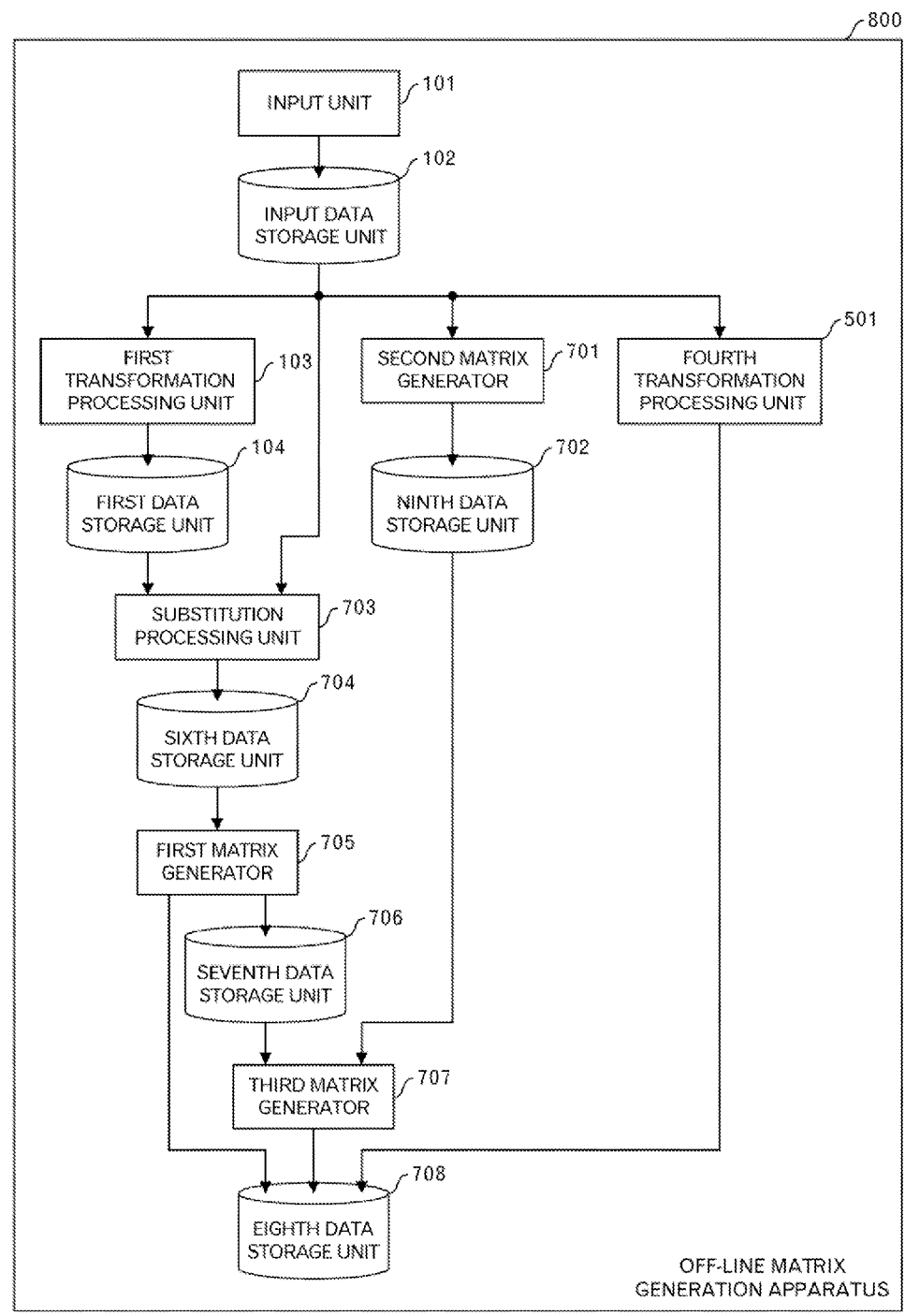
FIG. 18 is a functional block diagram of a second off-line matrix generation apparatus relating to the second embodiment.

In case where the constraint conditions are valid, an off-line matrix generation apparatus 800 as illustrated in FIG. 18 is used. The difference with the off-line matrix generation apparatus 700 illustrated in FIG. 16 is a point that the fourth transformation processing unit 501 introduced when the constraint conditions are considered in the first embodiment is introduced. Namely, the fourth transformation processing unit 501 generates $V_{topbar}$, $V_{underbar}$, $W_{topbar}$ and $W_{underbar}$ from data stored in the input data storage unit 102, and stores them into the eighth data storage unit 708.

Figure 19:
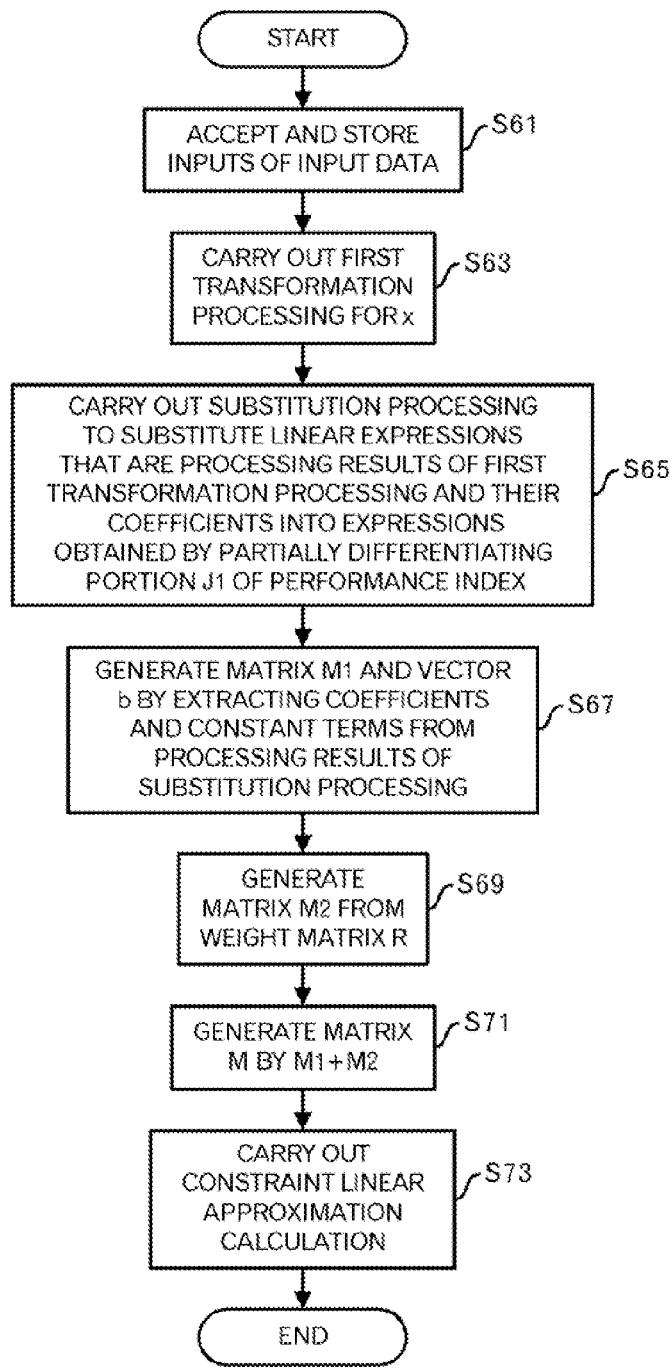
FIG. 19 is a diagram depicting a processing flow of a second off-line matrix generation processing relating to the second embodiment.

Therefore, as for a processing flow in case where the constraint conditions are considered, as illustrated in FIG. 19, a point that the step S73 that is a step to carry out the constraint linear approximation calculation executed by the fourth transformation processing unit 501 is added is different from FIG. 17. The step S73 is the same as the step S39 in FIG. 8, and the vectors represented by the expressions (63) to (66) are generated and stored into the eighth data storage unit 708.

By carrying out such a processing, the matrix M and vector b and $V_{topbar}$, $V_{underbar}$, $W_{topbar}$ and $W_{underbar}$ which relate to the constraint conditions, are generated, and they will be processed in the engine control apparatus in FIG. 9.

[Embodiment 3]

In the first and second embodiments, the matrix M and vector b are generated after embedding the element values of the weight matrices Q, R and S. Therefore, when it is determined whether or not the element values of the weight matrices is appropriate, by carrying out simulation instead of the actual engine control apparatus and it is determined that the element values of the weight matrices are not appropriate, the matrix M and vector b have to be regenerated and the simulation has to be carried out again. Thus, it takes a long time to generate appropriate matrix M and vector b. Then, by adopting the following measures, it is possible to avoid the repetition of the generating the matrix and vector, and only element values of the weight matrices only have to be changed in the simulation.

Specifically, a portion J' of the performance index J is divided as follows:

$$J' = \underbrace{\{q_1(Xref_1 - x_1^*(1))^2 + q_1(Xref_1 - x_1^*(2))^2 + \ldots + q_1(Xref_1 - x_1^*(Hp-1))^2\}}_{J3}$$
$$+ \underbrace{\{q_2(Xref_2 - x_2^*(1))^2 + q_2(Xref_2 - x_2^*(2))^2 + \ldots + q_2(Xref_2 - x_2^*(Hp-1))^2\}}_{J4}$$
$$\underbrace{+ \{s_1(Xref_1 - x_1^*(Hp))^2\}}_{J5} + \underbrace{\{s_2(Xref_2 - x_2^*(Hp))^2\}}_{J6}$$
$$+ \underbrace{\begin{Bmatrix} r_1u_1^*(0)^2 + r_1u_1^*(1)^2 + \ldots + r_1u_1^*(Hc-2)^2 + (Hp-Hc+1)r_1u_1^*(Hc-1)^2 \\ + r_2u_2^*(0)^2 + r_2u_2^*(1)^2 + \ldots + r_2u_2^*(Hc-2)^2 + (Hp-Hc+1)r_2u_2^*(Hc-1)^2 \end{Bmatrix}}_{J2}$$

Namely, the terms in J1 are grouped for each element of the weight matrices, basically. Specifically, J3 includes terms to which the element $q_1$ of the weight matrix Q is multiplied, J4 includes terms to which the element $q_2$ of the weight matrix Q is multiplied, J5 includes terms to which the element $s_1$ of the weight matrix S is multiplied, and J6 includes terms to which the element $s_2$ of the weight matrix S is multiplied. Even in case of a system other than the 2-input and 2-output system, the division is similarly carried out. Incidentally, J2 is treated similarly to the second embodiment. In addition, the constraint conditions are also treated similarly to the second embodiment.

Therefore, the minimizing the performance index J is divided into calculating the following partial differentiations, similarly to the second embodiment.

$$\frac{\partial J3}{\partial u_1^*(0)}, \ldots, \frac{\partial J3}{\partial u_2^*(Hc-1)}$$
$$\frac{\partial J4}{\partial u_1^*(0)}, \ldots, \frac{\partial J4}{\partial u_2^*(Hc-1)}$$
$$\frac{\partial J5}{\partial u_1^*(0)}, \ldots, \frac{\partial J5}{\partial u_2^*(Hc-1)}$$
$$\frac{\partial J6}{\partial u_1^*(0)}, \ldots, \frac{\partial J6}{\partial u_2^*(Hc-1)}$$

However, in order to treat, as variables, the element values of the weight matrices, the portion obtained by excluding $q_1$ in case of J3, for example, is treated as J31, as described below, and the expressions of the partial differentiation are prepared as follows:

$$J3 = q_1 \left( \begin{bmatrix} (Xref_1 - x_1^*(1))^2 + (Xref_1 - x_1^*(2))^2 + \ldots + \\ (Xref_1 - x_1^*(Hp-1))^2 \end{bmatrix} \right)^{J31} \quad (95)$$

$$\frac{\partial J31}{\partial u_1^*(0)} = -2((Xref_1 - x_1^*(0))(\text{coefficient of } u_1^*(0) \text{ in } x_1^*(0)) +$$
$$(Xref_1 - x_1^*(1))(\text{coefficient of } u_1^*(0) \text{ in } x_1^*(1)) + \ldots +$$
$$(Xref_1 - x_1^*(Hp-1))(\text{coefficient of } u_1^*(0) \text{ in } x_1^*(Hp-1)))$$

The expressions of the partial differentiation like the expression (95) are prepared for each of $u_1^*(0)$, $u_2^*(0)$, ..., $u_1^*(H_c-1)$ and $u_2^*(H_c-1)$, and the expressions (37) and its coefficients in the expressions (37) are substituted into the expressions of the partial differentiation. Then, the expressions after the substitution are arranged with respect to each of $u_1^*(0)$, $u_2^*(0)$, ..., $u_1^*(H_c-1)$ and $u_2^*(H_c-1)$. Then, similarly to the second embodiment, the coefficients of $u_1^*(0)$, $u_2^*(0)$, ..., $u_1^*(H_c-1)$ and $u_2^*(H_c-1)$ are extracted to generate the matrix M3, and constant terms are extracted to generate the vector b3.

As for the portion J41 obtained by excluding the elements of the weight matrices from J4, the expressions of the partial differentiation like the expression (95) are prepared for each of $u_1^*(0)$, $u_2^*(0)$, ..., $u_1^*(H_c-1)$ and $u_2^*(H_c-1)$, and the expressions (37) and its coefficients in the expressions (37) are substituted into the expressions of the partial differentiation. Then, the expressions after the substitution are further arranged with respect to each of $u_1^*(0)$, $u_2^*(0)$, ..., $u_1^*(H_c-1)$ and $u_2^*(H_c-1)$. Then, similarly to the second embodiment, the coefficients of $u_1^*(0)$, $u_2^*(0)$, ..., $u_1^*(H_c-1)$ and $u_2^*(H_c-1)$ are extracted to generate the matrix M4, and constant terms are extracted to generate the vector b4.

By similarly processing J5 and J6, the matric M5 and vector b5 and the matrix M6 and vector b6 are generated.

Finally, the matrix M and vector b to be generated are represented as follows:

$$M = q_1 M3 + q_2 M4 + s_1 M5 + s_2 M6 + M2 \quad (93)$$

$$b = q_1 b3 + q_2 b4 + s_1 b5 + s_2 b6 \quad (94)$$

However, the respective matrices and vectors may be stored in association with the corresponding elements of the weight matrices without the aforementioned addition. Then, before the simulation is carried out, the matrices S, Q and R are set and the matrix M and vector b are generated by the expressions (93) and (94) to carry out the simulation.

For example, it is assumed that the matrices A and B are set as follows, $H_p=4$ and $H_c=2$ are set, and the matrices Q, R and S are 2*2 diagonal matrices as follows:

$$A = \begin{pmatrix} 2 & 1 \\ -1 & 3 \end{pmatrix}, B = \begin{pmatrix} -1 & 1 \\ -10 & 5 \end{pmatrix}$$

$$Q = \begin{pmatrix} q_1 & 0 \\ 0 & q_2 \end{pmatrix}, R = \begin{pmatrix} r_1 & 0 \\ 0 & r_2 \end{pmatrix}, S = \begin{pmatrix} s_1 & 0 \\ 0 & s_2 \end{pmatrix}$$

Then, when the expressions (37) are the expressions (83) to (90), the results of the partial differentiation of J31 is as follows:

$$\frac{\partial J31}{\partial u_1^*(0)} = 5908 u_1^*(0) - 3138 u_2^*(0) +$$
$$1402 u_1^*(1) - 872 u_2^*(1) - 182 x_1(k) - 2030 x_2(k) + 132$$

$$\frac{\partial J31}{\partial u_2^*(0)} = -3138 u_1^*(0) + 1668 u_2^*(0) - 742 u_1^*(1) +$$
$$462 u_2^*(1) + 102 x_1(k) + 1080 x_2(k) - 72$$

$$\frac{\partial J31}{\partial u_1^*(1)} = 1402 u_1^*(0) - 742 u_2^*(0) + 340 u_1^*(1) -$$
$$210 u_2^*(1) - 32 x_1(k) - 478 x_2(k) + 28$$

$$\frac{\partial J31}{\partial u_2^*(1)} = -872 u_1^*(0) + 462 u_2^*(0) - 210 u_1^*(1) +$$
$$130 u_2^*(1) + 22 x_1(k) + 298 x_2(k) - 18$$

Therefore, the matrix M3 and vector b3 are represented as follows:

$$M3 = \begin{pmatrix} 5908 & -3138 & 1402 & -872 \\ -3138 & 1668 & -742 & 462 \\ 1402 & -742 & 340 & -210 \\ -872 & 462 & -210 & 130 \end{pmatrix}$$

$$b3 = \begin{pmatrix} 182 x_1(k) + 2030 x_2(k) - 132 \\ -102 x_1(k) - 1080 x_2(k) + 72 \\ 32 x_1(k) + 478 x_2(k) - 28 \\ -22 x_1(k) - 298 x_2(k) + 18 \end{pmatrix}$$

In addition, the results of the partial differentiation of J41 is as follows:

$$\frac{\partial J41}{\partial u_1^*(0)} = 13132 u_1^*(0) - 6162 u_2^*(0) +$$
$$6430 u_1^*(1) - 3140 u_2^*(1) + 3010 x_1(k) - 3374 x_2(k) + 2280$$

$$\frac{\partial J41}{\partial u_2^*(0)} = -6162 u_1^*(0) + 2892 u_2^*(0) - 3010 u_1^*(1) +$$
$$1470 u_2^*(1) - 1410 x_1(k) + 1584 x_2(k) - 1080$$

$$\frac{\partial J41}{\partial u_1^*(1)} = 6430 u_1^*(0) - 3010 u_2^*(0) + 3242 u_1^*(1) -$$
$$1582 u_2^*(1) + 1504 x_1(k) - 1642 x_2(k) + 980$$

$$\frac{\partial J41}{\partial u_2^*(1)} = -3140 u_1^*(0) + 1470 u_2^*(0) - 1582 u_1^*(1) +$$
$$772 u_2^*(1) - 734 x_1(k) + 802 x_2(k) - 480$$

Therefore, the matrix M4 and vector b4 are represented as follows:

$$M4 = \begin{pmatrix} 13132 & -6162 & 6430 & -3140 \\ -6162 & 2892 & -3010 & 1470 \\ 6430 & -3010 & 3242 & -1582 \\ -3140 & 1470 & -1582 & 772 \end{pmatrix}$$

$$b4 = \begin{pmatrix} -3010 x_1(k) + 3374 x_2(k) - 2280 \\ 1410 x_1(k) - 1584 x_2(k) + 1080 \\ -1504 x_1(k) + 1642 x_2(k) - 980 \\ 734 x_1(k) - 802 x_2(k) + 480 \end{pmatrix}$$

Furthermore, the results of the partial differentiation of J51 is as follows:

$$\frac{\partial J51}{\partial u_1^*(0)} = 65522 u_1^*(0) - 3294 u_2^*(0) +$$
$$23892 u_1^*(1) - 13032 u_2^*(1) + 5792 x_1(k) - 19910 x_2(k) + 362$$

$$\frac{\partial J51}{\partial u_2^*(0)} = -32942 u_1^*(0) + 16562 u_2^*(0) - 12012 u_1^*(1) +$$
$$6552 u_2^*(1) - 2912 x_1(k) + 10010 x_2(k) - 182$$

$$\frac{\partial J51}{\partial u_1^*(1)} = 23892 u_1^*(0) - 12012 u_2^*(0) + 8712 u_1^*(1) -$$
$$4752 u_2^*(1) + 2112 x_1(k) - 7260 x_2(k) + 132$$

$$\frac{\partial J51}{\partial u_2^*(1)} = -13032 u_1^*(0) + 6552 u_2^*(0) - 4752 u_1^*(1) +$$
$$2592 u_2^*(1) - 1152 x_1(k) + 3960 x_2(k) - 72$$

Therefore, the matrix M5 and vector b5 are represented as follows:

$$M5 = \begin{pmatrix} 65522 & -3294 & 23892 & -13032 \\ -32942 & 16562 & -12012 & 6552 \\ 23892 & -12012 & 8712 & -4752 \\ -13032 & 6552 & -4752 & 2592 \end{pmatrix}$$

$$b5 = \begin{pmatrix} -5792 x_1(k) + 19910 x_2(k) - 362 \\ 2912 x_1(k) - 10010 x_2(k) + 182 \\ -2112 x_1(k) + 7260 x_2(k) - 132 \\ 1152 x_1(k) - 3960 x_2(k) + 72 \end{pmatrix}$$

In addition, the results of the partial differentiation of J61 is as follows:

$$\frac{\partial J61}{\partial u_1^*(0)} = 59168 u_1^*(0) - 26488 u_2^*(0) + 39216 u_1^*(1) -$$
$$18576 u_2^*(1) + 18920 x_1(k) - 13416 x_2(k) + 3440$$

$$\frac{\partial J61}{\partial u_2^*(0)} = -26488 u_1^*(0) + 11858 u_2^*(0) - 17556 u_1^*(1) +$$
$$8316 u_2^*(1) - 8470 x_1(k) + 6006 x_2(k) - 1540$$

$$\frac{\partial J61}{\partial u_1^*(1)} = 39216 u_1^*(0) - 17556 u_2^*(0) + 25992 u_1^*(1) -$$
$$12312 u_2^*(1) + 12540 x_1(k) - 8892 x_2(k) + 2280$$

-continued
$$\frac{\partial J61}{\partial u_2^*(1)} = -18576u_1^*(0) + 8316u_2^*(0) - 12312u_1^*(1) +$$
$$5832u_2^*(1) - 5940x_1(k) + 5832x_2(k) - 1080$$

Therefore, the matrix M6 and vector b6 are represented as follows:

$$M6 = \begin{pmatrix} 59168 & -26488 & 39216 & -18576 \\ -26488 & 11858 & -17556 & 8316 \\ 39216 & -17556 & 25992 & -12312 \\ -18576 & 8316 & -12312 & 5832 \end{pmatrix}$$

$$b6 = \begin{pmatrix} -18920x_1(k) + 13416x_2(k) - 3440 \\ 8470x_1(k) - 6006x_2(k) + 1540 \\ -12540x_1(k) + 8892x_2(k) - 2280 \\ 5940x_1(k) - 5832x_2(k) + 1080 \end{pmatrix}$$

[Case where No Constraint Condition is Considered]

Figure 20:
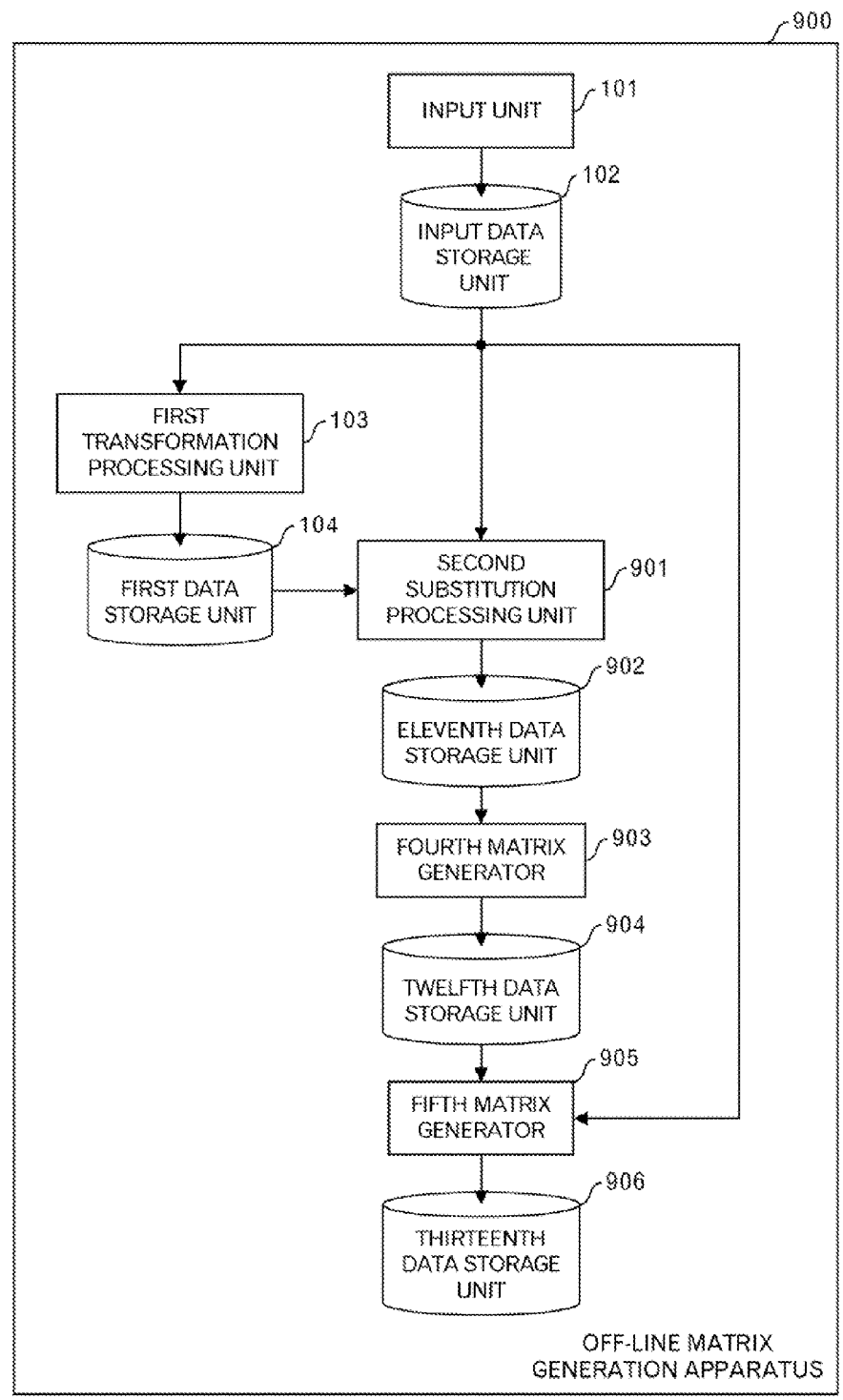
FIG. 20 is a functional block diagram of a first off-line matrix generation apparatus relating to a third embodiment.

Next, FIG. 20 illustrates a configuration example (no constraint conditions) of an off-line matrix generation apparatus 900 to generate such matrices M2 to M6 and vectors b3 to b6. The off-line matrix generation apparatus 900 has an input unit 101, input data storage unit 102, first transformation processing unit 103, first data storage unit 104, second substitution processing unit 901, eleventh data storage unit 902, fourth matrix generator 903, twelfth data storage unit 904, fifth matrix generator 905 and thirteenth data storage unit 906. The input unit 101, input data storage unit 102, first transformation processing unit 103 and first data storage unit 104 are almost the same as those in the first embodiment.

The input unit 101 accepts inputs of matrices A and B, and Δτ that are input data from the user, for example, and stores the input data into the input data storage unit 102. The input data storage unit 102 also stores data of the simultaneous equations to be solved (e.g. the expressions (8) and (9), and in case of the 2-input and 2-output system, the expressions (15) to (18)), expressions obtained by partially differentiating the portions J31 to J61 of the performance index, such as the expressions (95) and the like, and data of the matrix M2. Data of the matrix M2 may not be processed, because the weight matrix R is treated as variables and $H_p$ and $H_c$ are settled. In addition, data of the simultaneous equations and the like may be inputted from the input unit 101. Furthermore, the first transformation processing unit 103 carries out the first transformation processing by using data stored in the input data storage unit 102, and stores the processing results into the first data storage unit 104. Incidentally, the input unit 101 or first transformation processing unit 103 may carry out a processing to substitute element values of the matrices A and B and the like into the relating simultaneous equations.

The second substitution processing unit 901 carries out a processing to substitute the aforementioned expressions (37) and their coefficients into the expressions (95) and the like by using data stored in the input data storage unit 102 and first data storage unit 104, and stores the processing results into the eleventh data storage unit 902.

The fourth matrix generator 903 carries out a processing to generate the matrices M3, M4, M5 and M6 and vectors b3, b4, b5 and b6 by using data stored in the eleventh data storage unit 902, and stores the matrices and vectors into the twelfth data storage unit 904. The fifth matrix generator 905 carries out a computation of the expressions (93) and (94) by using data stored in the input data storage unit 102 and twelfth data storage unit 904, and stores the computation results into the thirteenth data storage unit 906. By doing so, the matrix M and vector b in a state where the elements of the weight matrices Q, S and R are treated as variables are stored in the thirteenth data storage unit 906 to use the matrix M and vector b for the simulation or the like.

Figure 21:
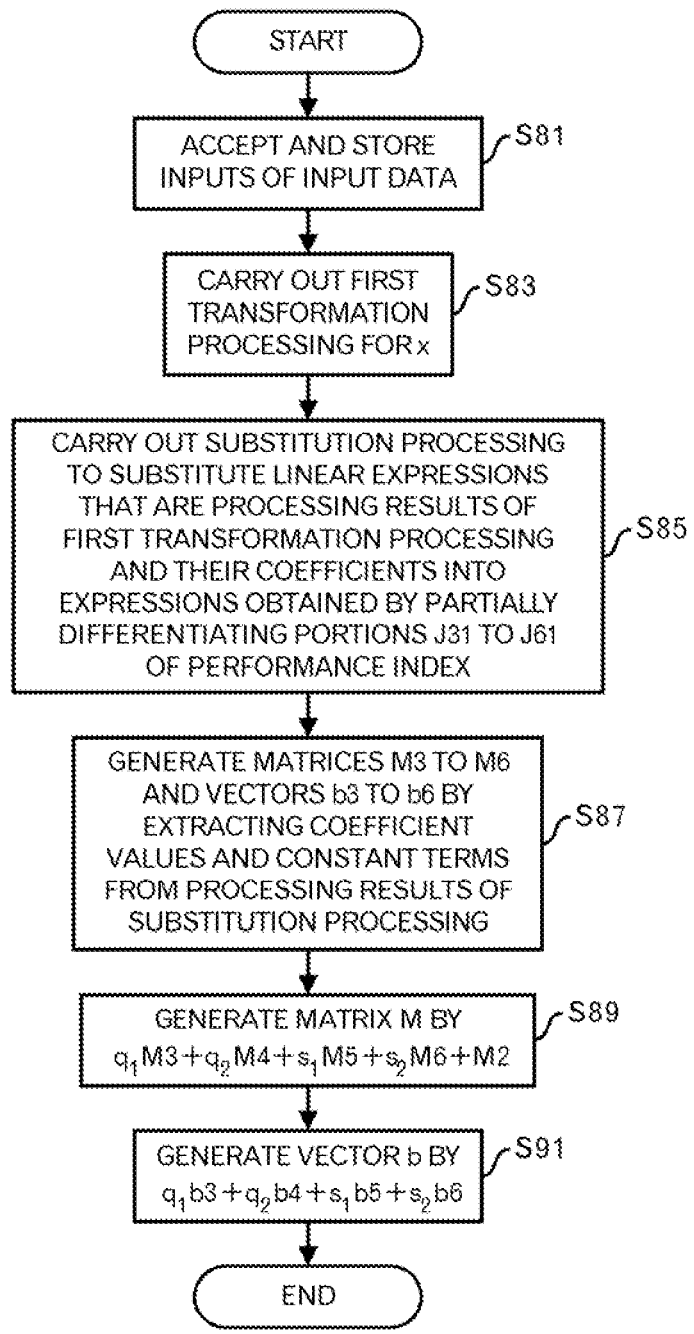
FIG. 21 is a diagram depicting a processing flow of a first off-line matrix generation apparatus relating to the third embodiment.

Next, FIG. 21 illustrates a processing flow of the off-line matrix generation apparatus 900 illustrated in FIG. 20. First, the input unit 101 accepts inputs of the matrices A and B and Δτ, which are input data from the user, and stores the input data into the input data storage unit 102 (FIG. 21: step S81). Data of the simultaneous equations to be resolved may be inputted from the input unit 101 and may be stored into the input data storage unit 102.

Then, the first transformation processing unit 103 carries out the first transformation processing for the optimal output state x*(i) by using data stored in the input data storage unit 102, and stores the linear expressions as the processing results (i.e. the expressions (37)) into the first data storage unit 104 (step S83). This step is almost the same as the step S3. Therefore, the further explanation is omitted. However, data of the matrices A and B and the like is substituted at this step and then this step may be processed at this step. Thus, the substitution may be carried out before this step.

Then, the second substitution processing unit 901 reads out data of the expressions (92) (i.e. the expressions of the partial differentiation of the portions J31 to J61 in the performance index J) from the input data storage unit 102, and carries out a processing to substitute the linear expressions as the processing results of the first transformation processing and their coefficients into the expressions (92) and the like and arrange the substitution results, and stores the processing results into the eleventh data storage unit 902 (step S85).

Furthermore, the fourth matrix generator 903 generates the matrices M3 to M6 by extracting the coefficient values of $u_1^*(0), u_2^*(0), \ldots, u_1^*(H_c-1)$ and $u_2^*(H_c-1)$ from the processing results of the substitution processing, which are stored in the eleventh data storage unit 902, generates the vectors b3 to b6 by further extracting the constant terms from the processing results of the substitution processing and reversing the signs, and stores the matrices and vectors into the twelfth data storage unit 904 (step S87).

After that, the fifth matrix generator 905 generates the matrix M by respectively multiplying the matrices M3 to M6 stored in the twelfth data storage unit 904 by the corresponding elements of the weight matrices Q and S and further adding the matrix M2 stored in the input data storage unit 102, and stores the matrix M into the thirteenth data storage unit 906 (step S89). Namely, the matrix M is generated by $q_1M3+q_2M4+s_1M5+s_2M6+M2$.

Furthermore, the fifth matrix generator 905 generates the vector b by respectively multiplying the vectors b3 to b6 stored in the twelfth data storage unit 904 by the corresponding elements of the weight matrices Q and S, and stores the vector b into the thirteenth data storage unit 906 (step S91). Namely, the vector b is generated by $q_1b3+q_2b4+s_1b5+s_2b6$.

By carrying out such a processing, the matrix M and vector b in which the elements of the weight matrices Q, S and R are treated as variables are generated. Therefore, it becomes easy to carry out the adjustment of the weight matrix in the simulation.

Incidentally, the steps S89 and S91 may be executed in the simulation.

[Case where the Constraint Condition is Considered]

Figure 22:
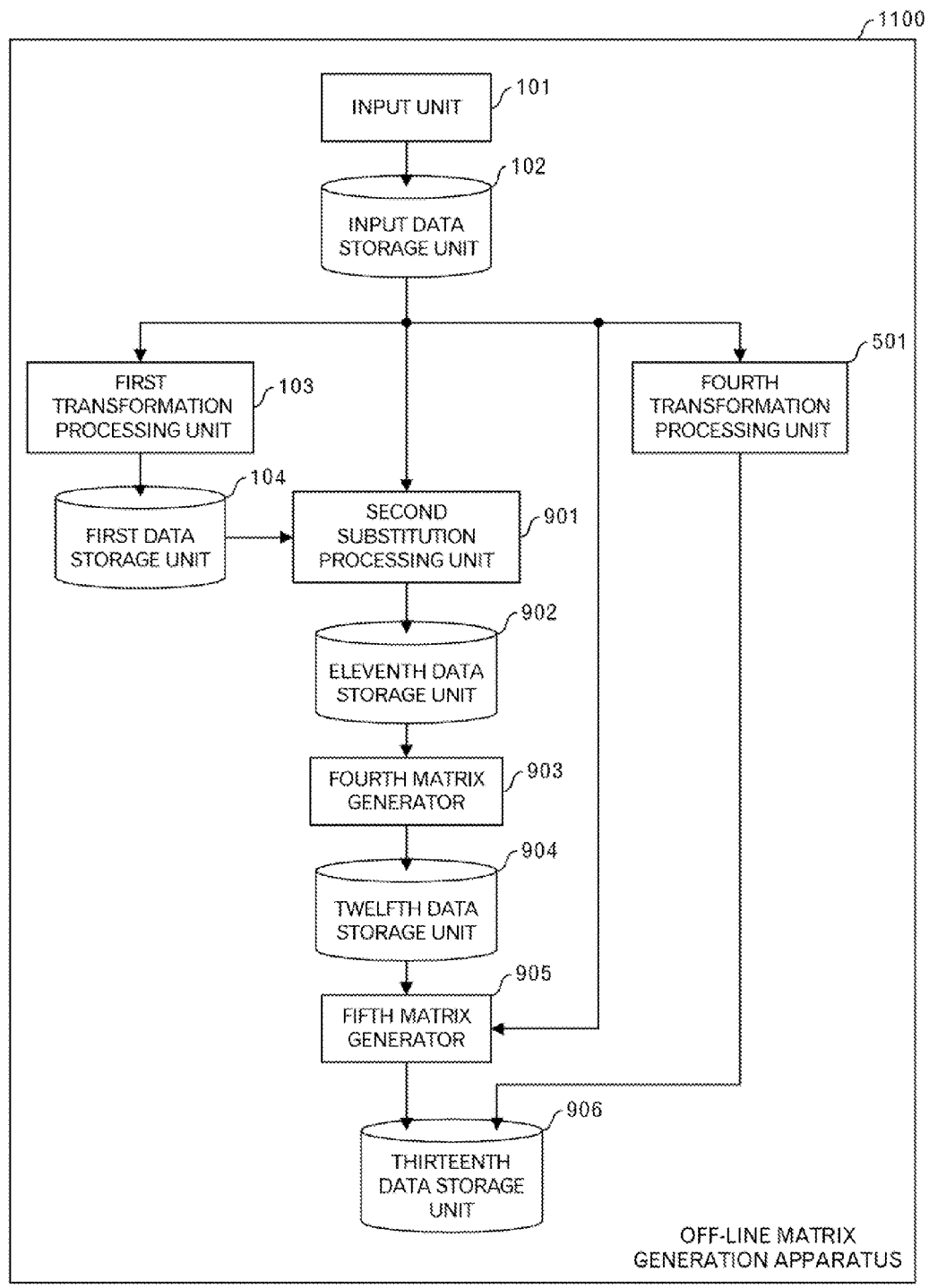
FIG. 22 is a functional block diagram of a second off-line matrix generation apparatus relating to the third embodiment.

In case where the constraint conditions are considered, an off-line matrix generation apparatus 1100 as illustrated in FIG. 22 is used. The difference with the off-line matrix generation apparatus 900 illustrated in FIG. 20 is a point that the fourth transformation processing unit 501, which was introduced when the constraint conditions are considered in the first embodiment, is introduced. Namely, the fourth transformation processing unit 501 generates $V_{topbar}$, $V_{underbar}$, $W_{topbar}$ and $W_{underbar}$ from data stored in the input data storage unit 102, and stores the generated data into the thirteenth data storage unit 906.

Figure 23:
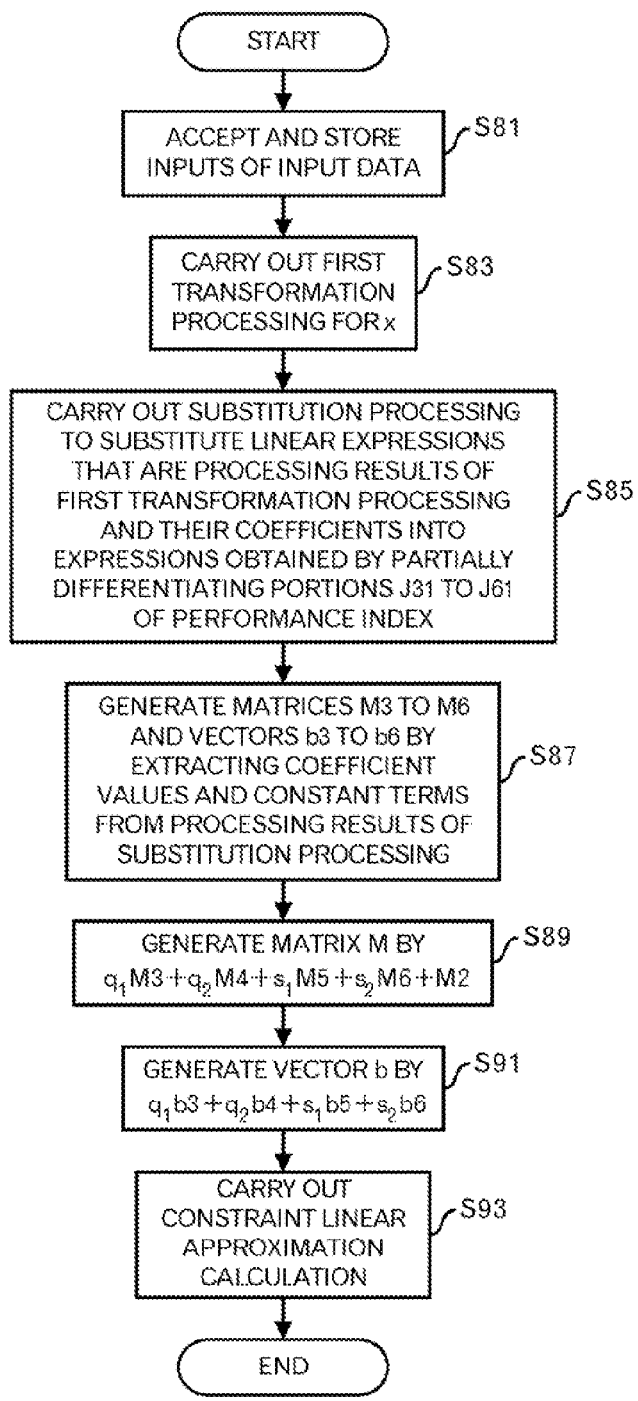
FIG. 23 is a diagram depicting a processing of a second off-line matrix generation processing relating to the third embodiment.

Therefore, as for a processing flow when the constraint conditions are considered, as illustrated in FIG. 23, a point that step S93 is added, which is a step to carry out a constraint linear approximation calculation executed by the fourth transformation processing unit 501, is different from FIG. 21. The step S93 is similar to the step S39 in FIG. 8, and the vectors represented by the expressions (63) to (66) are generated and stored into the thirteenth data storage unit 906.

By carrying out such a processing, the matrix M and vector b in which the elements of the weight matrices Q, R and S are treated as variables, and $V_{topbar}$, $V_{underbar}$, $W_{topbar}$ and $W_{underbar}$, which relate to the constraint conditions, are generated and used in the simulation.

Although the embodiments of this technique were explained, this technique is not limited to those embodiments. For example, the functional block diagrams and block diagrams are mere examples, and do not always correspond to actual program module configurations. In addition, as for the processing flows, as long as the processing results do not change, the steps may be executed in parallel, or the order of the steps may be exchanged. Furthermore, although the application of this technique to the engine control apparatus was explained, the application to plant control apparatuses other than the engine control apparatus is possible.

Figure 24:
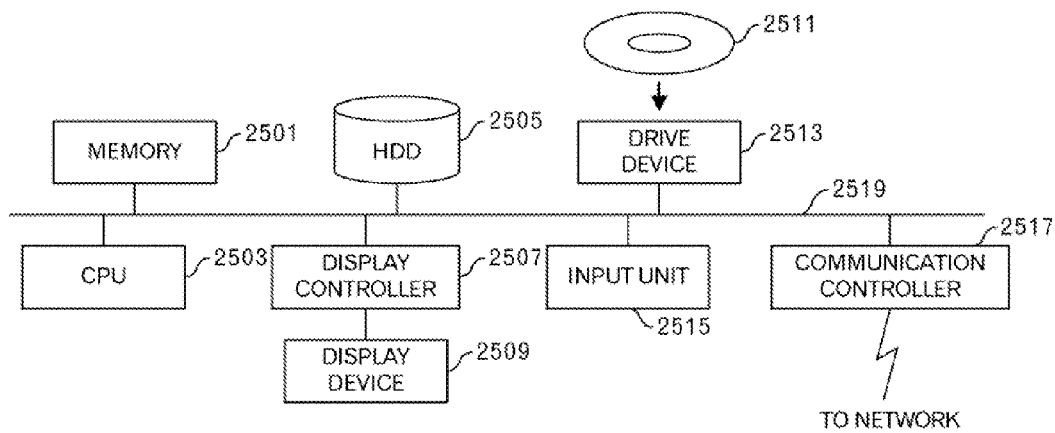
FIG. 24 is a functional block diagram of a computer.

In addition, the off-line matrix generation apparatuses 100 and 500 to 1100 are computer devices as shown in FIG. 24. That is, a memory 2501 (storage device), a CPU 2503 (processor), a hard disk drive (HDD) 2505, a display controller 2507 connected to a display device 2509, a drive device 2513 for a removable disk 2511, an input device 2515, and a communication controller 2517 for connection with a network are connected through a bus 2519 as shown in FIG. 24. An operating system (OS) and an application program for carrying out the foregoing processing in the embodiment, are stored in the HDD 2505, and when executed by the CPU 2503, they are readout from the HDD 2505 to the memory 2501. As the need arises, the CPU 2503 controls the display controller 2507, the communication controller 2517, and the drive device 2513, and causes them to perform necessary operations. Besides, intermediate processing data is stored in the memory 2501, and if necessary, it is stored in the HDD 2505. In this embodiment of this technique, the application program to realize the aforementioned functions is stored in the computer-readable, non-transitory removable disk 2511 and distributed, and then it is installed into the HDD 2505 from the drive device 2513. It may be installed into the HDD 2505 via the network such as the Internet and the communication controller 2517. In the computer as stated above, the hardware such as the CPU 2503 and the memory 2501, the OS and the necessary application programs systematically cooperate with each other, so that various functions as described above in details are realized.

Figure 25:
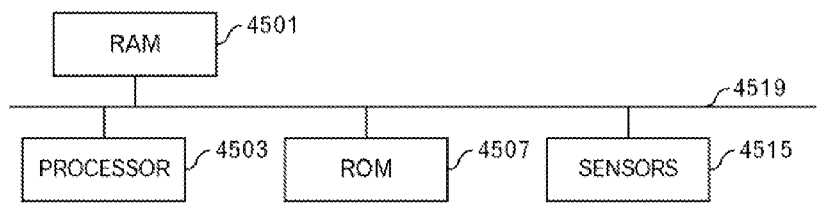
FIG. 25 is a functional block diagram of an engine control apparatus.

Incidentally, the aforementioned engine control apparatus 1000 is also a computer apparatus. That is, a Random Access memory (RAM) 4501, a processor 4503, a Read Only Memory (ROM) 4507 and sensors 4515 are connected through a bus 4519 as shown in FIG. 25. A control program for carrying out the processing in the embodiment (and an Operating System (OS) if it exists) is stored in the ROM 4507, and when executed by the processor 4503, they are read out from the ROM 4507 to the RAM 4501. The processor 4503 controls the sensors 4515 (MAP sensor and MAF sensor. According to circumstances, injection quantity measurement unit and engine speed measurement unit), and obtains measurement values. In addition, intermediate processing data is stored in the RAM 4501. Incidentally, the processor 4503 may include the ROM 4507, and may further include the RAM 4501. In this embodiment, the control program for carrying out the aforementioned processing may be distributed by a computer-readable storage removable disk in which the control program is recorded, and the control program may be written into the ROM 4507 by a ROM writer. In the computer apparatus as stated above, the hardware such as the processor 4503 and RAM 4501 and the ROM 4507 and the control program (and OS if it exists) systematically cooperate with each other, so that various functions as described above in details are realized.

The embodiments described above are summarized as follows:

In a matrix generation method relating to a first aspect of the embodiments, a data storage unit stores (a) state equations, which represent a relationship between solution output states and solution inputs of a plant to be controlled, (b) initial condition expressions of output states, (c) first conditional expressions representing a relationship between a first Lagrange multiplier and a partial differentiation of a Hamiltonian with respect to the output state, (d) relational expressions representing a relationship between a value of the first Lagrange multiplier after a predictive horizon (i.e. period) and a function regarding differences between target values of the output states and the solution output states after the predictive horizon, and (e) second conditional expressions that are partial differentiations of the Hamiltonian with respect to the inputs and represents a relationship among the first Lagrange multiplier, the second Lagrange multiplier and the solution inputs, wherein the Hamiltonian relates to a sum of a first function regarding a weighting addition of a square of an error between the target values of the output states and the output states and a square of inputs, a product of the first Lagrange multiplier and the state equations, and a second function regarding a second Lagrange multiplier and constraint conditions. Then, the matrix generation method relating to the first aspect of the embodiments includes: reading out the state equations and the initial condition expressions from the data storage unit to convert the state equations and the initial condition expressions into first linear expressions representing the solution output states at each step by the output states and the solution inputs; reading out the first conditional expressions and the relational expressions from the data storage unit to convert the first conditional expressions and the relational expressions into second linear expressions representing the first Lagrange multiplier at each step by the target values and the solution output states; converting the first linear expressions and the second linear expressions into third linear expressions representing the first Lagrange multiplier at each step by the target values, the solution inputs and the output states, by substituting the first linear expressions into the second linear expressions; reading out the second conditional expressions from the data storage unit to convert the third linear expressions and the second conditional expressions into fourth linear expressions representing a relationship at each step among the target values, the solution inputs and the output states; and transforming the fourth linear expressions into a matrix operational expression representing a product of a coefficient matrix and a vector regarding the solution inputs within a control horizon (i.e. period) is equal to a function vector regarding the target values and the output states to obtain the coefficient matrix and the function vector.

By carrying out such a processing, the sizes of the coefficient matrix and function vector are largely reduced, and simultaneous equations, which are represented by a matrix operational expression representing a product of a coefficient matrix and a vector regarding the solution inputs within the control horizon is equal to a function vector regarding the target values and the output states, can be resolved at high speed.

In addition, the matrix generation method relating to the first aspect of the embodiments may further include: generating a first constraint vector, a second constraint vector, a third constraint vector and a fourth constraint vector. In such a case, the first constraint vector may be a vector that includes, for each time, first constant terms in fifth linear expressions obtained by approximating, by the solution inputs, the second Lagrange multipliers associated with lower limit values of the inputs included in the constraint conditions, and the first constant terms may include the lower limit values of the inputs included in the constraint conditions and the solution inputs at a corresponding time, which were calculated one sampling time before. In addition, the second constraint vector may include, for each time, first coefficients of the solution input in the fifth linear expressions, and the first coefficients may include the lower limit values of the inputs included in the constraint conditions, and the solution inputs at the corresponding time, which were calculated one sampling time before. Furthermore, the third constraint vector may be a vector that includes, for each time, second constant terms in sixth linear expressions obtained by approximating, by the solution inputs, the second Lagrange multipliers associated with upper limit values of the inputs included in the constraint conditions, and the second constant terms may include the upper limit values of the inputs included in the constraint conditions and the solution inputs at the corresponding time, which were calculated one sampling time before. Moreover, the fourth constraint vector may include, for each time, second coefficients of the solution inputs in the sixth linear expressions, and the second coefficients may include the upper limit values of the inputs included in the constraint conditions, and the solution inputs at the corresponding time, which were calculated one sampling time before.

Thus, it becomes possible to easily carry out computation taking into consideration the constraint conditions.

In a matrix generation apparatus relating to a second aspect of the embodiments, a data storage unit stores (a) state equations, which represent a relationship between solution output states and solution inputs of a plant to be controlled, (b) initial condition expressions of output states, (c) first conditional expressions representing a relationship between a first Lagrange multiplier and a partial differentiation of a Hamiltonian with respect to the output state, (d) relational expressions representing a relationship between a value of the first Lagrange multiplier after a predictive horizon and a function regarding differences between target values of the output states and the solution output states after the predictive horizon, and (e) second conditional expressions that are partial differentiations of the Hamiltonian with respect to the inputs and represents a relationship among the first Lagrange multiplier, the second Lagrange multiplier and the solution inputs, wherein the Hamiltonian relates to a sum of a first function regarding a weighting addition of a square of an error between the target values of the output states and the output states and a square of inputs, a product of the first Lagrange multiplier and the state equations, and a second function regarding a second Lagrange multiplier and constraint conditions. The matrix generation apparatus relating to the second aspect of the embodiments includes: reading out the state equations and the initial condition expressions from the data storage unit to convert the state equations and the initial condition expressions into first linear expressions representing the solution output states at each step by the output states and the solution inputs; reading out the first conditional expressions and the relational expressions from the data storage unit to convert the first conditional expressions and the relational expressions into second linear expressions representing the first Lagrange multiplier at each step by the target values and the solution output states; converting the first linear expressions and the second linear expressions into third linear expressions representing the first Lagrange multiplier at each step by the target values, the solution inputs and the output states, by substituting the first linear expressions into the second linear expressions; reading out the second conditional expressions from the data storage unit to convert the third linear expressions and the second conditional expressions into fourth linear expressions representing a relationship at each step among the target values, the solution inputs and the output states; and transforming the fourth linear expressions into a matrix operational expression representing a product of a coefficient matrix and a vector regarding the solution inputs within the control horizon is equal to a function vector regarding the target values and the output states to obtain the coefficient matrix and the function vector.

When the constraint conditions are considered, the sizes of the coefficient matrix and function vector are largely reduced even when the expressions (a) to (e) are transformed as described above.

A control method relating to a third aspect of the embodiments includes: obtaining, by using a processor, present output states and present target values of output states of a plant to be controlled; calculating, by using the processor, solution inputs within the control horizon by substituting the present output states and the present target values into the linear equations and solving linear equations after the substituting, wherein the linear equations are represented in a form that a product of a coefficient matrix and a vector regarding solution inputs within the control horizon is equal to a function vector regarding target values of the output states and the output states, and the linear equations are equivalent to expressions including (a) state equations, which represent a relationship between solution output states and solution inputs of the plant to be controlled, (b) initial condition expressions of the output states, (c) first conditional expressions representing a relationship between a first Lagrange multiplier and a partial differentiation of a Hamiltonian with respect to the output state, (d) relational expressions representing a relationship between a value of the first Lagrange multiplier after the predictive horizon and a function regarding differences between the target values of the output states and the solution output states after the predictive horizon, and (e) second conditional expressions that are partial differentiations of the Hamiltonian with respect to the inputs and represents a relationship among the first Lagrange multiplier, the second Lagrange multiplier and the solution inputs, wherein the Hamiltonian relates to a sum of a first function regarding a weighting addition of a square of an error between the target values of the output states and the output states and a square of inputs, a product of the first Lagrange multiplier and the state equations, and a second function regarding a second Lagrange multiplier and constraint conditions; and extracting, by using the processor, solution inputs for a first time from among the solution inputs within the control horizon.

These linear equations are largely simplified compared with the original expressions (a) to (e). Therefore, even when the linear equations are solved by a normal method with normal computation, it becomes possible to obtain the solution input in a shorter period.

In addition, the constraint conditions including upper limit values and lower limit values for the solution input of the plant to be controller may be set. In such a case, the aforementioned calculating may include: generating a first matrix obtained by setting solution inputs at a corresponding time, which were calculated one sampling time before, into a first constraint vector and changing the first constraint vector to a diagonal matrix, wherein the first constraint vector is a vector that includes, for each time, first coefficients of the solution inputs in first linear expressions obtained by approximating, by the solution inputs, the second Lagrange multipliers associated with lower limit values of the inputs included in the constraint conditions, and the first coefficients include the lower limit values of the inputs included in the constraint conditions and the solution inputs at the corresponding time, which were calculated one sampling time before; generating a second matrix obtained by setting the solution inputs at the corresponding time, which were calculated one sampling time before, into a second constraint vector and changing the second constraint vector to the diagonal matrix, wherein the second constraint vector is a vector that includes, for each time, second coefficient of the solution inputs in second linear expressions obtained by approximating, by the solution inputs, the second Lagrange multipliers associated with upper limit values of the inputs included in the constraint conditions, and the second coefficients include the upper limit values of the inputs included in the constraint conditions and the solution inputs at the corresponding time, which were calculated one sampling time before; subtracting the first matrix from the coefficient matrix, and adding the second matrix; generating a first vector obtained by setting the solution inputs at the corresponding time, which were calculated one sampling time before, into first constant terms in the first linear expressions, wherein the first constant terms include the lower limit values of the inputs included in the constraint conditions, and the solution inputs at the corresponding time, which were calculated one sampling time before; generating a second vector obtained by setting the solution inputs at the corresponding time, which were calculated one sampling time before, into second constant terms in the second linear expressions, wherein the second constant terms include the upper limit values of the inputs included in the constraint conditions, and the solution inputs at the corresponding time, which were calculated one sampling time before; and adding the first vector to the function vector and subtracting the second vector.

Thus, it is possible to output the solution input taking into consideration the constraint conditions with less computation amount.

Figure 26:
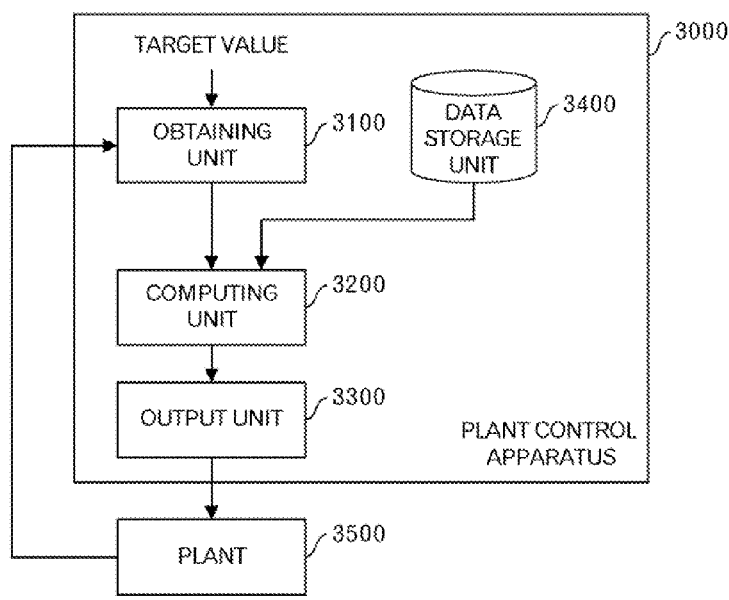
FIG. 26 is a functional block diagram of a plant control apparatus.

A plant control apparatus (FIG. 26) relating to a fourth aspect of the embodiments includes: (A) an obtaining unit (FIG. 26: 3100) to obtain present output states and present target values of the output states of the plant to be controlled; (B) a data storage unit (FIG. 26: 3400) storing linear equations represented in a form that a product of a coefficient matrix and a vector regarding solution inputs within the control horizon is equal to a function vector regarding target values of output states and the output states, wherein the linear equations are equivalent to expressions including (a) state equations, which represent a relationship between solution output states and solution inputs of a plant to be controlled, (b) initial condition expressions of the output states, (c) first conditional expressions representing a relationship between a first Lagrange multiplier and a partial differentiation of a Hamiltonian with respect to the output state, (d) relational expressions representing a relationship between a value of the first Lagrange multiplier after the predictive horizon and a function regarding differences between the target values of the output states and the solution output states after the predictive horizon, and (e) second conditional expressions that are partial differentiations of the Hamiltonian with respect to the inputs and represents a relationship among the first Lagrange multiplier, the second Lagrange multiplier and the solution inputs, and the Hamiltonian relates to a sum of a first function regarding a weighting addition of a square of an error between the target values of the output states and the output states and a square of inputs, a product of the first Lagrange multiplier and the state equations, and a second function regarding a second Lagrange multiplier and constraint conditions; (C) a calculation unit (FIG. 26: 3200) to calculate solution inputs within a control horizon by substituting the present output states and the present target values into the linear equations and solving the linear equations after the substituting; and (D) an output unit (FIG. 26: 3300) to extract solution inputs for a first time from among the solution inputs within the control horizon.

In a matrix generation method relating to a fifth aspect of the embodiments, a data storage unit stores (a) state equations, which represent a relationship between solution output states and solution inputs of a plant to be controlled, (b) initial condition expressions of output states, (c) first linear expressions regarding the solution output states, which are obtained by partially differentiating a first term and a second term in a performance index, with respect to each of the solution inputs from a solution input at an initial time to a solution input at a time after (a control horizon—one sampling time) elapsed, and (d) a first matrix having matrix elements that are obtained by partially differentiating a third term in the performance index with respect to each of the solution inputs from the solution input at the initial time to the solution input at the time after (the control horizon—one sampling time) elapsed, and are determined by element values of a third weight matrix, a value of the control horizon and a value of the predictive horizon, wherein the first term in the performance index is a term for adding a square of an error between a target value of the output state and the solution output state from a time after one sampling time elapsed since an initial time to a time after (the predictive horizon—one sampling time) elapsed, while weighting by a first weight matrix, and the second term in the performance index is a term for adding a square of an error between the target value of the output state and the solution output state after the predictive horizon while weighting by a second weight matrix, and the performance index includes the first term, the second term, the third term for adding a square of the solution inputs from the initial time to a time after (the predictive horizon—one sampling time) elapsed while weighting by the third weight matrix, and a fourth term for constraint conditions. The matrix generation apparatus relating to the fifth aspect of the embodiments includes: reading out the state equations and the initial condition expressions of output states to convert the state equations and the initial condition expressions into second linear expressions representing the solution output states at each step by the output states and the solution inputs; generating third linear expressions by substituting the second linear expressions and coefficient values of the solution inputs in the second linear expressions into the first linear expressions stored in the data storage unit; generating a second matrix by extracting coefficient values of terms of the solution inputs in the third linear expressions; generating a vector by extracting terms other than the terms of the solution inputs in the third linear expressions; and generating a third matrix by adding the first matrix stored in the data storage unit and the second matrix.

Because the computation amount is reduced by carrying out such a processing, it is possible to generate the third matrix and the vector at high speed.

In a matrix generation method relating to a sixth aspect of the embodiments, a data storage unit stores (a) the state equations, equations, which represent a relationship between solution output states and solution inputs of a plant to be controlled, (b) initial condition expressions of output states, (c) first linear expressions obtained by partially differentiating each of a plurality of expressions, with respect to each of the solution inputs from a solution input at an initial time to a solution input at a time after (a control horizon—one sampling time) elapsed, wherein a performance index includes a first term, a second term, a third term for adding a square of the solution inputs from the initial time to a time after (the predictive horizon—one sampling time) elapsed while weighting by a third weight matrix, and a fourth term for constraint conditions, and the first term in the performance index is a term for adding a square of an error between a target value of the output state and the solution output state from a time after one sampling time elapsed since an initial time to a time after (a predictive horizon—one sampling time) elapsed, while weighting by a first weight matrix, and the second term in the performance index is a term for adding a square of an error between the target value of the output state and the solution output state after the predictive horizon while weighting by a second weight matrix, and the plurality of expressions are obtained by classifying the first term and the second term in the performance index for each element of the first weight matrix and the second weight matrix, which is multiplied as a coefficient, and by removing each the element from a corresponding classification result. The matrix generation method relating to the sixth aspect of the embodiments includes: reading out the state equations and the initial condition expressions of output states to convert the state equations and the initial condition expressions into second linear expressions representing the solution output states at each step by the output states and the solution inputs; generating, for each of the plurality of expressions, third linear expressions by substituting the second linear expressions and coefficient values of the solution inputs in the second linear expressions into the first linear expressions stored in the data storage unit; generating, for each of the plurality of expressions, a matrix by extracting, for each of the plurality of expressions, coefficients of the terms of the solution inputs in the third linear expressions; and generating, for each of the plurality of expressions, a vector by extracting, for each of the plurality of expressions, terms other than the terms of the solution inputs in the third linear expressions.

By doing so, it becomes possible to adjust the element values of the weight matrices in the simulation or the like, which will be carried out later, without regenerating the matrix and vector. Incidentally, the constraint conditions can be processed in the fifth and sixth aspects of the embodiments, similarly to the first aspect of the embodiments.

Incidentally, it is possible to create a program causing a computer to execute the aforementioned processing, and such a program is stored in a computer readable storage medium or storage device such as a flexible disk, CD-ROM, DVD-ROM, magneto-optic disk, a semiconductor memory, and hard disk. In addition, the intermediate processing result is temporarily stored in a storage device such as a main memory or the like.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A computer-readable, non-transitory storage medium storing a program for causing a computer to execute a process comprising:
converting state equations, which represent a relationship between solution output states and solution inputs of a plant to be controlled, and initial condition expressions of output states into first linear expressions representing the solution output states at each step by the output states and the solution inputs;
generating second linear expressions by substituting the first linear expressions and coefficient values of the solution inputs in the first linear expressions into third linear expressions regarding the solution output states, wherein the third linear expressions are obtained by partially differentiating a first term and a second term in a performance index, with respect to each of the solution inputs from a solution input at an initial time to a solution input at a first time after a first period calculated by (a control horizon—one sampling time) elapsed, and the first term in the performance index is a term for adding a square of an error between a target value of the output state and the solution output state, from a second time after the one sampling time elapsed since the initial time to a third time after a second period calculated by (a predictive horizon—the one sampling time) elapsed, while weighting by a first weight matrix, and the second term in the performance index is a term for adding a square of an error between the target value of the output state and the solution output state after the predictive horizon while weighting by a second weight matrix, and the performance index includes the first term, the second term, a third term for adding a square of the solution inputs from the initial time to the third time while weighting by a third weight matrix, and a fourth term for constraint conditions;
generating a first matrix by extracting coefficient values of terms of the solution inputs in the second linear expressions;
generating a vector by extracting terms other than the terms of the solution inputs in the second linear expressions; and
generating a third matrix by adding the first matrix and a second matrix having matrix elements that are obtained by partially differentiating the third term in the performance index with respect to each of the solution inputs from the solution input at the initial time to the solution input at the first time, and are determined by element values of the third weight matrix, a value of the control horizon and a value of the predictive horizon.

2. The computer-readable, non-transitory storage medium as set forth in claim 1, wherein the process further comprises generating a first constraint vector, a second constraint vector, a third constraint vector and a fourth constraint vector, wherein the first constraint vector is a vector that includes, for each time, first constant terms in fifth linear expressions obtained by approximating, by the solution inputs, the second Lagrange multipliers associated with lower limit values of the inputs included in the constraint conditions, and the first constant terms include the lower limit values of the inputs included in the constraint conditions and the solution inputs at a corresponding time, which were calculated at previous calculation, and wherein the second constraint vector includes, for each time, first coefficients of the solution input in the fifth linear expressions, and the first coefficients include the lower limit values of the inputs included in the constraint conditions, and the solution inputs at the corresponding time, which were calculated one sampling time before, and wherein the third constraint vector is a vector that includes, for each time, second constant terms in sixth linear expressions obtained by approximating, by the solution inputs, the second Lagrange multipliers associated with upper limit values of the inputs included in the constraint conditions, and the second constant terms include the upper limit values of the inputs included in the constraint conditions and the solution inputs at the corresponding time, which were calculated one sampling time before, and wherein the fourth constraint vector includes, for each time, second coefficients of the solution inputs in the sixth linear expressions, and the second coefficients include the upper limit values of the inputs included in the constraint conditions, and the solution inputs at the corresponding time, which were calculated one sampling time before.

3. A computer-readable, non-transitory storage medium storing a program for causing a computer to execute a process comprising:

converting state equations, which represent a relationship between solution output states and solution inputs of a plant to be controlled, and initial condition expressions of output states into first linear expressions representing the solution output states at each step by the output states and the solution inputs;

generating, for each of a plurality of expressions, second linear expressions by substituting the first linear expressions and coefficient values of the solution inputs in the first linear expressions into third linear expressions regarding the solution output states, wherein the plurality of expressions are obtained by classifying a first term and a second term in a performance index for each element of a first weight matrix and a second weight matrix, which is multiplied as a coefficient, and by removing each the element from a corresponding classification result, and the third linear expressions are obtained by partially differentiating each of the plurality of expressions, with respect to each of the solution inputs from a solution input at an initial time to a solution input at a first time after a first period calculated by (a control horizon—one sampling time) elapsed, and the first term in the performance index is a term for adding a square of an error between a target value of the output state and the solution output state from a second time after the one sampling time elapsed since the initial time to a third time after a second period calculated by (a predictive horizon—the one sampling time) elapsed, while weighting by the first weight matrix, and the second term in the performance index is a term for adding a square of an error between the target value of the output state and the solution output state after the predictive horizon while weighting by the second weight matrix, and the performance index includes the first term, the second term, a third term for adding a square of the solution inputs from the initial time to the third time while weighting by a third weight matrix, and a fourth term for constraint conditions;

generating, for each of the plurality of expressions, a matrix by extracting, for each of the plurality of expressions, coefficients of the terms of the solution inputs in the second linear expressions; and generating, for each of the plurality of expressions, a vector by extracting, for each of the plurality of expressions, terms other than the terms of the solution inputs in the second linear expressions.

4. A matrix generation apparatus, comprising:

a data storage unit storing (a) state equations, which represent a relationship between solution output states and solution inputs of a plant to be controlled, (b) initial condition expressions of output states, (c) first linear expressions regarding the solution output states, which are obtained by partially differentiating a first term and a second term in a performance index, with respect to each of the solution inputs from a solution input at an initial time to a solution input at a first time after a first period calculated by (a control horizon—one sampling time) elapsed, and (d) a first matrix having matrix elements that are obtained by partially differentiating a third term in the performance index with respect to each of the solution inputs from the solution input at the initial time to the solution input at the first time, and are determined by element values of a third weight matrix, a value of the control horizon and a value of a predictive horizon, wherein the first term in the performance index is a term for adding a square of an error between a target value of the output state and the solution output state from a second time after the one sampling time elapsed since the initial time to a third time after a second period calculated by (the predictive horizon—the one sampling time) elapsed, while weighting by a first weight matrix, and the second term in the performance index is a term for adding a square of an error between the target value of the output state and the solution output state after the predictive horizon while weighting by a second weight matrix, and the performance index includes the first term, the second term, the third term for adding a square of the solution inputs from the initial time to the third time while weighting by the third weight matrix, and a fourth term for constraint conditions; and a processing unit configured to execute a process comprising:

reading out the state equations and the initial condition expressions of output states to convert the state equations and the initial condition expressions into second linear expressions representing the solution output states at each step by the output states and the solution inputs;

generating third linear expressions by substituting the second linear expressions and coefficient values of the solution inputs in the second linear expressions into the first linear expressions stored in the data storage unit;

generating a second matrix by extracting coefficient values of terms of the solution inputs in the third linear expressions;

generating a vector by extracting terms other than the terms of the solution inputs in the third linear expressions; and generating a third matrix by adding the first matrix stored in the data storage unit and the second matrix.

5. A matrix generation apparatus, comprising:

a data storage unit storing (a) the state equations, equations, which represent a relationship between solution output states and solution inputs of a plant to be controlled, (b) initial condition expressions of output states, (c) first linear expressions obtained by partially differentiating each of a plurality of expressions, with respect to each of the solution inputs from a solution input at an initial time to a solution input at a first time after a first period calculated by (a control horizon—one sampling time) elapsed, wherein a performance index includes a first term, a second term, a third term for adding a square of the solution inputs from the initial time to a second time after a second period calculated by (a predictive horizon—one sampling time) elapsed while weighting by a third weight matrix, and a fourth term for constraint conditions, and the first term in the performance index is a term for adding a square of an error between a target value of the output state and the solution output state from a third time after the one sampling time elapsed since the initial time to the second time, while weighting by a first weight matrix, and the second term in the performance index is a term for adding a square of an error between the target value of the output state and the solution output state after the predictive horizon while weighting by a second weight matrix, and the plurality of expressions are obtained by classifying the first term and the second term in the performance index for each element of the first weight matrix and the second weight matrix, which is multiplied as a coefficient, and by removing each the element from a corresponding classification result;

a processing unit configured to execute a process comprising:

reading out the state equations and the initial condition expressions of output states to convert the state equations and the initial condition expressions into second linear expressions representing the solution output states at each step by the output states and the solution inputs;

generating, for each of the plurality of expressions, third linear expressions by substituting the second linear expressions and coefficient values of the solution inputs in the second linear expressions into the first linear expressions stored in the data storage unit;

generating, for each of the plurality of expressions, a matrix by extracting, for each of the plurality of expressions, coefficients of the terms of the solution inputs in the third linear expressions; and generating, for each of the plurality of expressions, a vector by extracting, for each of the plurality of expressions, terms other than the terms of the solution inputs in the third linear expressions.

* * * * *